(12) United States Patent
Patton et al.

(10) Patent No.: US 6,343,793 B1
(45) Date of Patent: Feb. 5, 2002

(54) DUAL CHANNEL ROTARY UNION

(75) Inventors: Evan E. Patton, Portland; Wayne Fetters, Canby, both of OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/453,471

(22) Filed: Dec. 2, 1999

Related U.S. Application Data

(62) Division of application No. 08/969,984, filed on Nov. 13, 1997.

(51) Int. Cl.[7] ................................. F16J 15/54
(52) U.S. Cl. ..................... 277/361; 277/372; 277/374
(58) Field of Search ................................ 277/347, 361, 277/366, 368, 374, 372, 384

(56) References Cited

U.S. PATENT DOCUMENTS

| | | | |
|---|---|---|---|
| 3,962,047 A | | 6/1976 | Wagner |
| 4,137,867 A | | 2/1979 | Aigo |
| 4,170,959 A | | 10/1979 | Aigo |
| 4,246,088 A | | 1/1981 | Murphy et al. |
| 4,259,166 A | | 3/1981 | Whitehurst |
| 4,280,882 A | | 7/1981 | Hovey |
| 4,294,454 A | * | 10/1981 | Cannings |
| 4,304,641 A | | 12/1981 | Grandia et al. |
| 4,339,297 A | | 7/1982 | Aigo |
| 4,339,319 A | | 7/1982 | Aigo |
| 4,341,613 A | | 7/1982 | Prusak et al. |
| 4,422,676 A | * | 12/1983 | Sitabkhan |
| 4,466,864 A | | 8/1984 | Bacon et al. |
| 4,469,566 A | | 9/1984 | Wray |
| 4,534,832 A | | 8/1985 | Doiron, Jr. |
| 4,565,607 A | | 1/1986 | Hanak et al. |
| 4,597,836 A | | 7/1986 | Schaer et al. |
| 4,696,729 A | | 9/1987 | Santini |
| 4,828,654 A | | 5/1989 | Reed |
| 4,861,452 A | | 8/1989 | Stierman et al. |
| 4,879,007 A | | 11/1989 | Wong |
| 4,906,346 A | | 3/1990 | Hadersbeck et al. |
| 4,931,149 A | | 6/1990 | Stierman et al. |
| 5,000,827 A | | 3/1991 | Schuster et al. |
| 5,024,746 A | | 6/1991 | Stierman et al. |
| 5,078,852 A | | 1/1992 | Yee et al. |
| 5,096,550 A | | 3/1992 | Mayer et al. |

(List continued on next page.)

FOREIGN PATENT DOCUMENTS

JP 04120288 4/1992

OTHER PUBLICATIONS

"Upside–Down Resist Coating of Semiconductor Wafers", IBM Technical Disclosure Bulletin, vol. 32, No. 1, Jun. 1989, pp. 311–313.

Evan E. Patton, et al., "Automated Gold Plate–Up Bath Scope Document and Machine Specifications", Tektronix Confidential, dated Aug. 4, 1989, pp. 1–13.

*Primary Examiner*—Robert J. Sandy
*Assistant Examiner*—Karlena Schwing
(74) *Attorney, Agent, or Firm*—Skjerven Morrill MacPherson LLP; David E. Steuber

(57) ABSTRACT

A rotary union for use with an electroplating apparatus includes a shaft having a first surface area and an extended surface area, the first surface area having a first aperture therein, the extended surface area having a second aperture therein. The rotary union further includes an outer face seal and an inner face seal. The outer face seal is pressed against, and forms a seal with, the first surface area. The inner face seal is pressed against, and forms a seal with, the extended surface area. A pressure passage coupled to the first aperture passes through the outer face seal and around the outside of the inner face seal. A pressure/vacuum passage coupled to the second aperture passes through the inner face seal.

12 Claims, 48 Drawing Sheets

U.S. PATENT DOCUMENTS

| | | |
|---|---|---|
| 5,135,636 A | 8/1992 | Yee et al. |
| 5,222,310 A | 6/1993 | Thompson et al. |
| 5,227,041 A | 7/1993 | Brogden et al. |
| 5,332,487 A | 7/1994 | Young, Jr. et al. |
| 5,372,699 A | 12/1994 | Rischke et al. |
| 5,377,708 A | 1/1995 | Bergman et al. |
| 5,391,285 A | 2/1995 | Lytle et al. |
| 5,405,518 A | 4/1995 | Hsieh et al. |
| 5,421,987 A | 6/1995 | Tzanavaras et al. |
| 5,429,733 A | 7/1995 | Ishida |
| 5,437,777 A | 8/1995 | Kishi |
| 5,441,629 A | 8/1995 | Kosaki |
| 5,443,707 A | 8/1995 | Mori |
| 5,447,615 A | 9/1995 | Ishida |
| 5,462,649 A | 10/1995 | Keeney et al. |
| 5,472,592 A | 12/1995 | Lowery |
| 5,498,325 A | 3/1996 | Nishimura et al. |
| 5,522,975 A | 6/1996 | Andricacos et al. |
| 5,597,460 A | 1/1997 | Reynolds |
| 5,670,034 A | 9/1997 | Lowery |
| 5,718,560 A * | 2/1998 | Lorenzen |
| 5,725,745 A | 3/1998 | Ikegaya |
| 5,750,014 A | 5/1998 | Stadler et al. |
| 5,776,327 A | 7/1998 | Botts et al. |
| 5,788,829 A | 8/1998 | Joshi et al. |
| 5,804,052 A | 9/1998 | Schneider |
| 5,843,296 A | 12/1998 | Greenspan |
| 5,855,850 A | 1/1999 | Sittler |
| 6,004,828 A | 12/1999 | Hanson |
| 6,007,068 A * | 12/1999 | Dellacorte |

* cited by examiner

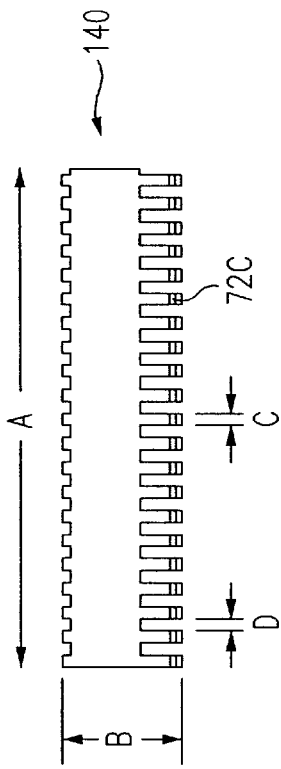
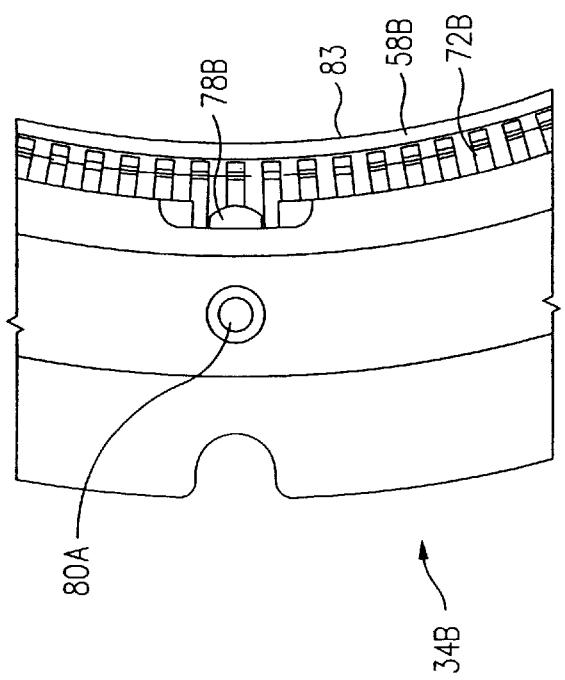

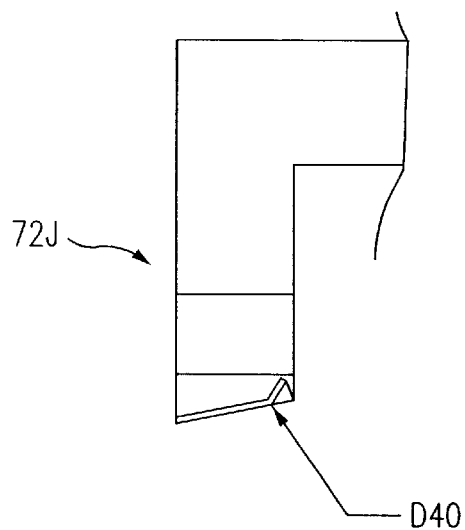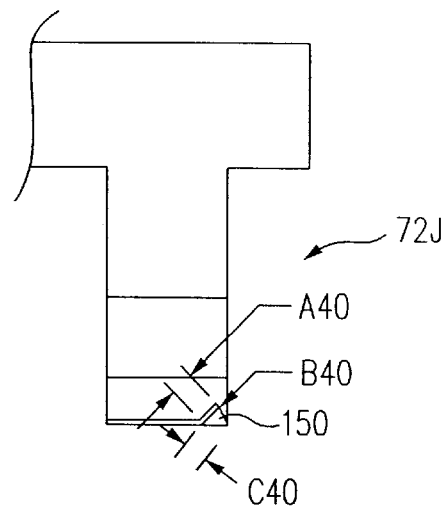
FIG. 40B  FIG. 40A
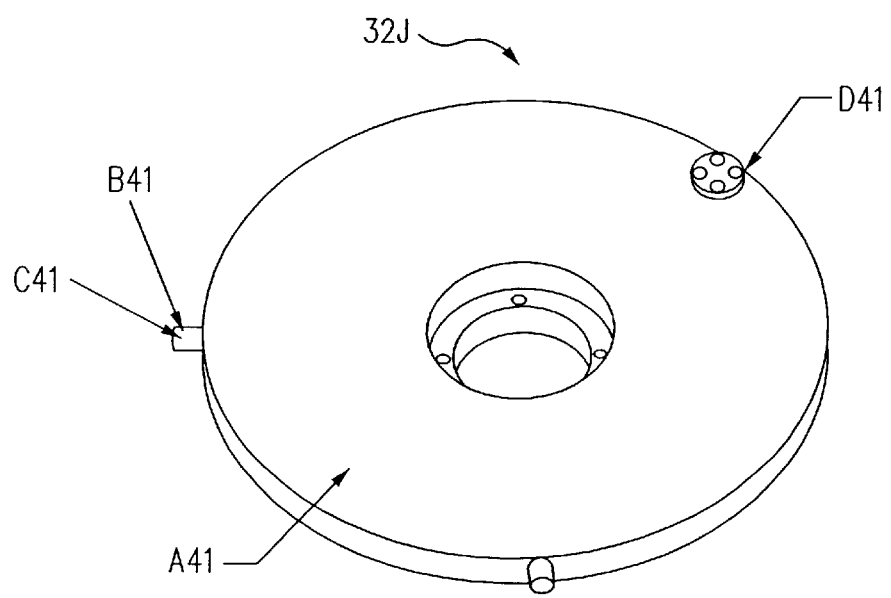
FIG. 41

DUAL CHANNEL ROTARY UNION

CROSS REFERENCE TO RELATED APPLICATION

This application is a divisional of application Ser. No. 08/969,984, filed Nov. 13, 1997, entitled "Clamshell Apparatus for Electrochemically Treating Semiconductor Wafers." of Evan E. Patton and Wayne Fetters, owned by the assignee of this application.

This application is related to Contolini et al., co-filed application Ser. No. 08/970,120, Reid et al., co-filed application Ser. No. 08/969,267, and Reid et al., co-filed application Ser. No. 08/969,196, all of which are incorporated herein by reference in their entirety.

FIELD OF THE INVENTION

The present invention relates generally to a method and apparatus for treating the surface of a substrate and more particularly to a method and apparatus for electroplating a layer on a semiconductor. wafer.

BACKGROUND OF THE INVENTION

The manufacture of semiconductor devices requires the formation of electrical conductors on semiconductor wafers. For example, electrically conductive leads on the wafer are often formed by electroplating (depositing) an electrically conductive material such as copper on the wafer and into patterned trenches.

Electroplating involves making electrical contact with the wafer surface upon which the electrically conductive material is to be deposited (hereinafter the "wafer plating surface"). To insure a uniform deposition, it is important that the electrical contact with-the wafer plating surface be uniform and reliable.

Brogden et al., U.S. Pat. No. 5,227,041 (hereinafter Brogden), teaches a dry contact electroplating apparatus wherein a number of electrical contacts are provided adjacent to a central aperture of a base of the apparatus. Brogden further teaches that the contacts preferably include relatively sharp tips for piercing any insulating substance which may be present on the wafer plating surface. However, even with relatively sharp tips, one or more of the contacts may form a poor electrical connection with the wafer plating surface. This results in nonuniformity of the deposited electrically conductive layer. To determine if one or more poor;electrical connections were made with the wafer plating- surface, the wafer can be tested to measure the uniformity of the deposited electrically conductive layer. However, wafers exhibiting nonuniformity of the deposited electrically conductive layer must be discarded reducing the yield of the electroplated wafers. Further, it is not practical or cost effective to test every wafer. Thus, it is desirable to have an apparatus for electroplating a wafer which provides uniform electrical contact with the wafer plating surface while at the same time providing a means of readily testing the integrity of the electrical contact with the wafer plating surface before the wafer is electroplated.

Electroplating also requires immersion of the wafer in a plating solution (i.e. a solution containing ions of the element being deposited, for example a solution containing $Cu^{++}$). It is important to prevent contamination of the wafer backside (i.e. the surface of the wafer opposite the wafer plating surface) and the wafer edge from the electrolyte (the ions of the element being deposited).

One conventional method of preventing contamination is to use a corrosive solvent immediately following the electroplating to remove contaminants from the wafer backside and the wafer edge. While this method is satisfactory, it requires an extra processing step and the use of hazardous chemicals. A more effective method is to prevent contamination of the wafer backside and the wafer edge in the first place. Accordingly, it is desirable to have an apparatus for electroplating a wafer which avoids contamination of the wafer backside and the wafer edge at any time during the process.

Brogden (cited above) teaches an electroplating apparatus which reduces contamination of the wafer backside and wafer edge during the electroplating process. Referring to FIG. 2 of Brogden, a sealing ring 40 positioned inside electrical contacts 36 forms a sealing connection with the wafer so that contacts 36 and the wafer backside and edge are not exposed to the plating solution. However, particulates and nonuniformities may result in a poor sealing connection with the wafer allowing plating solution to leak past sealing ring 40 to contaminate contacts 36 and the wafer backside and edge. In the event of leakage, the electroplating apparatus must be serviced and the wafer may have to be discarded. Accordingly, the art needs a dry contact electroplating apparatus which eliminates possible leakage of the plating solution and avoids the associated contamination of the contacts and wafer backside and edge.

Another difficulty with immersing the wafer in a plating solution is entrapment of air bubbles on the wafer plating surface. Air bubbles disrupt the flow of electrolytes and electrical current to the wafer plating surface creating nonuniformity in the deposited layer. One conventional method of reducing air bubble entrapment is to immerse the wafer vertically into the plating solution. However, mounting the wafer vertically for immersion into the plating solution adds complexity and hinders automation of the electroplating process. Accordingly, it is desirable to have an apparatus for electroplating a wafer which avoids air bubble entrapment and which is automated.

SUMMARY OF THE INVENTION

In accordance with the present invention, an apparatus for treating a plating surface of a substrate, typically a wafer, includes a cup having a central aperture defined by an inner perimeter, a compliant seal adjacent the inner perimeter, a plurality of contacts adjacent the compliant seal and a cone attached to a rotatable spindle.

When the cup is clamped to the cone, an O-ring in the pressing surface of the cone presses against the backside of the wafer. This forms a seal between the O-ring and the backside of the wafer and also between the compliant seal and a perimeter region of the plating surface of the wafer while simultaneously forming the electrical connection between the plurality of contacts and the plating surface. The seal with the plating surface prevents the plating solution from contacting the wafer edge, the wafer backside and the plurality of contacts and thus prevents the associated electrolyte contamination. As a secondary measure to prevent electrolyte contamination, the region behind the compliant seal is pressurized thus preventing the plating solution from leaking past the compliant seal. Further, any leak in the seal with the plating surface can be readily detected by monitoring for any escape of the pressurized gas in the region behind the compliant seal.

Mounting the cone on a rotatable spindle advantageously allows the assembly of the cone, cup and wafer to be rotated after the assembly is immersed in the plating solution. This prevents bubble entrapment on the wafer and improves electrolyte transport to the wafer which, in turn, improves the uniformity of the electroplated layer. Further, the thickness profile of the electroplated layer can readily be adjusted by changing the rotational speed of the assembly.

The plurality of contacts can be grouped into banks of contacts electrically isolated from one another. In this manner, after the electrical connection between the plurality of contacts and the plating surface is established, continuity in resistances between the banks of contacts can be checked to readily detect if any poor electrical connections were made.

In accordance with the present invention, a method of depositing an electrically conductive layer on the wafer includes providing the wafer having an electrically conductive seed layer on a first surface of the wafer. The wafer is then placed first surface down into the cup and the cup is then clamped to the cone thus establishing the electrical connection between the plurality of contacts and the seed layer. The cup is then placed into the plating solution thus exposing a portion of the seed layer to the plating solution. The cup and wafer are then rotated and voltage is applied to the plurality of contacts thus depositing the electrically conductive layer on the seed layer.

In accordance with the present invention, a rotary union for use with an electroplating apparatus includes a shaft having a first surface area and an extended surface area, the first surface area having a first aperture therein, the extended surface area having a second aperture therein. The rotary union further includes an outer face seal and an inner face seal. The outer face seal is pressed against, and forms a seal with, the first surface area. The inner face seal is pressed against, and forms a seal with, the extended surface area. A pressure passage coupled to the first aperture passes through the outer face seal and around the outside of the inner face seal. A pressure/vacuum passage coupled to the second aperture passes through the inner face seal.

The rotary union has a lower connector or a lower connector in combination with a tube connector which allows the pressure/vacuum passage to be coupled to an inner coaxial tube and the pressure passage to be coupled to an outer coaxial tube. Of importance, this allows both vacuum and pressure to be provided through the inner and outer coaxial tubes, respectively, to a rotating clamshell of the electroplating apparatus. Since the inner and outer coaxial tubes share a common axis (the inner tube being inside of the outer tube), the space required for the tubing is reduced to that of the outer coaxial tube compared to having both the inner and outer tubes in a side by side arrangement. This is particularly advantageous for use in an electroplating apparatus in accordance with the present invention wherein size constraints of the pressure and vacuum lines, as well as concentric geometry, requires coaxial tubing of the pressure and vacuum lines.

These and other objects, features and advantages of the present invention will be more readily apparent from the detailed description of the preferred embodiments set forth below taken in conjunction with the accompanying drawings.

BRIEF DESCRIPTION OF THE DRAWINGS

FIG. 11 is an enlarged top plan view of a region of the cup of FIG. 10.

FIG. 12 is a top plan view of a contact strip for use in a clamshell in accordance with the present invention.

FIGS. 40A and 40B are front perspective views of a contact at various stages during fabrication from the contact strip of FIG. 39.

FIG. 41 is a top perspective view of a cone in accordance with this embodiment of the present invention.

DETAILED DESCRIPTION OF THE PREFERRED EMBODIMENTS

Several elements in the following figures are substantially similar. Therefore similar reference numbers are used to represent similar elements.

Figure 1:
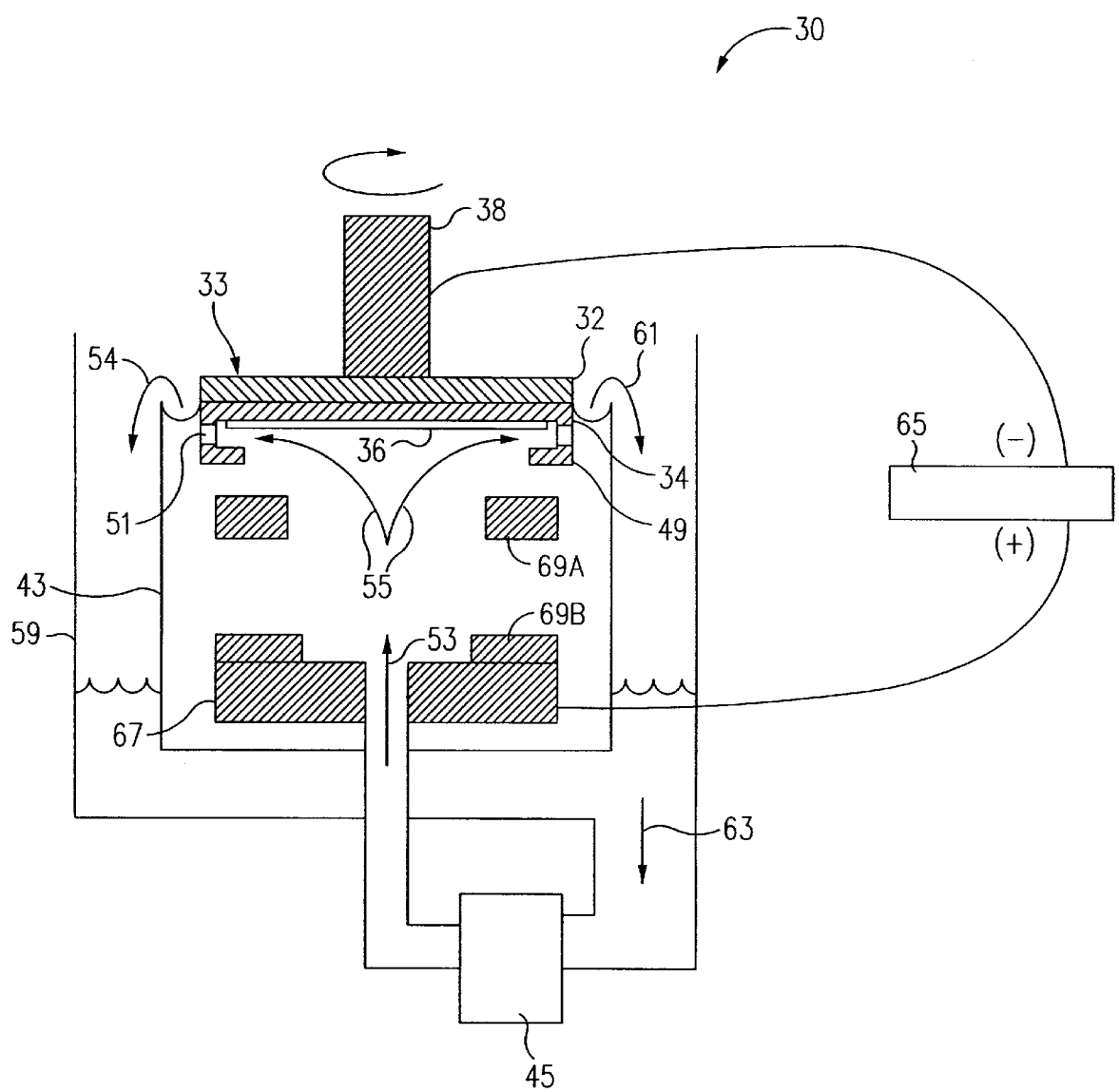
FIG. 1 is a diagrammatical view of an electroplating apparatus having a wafer mounted therein in accordance with the present invention.

FIG. 1 is a diagrammatical view of an electroplating apparatus 28 having a wafer 36 mounted therein in accordance with the present invention. Apparatus 28 includes a clamshell 33 mounted on a rotatable spindle 38 which allows rotation of clamshell 33. Clamshell 33 comprises a cone 32, a cup 34 and a flange 49. Flange 49 has formed therein a plurality of apertures 51. A flange similar to flange 51 is described in detail in Contolini et al., co-filed application Ser. No. 08/970,120, cited above.

During the electroplating cycle, wafer 36 is mounted in cup 34. Clamshell 33 and hence wafer 36 are then placed in a plating bath 43 containing a plating solution. As indicated by arrow 53, the plating solution is continually provided to plating bath 43 by a pump 45. Generally, the plating solution flows upwards to the center of wafer 36 and then radially outward and across wafer 36 through apertures 51 as indicated by arrows 55. Of importance, by directing the plating solution towards the center of wafer 36, any gas bubbles entrapped on wafer 36 are quickly removed through apertures 51. Gas bubble removal is further enhanced by rotating clamshell 33 and hence wafer 36.

The plating solution then overflows plating bath 43 to an overflow reservoir 59 as indicated by arrows 61. The plating solution is then filtered (not shown) and returned to pump 45 as indicated by arrow 63 completing the recirculation of the plating solution.

A DC power supply 65 has a negative output lead electrically connected to wafer 36 through one or more slip rings, brushes and contacts (not shown). The positive output lead of power supply 65 is electrically connected to an anode 67 located in plating bath 43. During use, power supply 65 biases wafer 36 to have a negative potential relative to anode 67 causing an electrical current to flow from anode 67 to wafer 36. (As used herein, electrical current flows in the same direction as the net positive ion flux and opposite the net electron flux.) This causes an electrochemical reaction (e.g. $Cu^{++}+2e^-=Cu$) on wafer 36 which results in the deposition of the electrically conductive layer (e.g. copper) on wafer 36. The ion concentration of the plating solution is replenished during the plating cycle, for example by dissolving a metallic anode (e.g. $Cu=Cu^{++}+2e^-$). Shields 69A and 69B (virtual anodes) are provided to shape the electric field between anode 67 and wafer 36. The use and construction of anodes and shields are further described in Reid et al., co-filed application Ser. No. 08/969,120 and Reid et al., co-filed application Ser. No. 08/969,267, both cited above.

Figure 2:
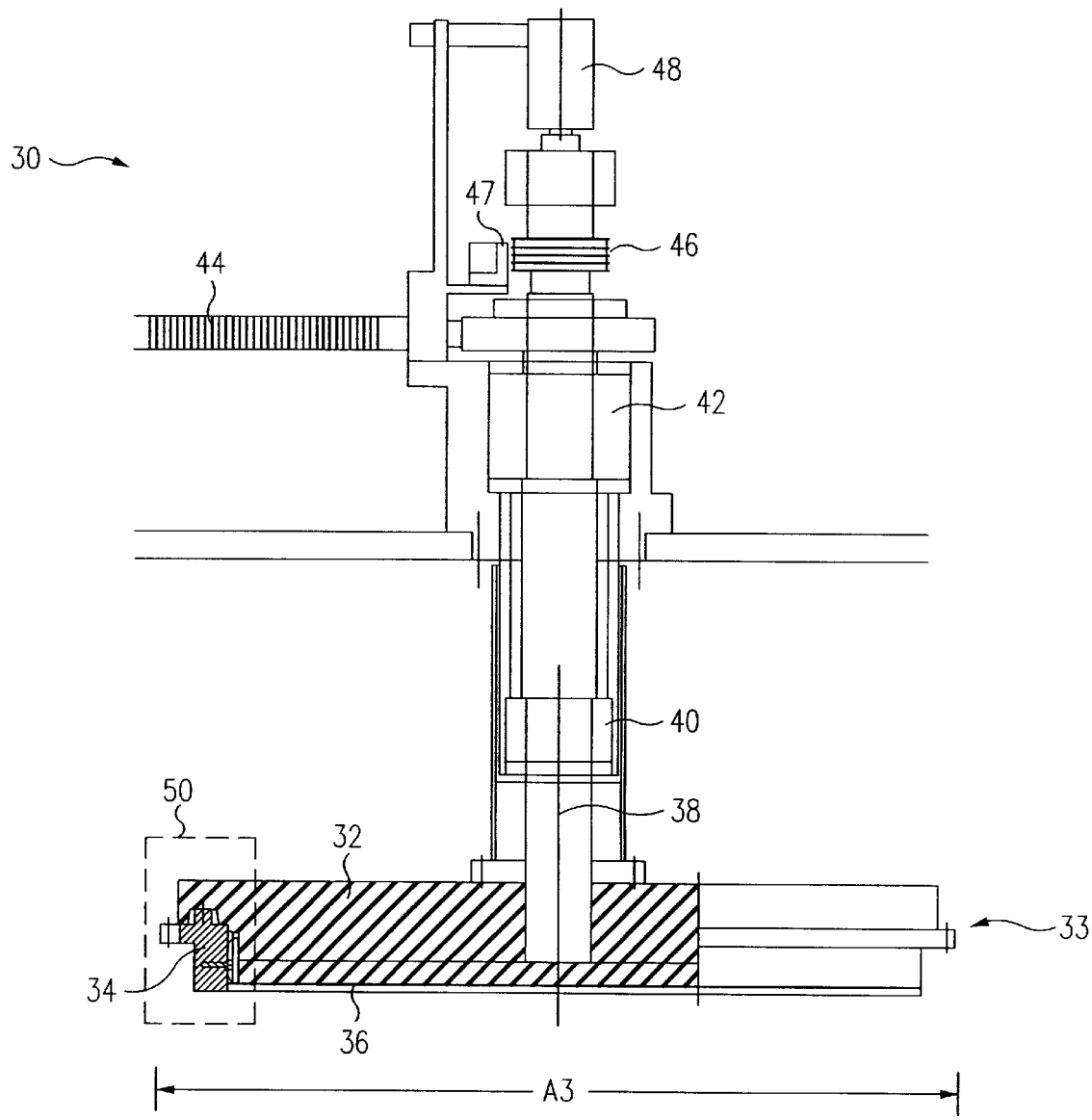
FIG. 2 is a partial cross-sectional view of the electroplating apparatus of FIG. 1 in accordance with the present invention.

FIG. 2 is a partial cross-sectional view of apparatus 30 in accordance with the present invention. Apparatus 30 includes cone 32 and cup 34 which in combination form clamshell 33 in which a semiconductor wafer 36, typically a silicon wafer, is mounted Illustratively, the diameter A3 of cup 34 is 14.350 inches (in.).

Cone 32 is attached to rotatable spindle 38. Spindle 38 is supported by a needle bearing 40 and a dual tapered roller bearing 42 which allow spindle 38 to rotate. A motor (not shown) drives spindle 38 by a drive belt 44. Spindle 38 and hence wafer 36 are typically rotated from 20 revolutions per minute (rpms) to 150 rpms during the electroplating cycle. Rotating wafer 36 prevents bubble entrapment on wafer 36 and improves electrolyte transport to wafer 36 which, in turn, improves the uniformity of the electroplated layer. Further, the motor has the capability of rotating spindle 38 at 1000 rpms or greater after clamshell 33 is removed from the plating solution to sling excess plating solution from clamshell 33 and wafer 36.

Slip rings 46 mounted on and electrically isolated from spindle 38 are electrically connected to clamshell 33 by wires (not shown) inside of spindle 38. Slip rings 46 in combination with corresponding brushes 47 (each slip ring 46 is in contact with a corresponding brush 47) enable electrical connection between external electrical components (e.g. power supply 65 of FIG. 1) and clamshell 33 when spindle 38 is rotating as those skilled in the art will understand. One or more slip rings 46 are typically used to provide one or more channels (electrical pathways electrically isolated from one another, e.g. a slip ring 46 electrically connected to a wire). For example, four or six slip rings 46 are used. Suitable slip ring assemblies are available from Meridian Laboratory, Inc. under the name "ROTOCON" and from Fabricast, Inc. This is a significant advantage over Brogden (cite above) wherein the configuration of the conductor to the contacts through the side facing handle precludes rotation of the wafer.

Spindle 38 is also fitted with a dual channel rotary union 48 which enables vacuum and pressurized gas to be provided from external sources to clamshell 33 through vacuum and pressure lines (not shown) inside of spindle 38.

Apparatus 30 is mounted on a rack which allows vertical movement of apparatus 30 to enable clamshell 33 and wafer 36 to be lowered into the plating solution. Apparatus 30 is also provided with a computer controller (not shown) which controls the various operations of apparatus 30.

Figure 3:
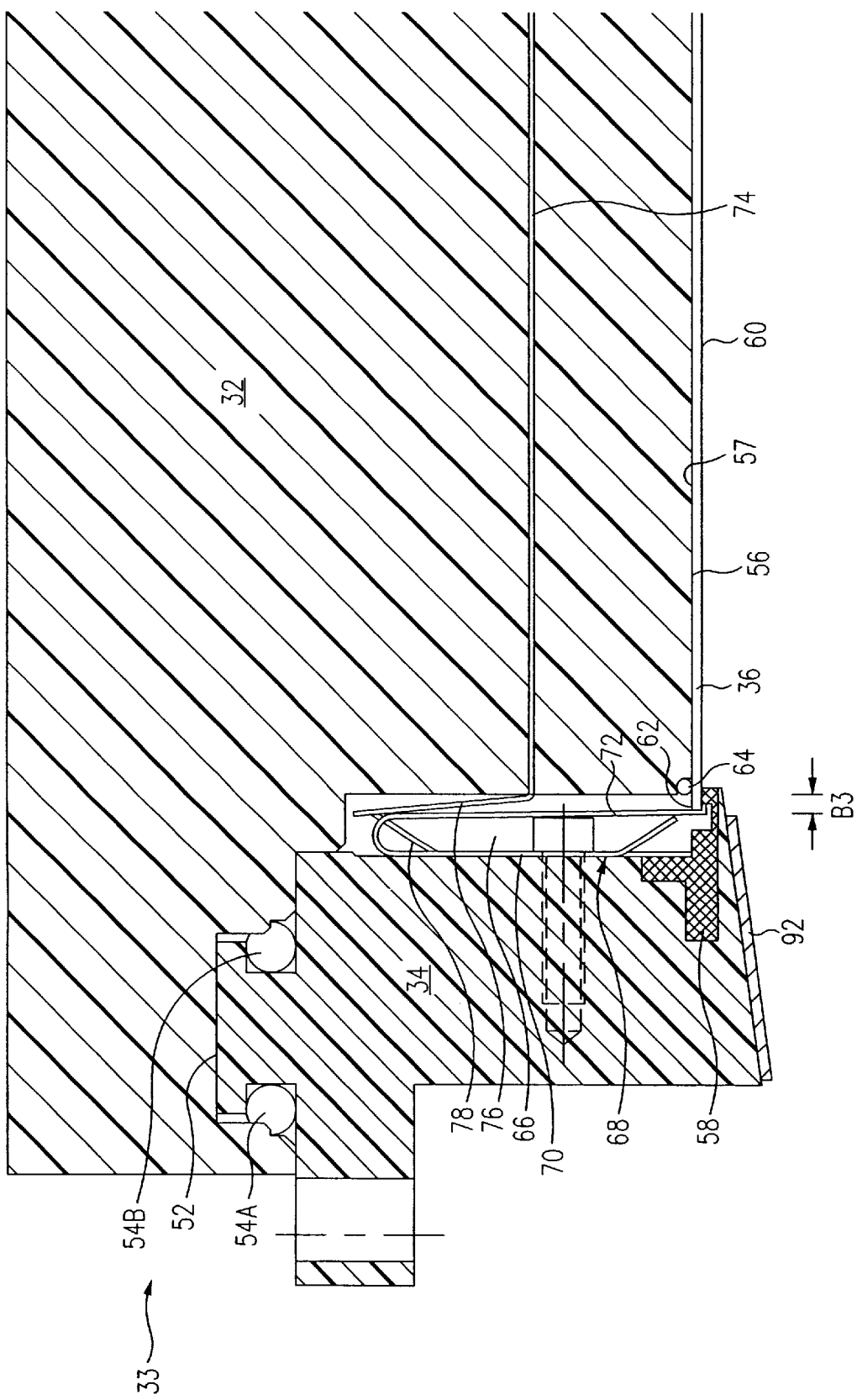
FIG. 3 is an enlarged cross-sectional view of a region of the clamshell of FIG. 2 in accordance with one embodiment of the present invention.

FIG. 3 is an enlarged cross-sectional view of a region 50 of FIG. 2 of clamshell 33 in accordance with one embodiment of the present invention. Referring to FIG. 3, clamshell 33 is in the closed position, i.e. cone 32 is in abutting contact with cup 34 and is in pressing contact with the backside 56 of wafer 36. Cone 32 and cup 34 are clamped together by pulling a vacuum in region 52 between cone 32 and cup 34. More particularly, cone 32, cup 34 and O-rings 54A, 54B define a region 52 (a cavity) between cone 32 and cup 34. Region 52 is evacuated by a vacuum line (not shown) from dual channel rotary union 48 (FIG. 2) to clamp cone 32 to cup 34. The use of vacuum to clamp cone 32 to cup 34 ensures the two clamping surfaces remain flat and properly mated. This is in contrast to the prior art wherein mechanical clamping significantly increases complexity, allows fixture warpage, produces non-uniform sealing and makes automation difficult.

The total force exerted on wafer 36 is determined by the surface areas of cone 32, cup 34 in region 52. Increasing (decreasing) the surface areas increases (decreases) the total force exerted on wafer 36. An illustrative total force on an eight inch diameter wafer (an 8 in. wafer) is in the range of 100 to 400 pounds and typically is greater than 150 pounds.

Cup 34 is fitted with a compliant seal 58 which contacts a perimeter region of plating surface 60 of wafer 36. (The perimeter region is an area of plating surface 60 adjacent edge 62 of wafer 36.) Compliant seal 58 is typically formed of a relatively soft material preferably having a Shore A hardness in the range of 60–80. Suitable materials for compliant seal 58 include KALREZ and VITON synthetics manufactured by Dupont, and CHEMRAZ synthetic manufactured by Green, Tweed.

By clamping cup 34 to cone 32, pressing surface 57 of cone 32 presses against backside 56 of wafer 36. This forces the perimeter region of plating surface 60 of wafer 36 against compliant seal 58 which forms a seal between cup 34 and plating surface 60. By forming a seal between cup 34 and plating surface 60, compliant seal 58 prevents contact between the plating solution and edge 62 and backside 56 of wafer 36 and the associated electrolyte contamination of importance, the distance B3 from edge 62 of plating surface 60 covered by compliant seal 58 (illustratively 0.0600 in.) should be minimized to minimize loss of useable area of plating surface 60.

As a secondary measure to prevent contamination of backside 56 of wafer 36, an O-ring 64 is located in a channel of pressing surface 57 of cone 32. O-ring 64 extends beyond the plane defined by pressing surface 57 and is interposed between cone 32 and the backside 56 of wafer 36. A resulting region 66 is pressurized with a gas from a compressed gas line (not shown), typically dry air or an inert gas such as argon or nitrogen. More particularly, region 66 (a cavity) is defined by cone 32, cup 34 including compliant seal 58, wafer 36 and O-rings 54B, 64. O-ring 64 prevents the pressurized gas in region 66 from contacting most of the backside 56 of wafer 36 and thus eliminates any possible damage to wafer 36 from the pressurized gas. Further, by pressurizing region 66, any inadvertent leak in the seal formed between plating surface 60 of wafer 36 and compliant seal 58 results in the escape of pressurized gas from region 66 into the plating solution, i.e. prevents the plating solution from entering into region 66 and contaminating edge 62 and backside 56 of wafer 36.

Although pressing surface 57 of cone 32 is illustrated as contacting backside 56 of wafer 36 in FIG. 3, in an alternative embodiment (not shown), O-ring 64 is in pressing contact with backside 56 of wafer 36 and pressing surface 57 does not directly contact backside 56. This embodiment further reduces possible contamination of backside 56 of wafer 36 since contact between pressing surface 57 and backside 56 of wafer 36 is eliminated.

Still referring to FIG. 3, a contact/snubber 68, and more particularly a base section 70 of contact/snubber 68, is bolted to cup 34. Contact/snubber 68 has an extended portion 72 (hereinafter contacts 72) which directly contact and form the electrical connection with plating surface 60 of wafer 36. Of importance, contact/snubber 68 is located in region 66 so that contact between contact/snubber 68 and the plating solution is avoided.

Located within cone 32 is a lead 74 which is electrically connected to one or more of slip rings 46 (FIG. 2). Lead 74 is attached to a sliding contact 76 which extends from cone 32 and forms a sliding electrical connection with a tab 78 of contact/snubber 68. When a wafer 36 is being loaded or unloaded, cone 32 is raised relative to cup 34 and the electrical connection between sliding contact 76 and tab 78 is broken. However, after a wafer 36 is loaded and cone 32 lowered, sliding contact 76 re-engages tab 78 reestablishing the electrical connection between sliding contact 76 and tab 78.

On the outer surface of cup 34 a thief electrode 92 can be positioned adjacent wafer 36. Thief electrode 92 is connected to one or more of the channels of slip rings 46. During the electroplating cycle, material is electroplated on thief electrode 92 thereby reducing the tendency of the electroplated layer on wafer 36 to be thicker adjacent edge 62 of wafer 36 as those skilled in the art will understand. Thus, by providing a thief electrode 92, uniformity of the electroplated layer on plating surface 60 of wafer 36 may be improved.

Figure 4:
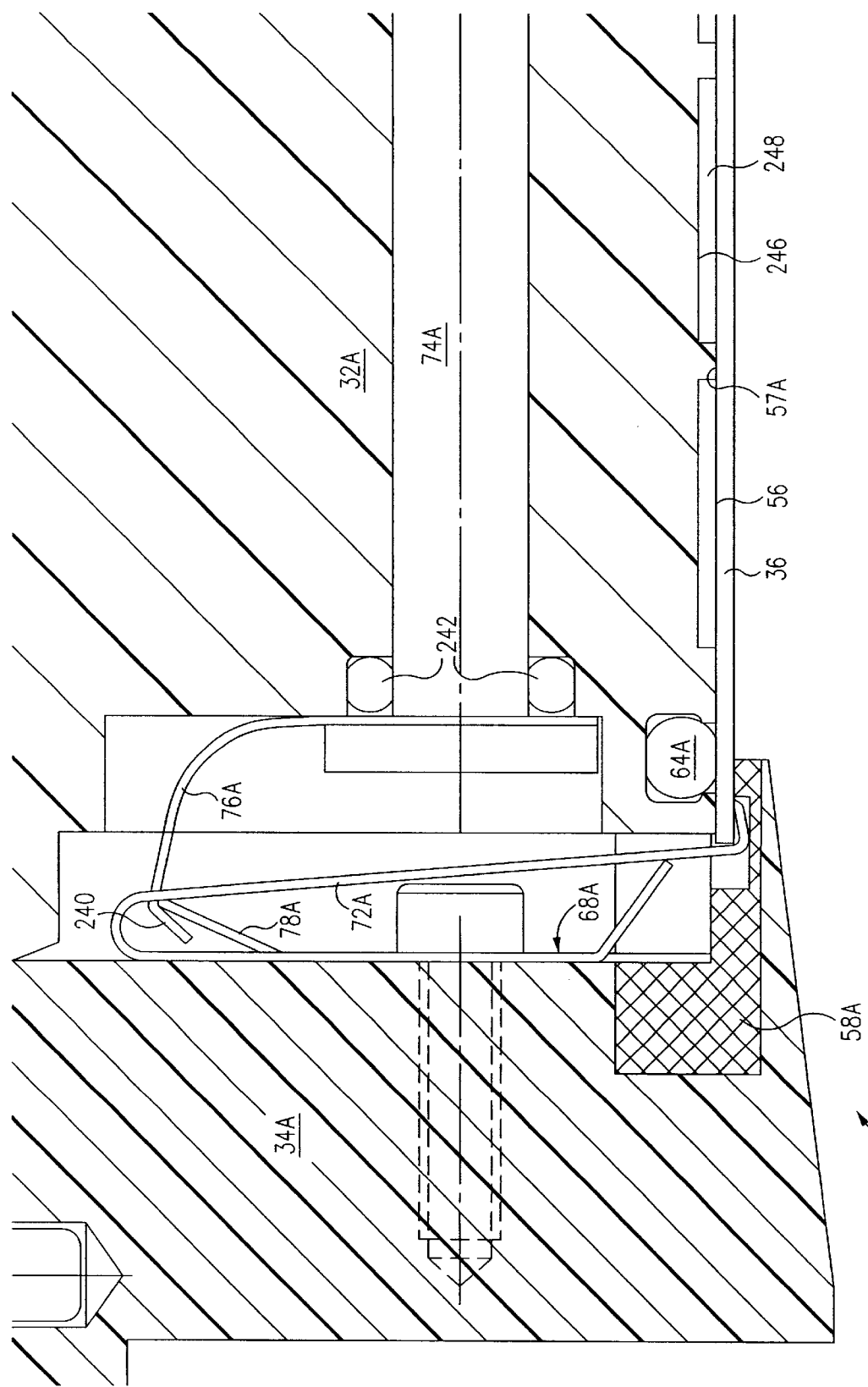
FIG. 4 is an enlarged cross-sectional view of a region of a clamshell in accordance with an alternative embodiment of the present invention.

FIG. 4 is an enlarged cross-sectional view of a region of a clamshell 33A in accordance with an alternative embodiment of the present invention. As shown in FIG. 4, clamshell 33A includes a cone 32A and cup 34A. Located within cone 32A is a lead 74A formed of an electrically conductive material. Lead 74A is sealed to cone 32A by an O-ring 242. Electrically connected to lead 74A is a bent contact 76A having a hook 240. As shown in FIG. 4, when cone 32A is lowered, hook 240 engages tab 78A making the electrical connection between hook 240 and tab 78A. Further, since contact 76A is displaced upward, contact 76A exerts a spring force which presses hook 240 towards tab 78A enhancing the electrical between hook 240 and tab 78A.

Cone 32A is also provided with a plurality of grooves 248 and, more particularly, pressing surface 57A of cone 32A comprises a plurality of recessed surface areas 246 which define grooves 248. By forming pressing surface 57A with a plurality of grooves 248, the total surface area of cone 32A which contacts backside 56 of wafer 36 is reduced which, in turn, reduces possible contamination of backside 56.

Figure 5:
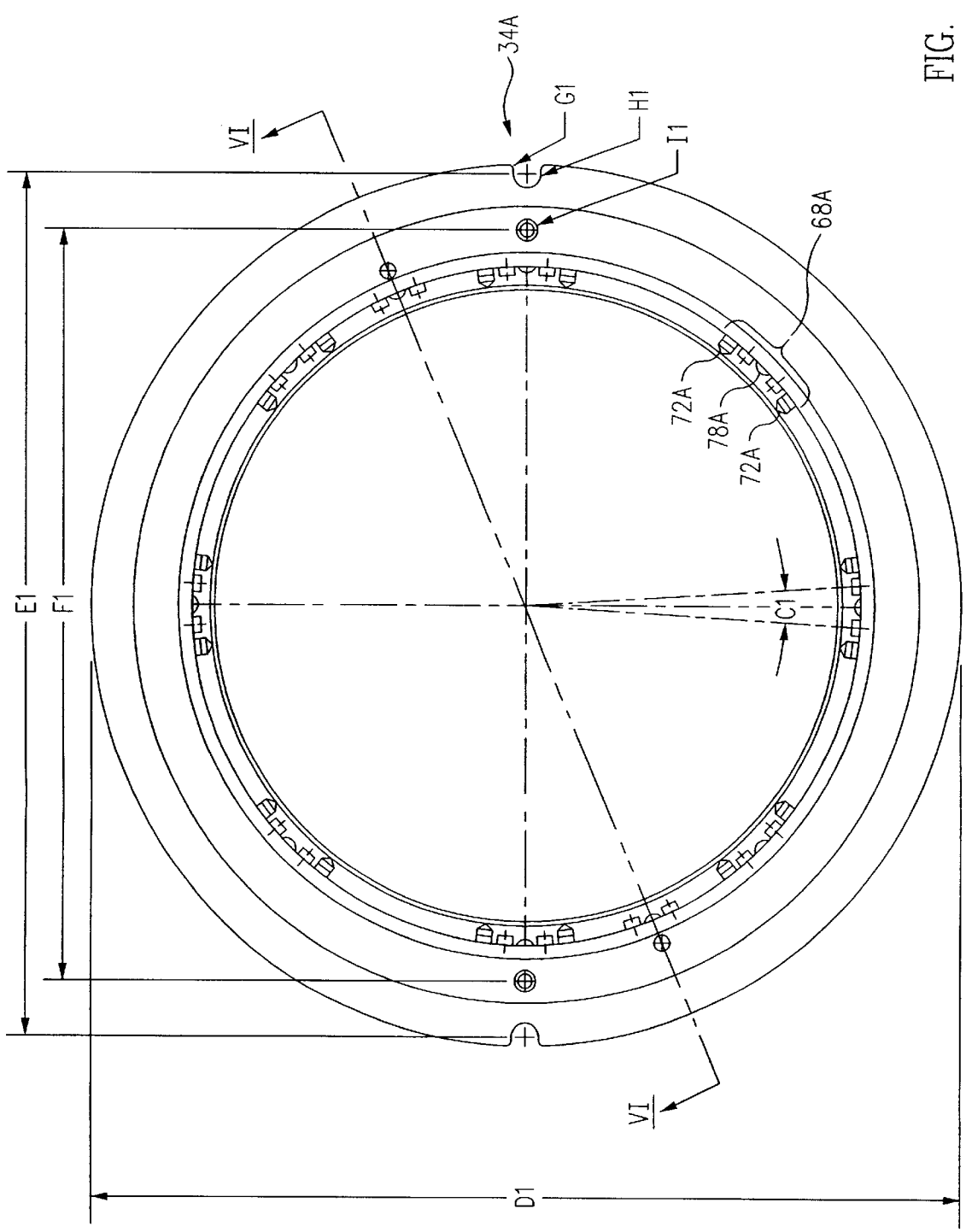
FIG. 5 is a top plan view of a cup in accordance with the present invention.

FIG. 5 is a top plan view of a cup 34A in accordance with this embodiment of the present invention. Shown in FIG. 5 are a plurality of contact/snubbers 68A although for clarity only a single contact/snubber 68A is labeled. Each contact/snubber 68A includes a tab 78A located at the center of the contact/snubber 68A and two contacts 72A. As described above, tabs 78A make the electrical connection with contact 76A of one 32A (FIG. 4) and contacts 72A make the electrical connection with the plating surface of the wafer (not shown in FIG. 5). Contacts 72A also center the wafer when it is first placed in cup 34A.

Illustrative specifications for various characteristics of cup 34A shown in FIG. 5 are provided in Table 1 below.

TABLE 1

| CHARACTERISTIC | SPECIFICATION |
| --- | --- |
| C1 | 7° (10 PLCS) |
| D1 | 10.600 In. |
| E1 | 10.380 In. |
| F1 | 9.030 In. |
| G1 | 45° X .050 In. CHAMBER (4 PLCS) |
| H1 | .316 In. WIDE SLOT (2 PLCS) |
| I1 | 0.1360 In. X .475 In. DEEP 90° Countersink x .050 In. DEEP (2 PLCS) |

Figure 6:
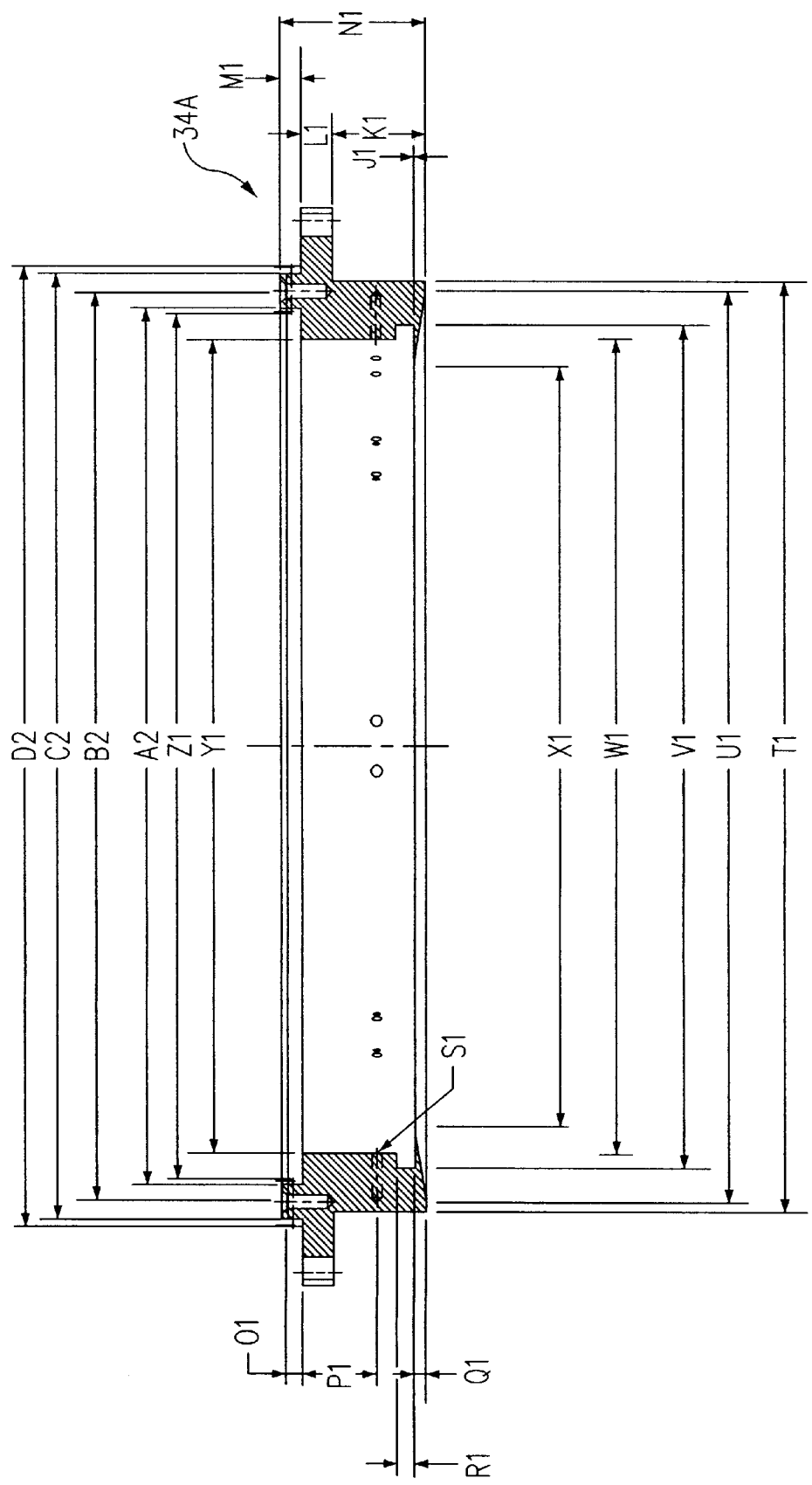
FIG. 6 is a cross-sectional view of the cup along the line VI—VI of FIG. 5.

FIG. 6 is a cross-sectional view of cup 34A along the line VI—VI of FIG. 5 in accordance with this embodiment of the present invention. Illustrative specifications for various characteristics of cup 34A shown in FIG. 6 are provided in Table 2 below.

TABLE 2

| CHARACTERISTIC | SPECIFICATION |
| --- | --- |
| J1 | 0.010 In. |
| K1 | 0.950 In. |
| L1 | .310 In. |
| M1 | .220 In. |
| N1 | 1.480 In. |
| O1 | .145 In. |
| P1 | .750 In. |
| Q1 | .100 In. |
| R1 | .200 In. |
| S1 | 4–40 THRD X .37 In. DEEP (20 PLCS) |
| T1 | 09.200 In. |
| U1 | 09.100 In. |
| V1 | 08.480 In. |
| W1 | 08.300 In. |
| X1 | 07.640 In. |
| Y1 | 08.180 In. |
| Z1 | 08.510 In. |
| A2 | 08.690 In. |
| B2 | 9.030 In. |
| C2 | 09.370 In. |
| D2 | 09.550 In. |

Figure 7:
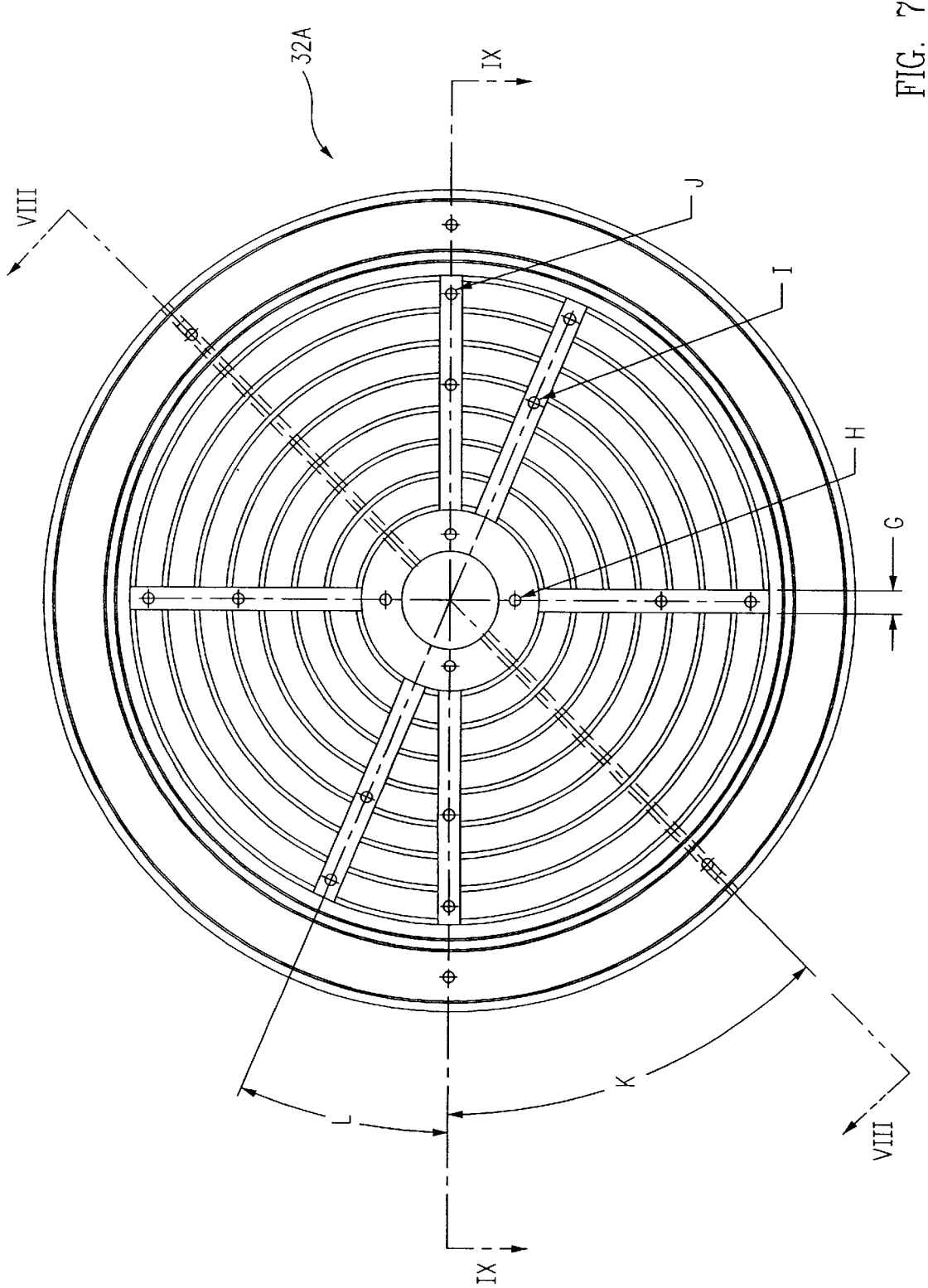
FIG. 7 is a bottom plan view of a cone in accordance with the present invention.

FIG. 7 is a bottom plan view of a cone 32A in accordance with this embodiment of the present invention. Illustrative specifications for various characteristics of cone 32A shown in FIG. 7 are provided in Table 3 below.

TABLE 3

| CHARACTERISTIC | SPECIFICATION |
| --- | --- |
| G | .260 In. (6 PLCS) |
| H | 8–32 THRD X .50 In. deep, 4 PLCS ON A 1.625 In. bolt circle |
| I | 4–40 THRD X .37 In. deep, 6 PLCS ON A 5.250 In. bolt circle |
| J | 4–40 THRD X .37 In. deep, 6 PLCS ON A 7.250 In. bolt circle |
| K | 45° |
| L | 22.50° |

Figure 8:
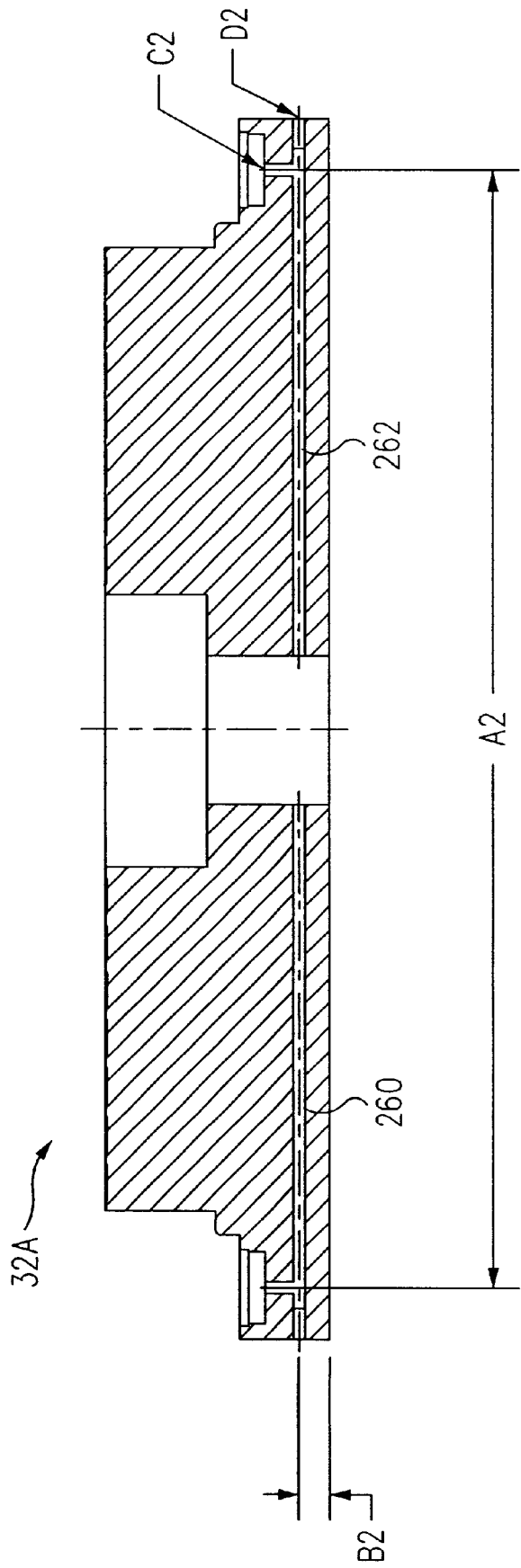
FIG. 8 is a cross-sectional view of the cone along the line VIII—VIII of FIG. 7.

FIG. 8 is a cross-sectional view of cone 32A along the line VIII—VIII of FIG. 7 in accordance with this embodiment of the present invention. Shown in FIG. 8 are vacuum passages 260, 262 through which vacuum is provided to clamp cone 32A to cup. 34A (cup 34A is not shown in FIG. 8). Illustrative specifications for various characteristics of cone 32A shown in FIG. 8 are provided in Table 4 below.

TABLE 4

| CHARACTERISTIC | SPECIFICATION |
| --- | --- |
| A2 | 9.0300 In. |
| B2 | 0.250 In. |
| C2 | 0.093 In. Thru, (2 PLCS) |
| D2 | 0.136 In. Thru, (Both Sides) TAP 8–32 X 0.25 In. deep (2 PLCS) |

Figure 9:
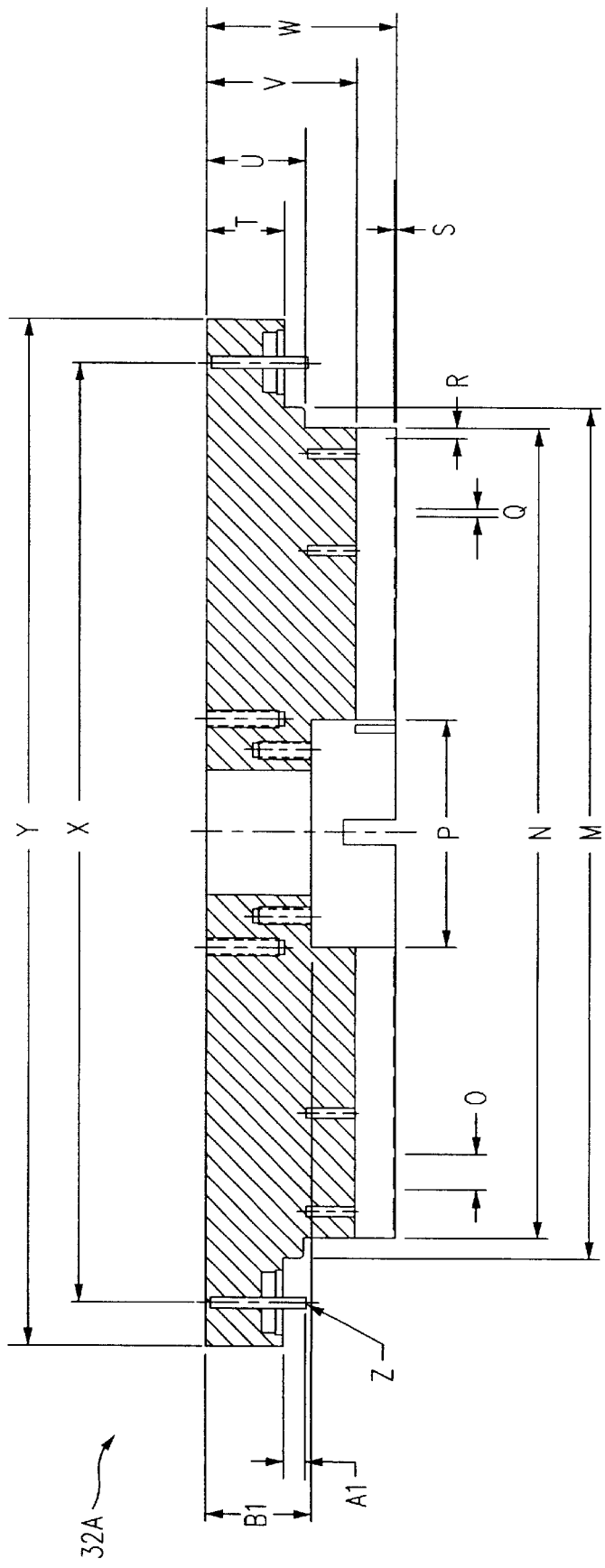
FIG. 9 is a cross-sectional view of the cone along the line IX—IX of FIG. 7.

FIG. 9 is a cross-sectional view of cone 32A along the line IX—IX of FIG. 7 in accordance with this embodiment of the present invention. Illustrative specifications for various characteristics of cone 32A shown in FIG. 9 are provided in Table 5 below.

TABLE 5

| CHARACTERISTIC | SPECIFICATION |
| --- | --- |
| M | 08.176 In. |
| N | 07.800 In. |
| O | .325 In. (7 PLCS) |
| P | 02.250 In. |
| Q | .060 In. (7 PLCS) |
| R | .080 In. |
| S | .025 In. |
| T | .750 In. |
| U | .950 In. |
| V | 1.435 In. |
| W | 1.885 In. |
| X | 9.030 In. |
| Y | 09.850 In. |
| Z | 0.4865 In. X .470 In. deep, (ream) press .1875 In. X .937 In. dowel pin, (2 PLCS) |
| A1 | .250 In. |
| B1 | 1.060 In. |

Figure 10:
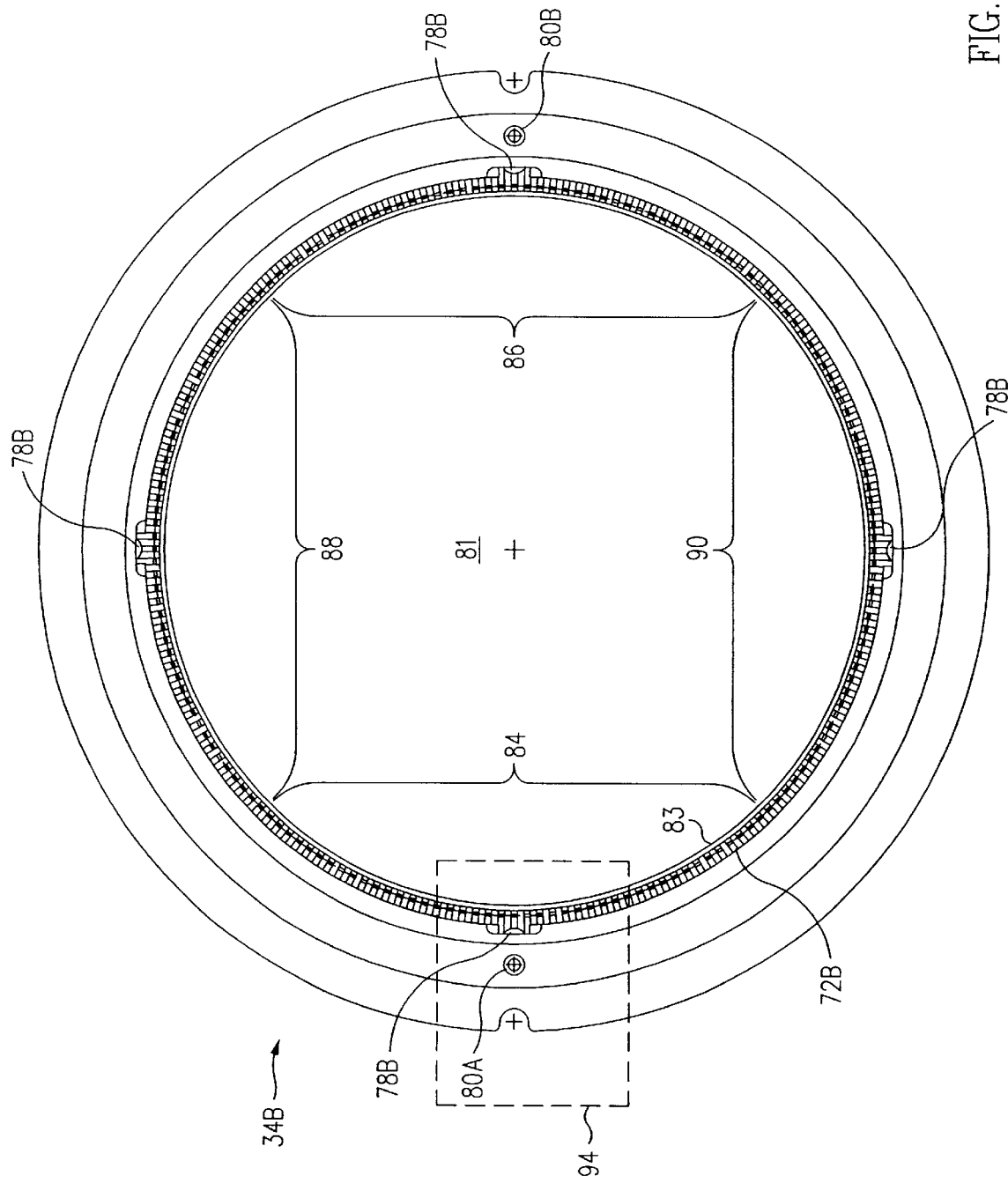
FIG. 10 is a top plan view of a cup in accordance with an alternative embodiment of the present invention.

FIG. 10 is a top plan view of cup 34B in accordance with an alternative embodiment of the present invention. Cup 34B is fitted with two alignment holes 80A, 80B through which alignment pins (not shown) extend into corresponding alignment holes in the cone (not shown). Cup 34B has a central aperture 81 defined by an inner perimeter 83 of cup 34B through which most of the plating surface of the wafer (not shown) is exposed to the plating solution.

In this embodiment, a plurality of contacts 72B, and more particularly 180 contacts 72B are provided to make the electrical connection with the plating surface of the wafer. Typically it is desirable to provide at least 16 contacts 72B, and in one embodiment 128 contacts 72B are provided.

FIG. 11 is an enlarged top plan view of a region 94 of cup 34B of FIG. 10 in accordance with this embodiment of the present invention. Referring to FIG. 11, adjacent inner perimeter 83 of cup 34B is compliant seal 58B and adjacent compliant seal 58B are contacts 72B. Also shown is a tab 78B which forms the electrical connection with the contact of the cone (not shown).

Referring again to FIG. 10, contacts 72B are grouped into banks 84, 86, 88 and 90 of contacts 72B. Each bank of contacts 72B is integral to a contact strip (e.g. see contact strip 140 of FIG. 12 described below) which is electrically isolated from the other banks of contacts. Further, each bank of contacts 72B has at least one tab 78B which allows the bank to be electrically connected to one channel of slip rings 46 (FIG. 2), i.e. allows the bank to be electrically connected to a corresponding one of slip rings 46.

Still referring to FIG. 10, a wafer (not shown) is loaded into cup 34B, plating surface down (into the plane of the paper). Cup 34B is then clamped to a cone as described above. Then, to test the integrity of the electrical connection between contacts 72B and the plating surface of the wafer, the resistance between each bank and another bank is tested and continuity between these resistances is determined. (The wafer is provided with a conventional electrically conductive seed layer on the plating surface, e.g. a copper layer on a titanium nitride layer or on a tantalum layer). For example, a first resistance between banks 84 and 86 is determined and a second resistance between banks 88 and 90 is determined and the first and second resistances are compared. If there is a significant variation in resistance between banks 84, 86, 88 and 90 of contacts 72B, then one or more poor electrical connections between the plating surface of the wafer and contacts 72B exists. Generally, a variation in resistance of 20 milli-ohms (mΩ) or more is sufficient to cause a measurable degradation in plating uniformity at 15 milli-amps per square centimeter (mA/cm$^2$) plating current density. Although contacts 72B are separated into four banks 84, 86, 88 and 90 in FIG. 10, generally contacts 72B are separated in two or more banks of contacts 72B. This is in contrast to the dry contact electroplating apparatus of Brogden (cite above) wherein all of the contacts are electrically connected to one another.

FIG. 12 is a top plan view of a contact strip 140 for use in a clamshell in accordance with the present invention. Contact strip 140 is formed from an electrically conductive material, typically metal having a thickness in the range of approximately 0.002 In. to 0.008 In. Suitable electrically conductive materials include beryllium, copper, halfhard beryllium-copper, stainless steel, tantalum, gold, platinum, titanium nickel, rhodium or other corrosion resistant materials. Other suitable electrically conductive materials include corrosion prone materials coated with corrosion resistant materials such as those listed above. Illustratively, length A of contact strip 140 is 6.0 in., width B of contact strip 140 is 0.700 in., width C of contacts 72C is 0.100 in. and the spacing D between contacts 72C is 0.100 in. Of importance, to insure uniformity in the electrical potential applied to the wafer (not shown), the voltage drop from end to end of contact strip 140 should not exceed one tenth of an ohm (0.1 ohm) when length A is 6.0 in.

Forming contacts 72C integrally as a contact strip 140 simplifies manufacturing and reduces cost compared to forming each contact individually and then electrically connecting the individual contacts together. In one embodiment, using conventional techniques, a single sheet of metal is stamped and then the flat strip is bent to form contact strip 140.

Figure 13:
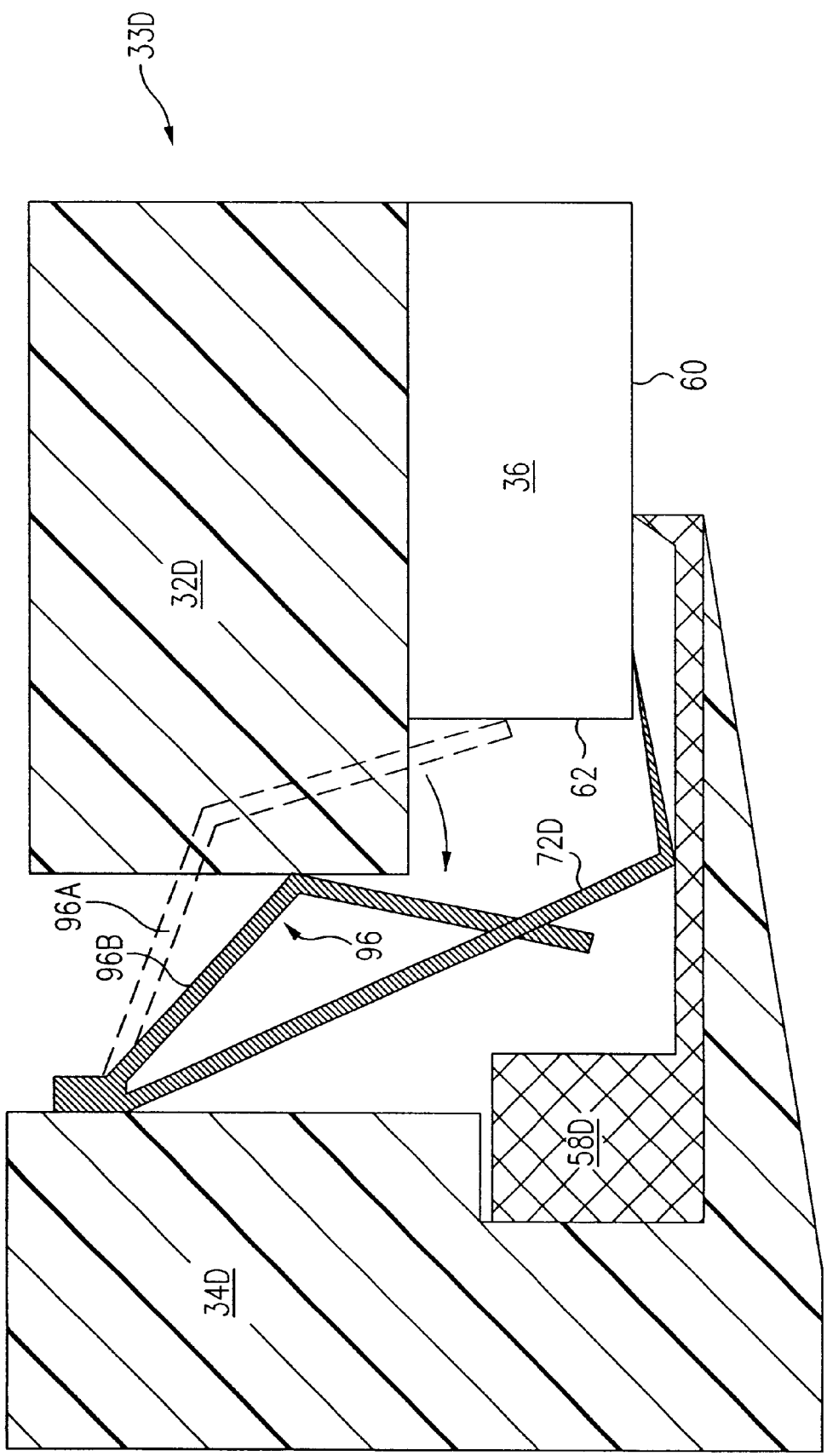
FIG. 13 is a cross sectional view of a wafer mounted in a clamshell in accordance with an alternative embodiment of the present invention.

FIG. 13 is a cross sectional view of a wafer 36 mounted in a clamshell 33D in accordance with an alternative embodiment of the present invention. Clamshell 33D includes a contact strip comprising contacts 72D and snubbers 96. Contacts 72D form the electrical connection with plating surface 60 of wafer 36 as described above. Snubbers 96 center wafer 36 in cup 34D as follows. Initially, wafer 36 is placed into cup 34D and on contacts 72D/compliant seal 58D. Snubbers 96 press on edge 62 of wafer 36 (indicated as location 96A) around the entire wafer 36 thus centering wafer 36. (If wafer 36 is off-center, a first set of snubbers 96 will be displaced more than a second set of snubbers 96 opposite the first set causing the first set to exert more spring force on wafer edge 62 than the second set thus moving and centering wafer 36 until all snubbers 96 are equally displaced by wafer 36.) Cone 32D is then clamped to cup 34D moving snubbers 96 away from edge 62 of wafer 36 (indicated by location 96B).

Referring again to FIGS. 3, 4, 11, contacts 72, 72A, 72B, respectively, act similarly to snubbers 96 (FIG. 13) to center wafer 36 and accordingly snubbers 96 are not provided in these embodiments. More particularly, contacts 72, 72A, 72B (FIGS. 3, 4, 11, respectively) are displaced from their normal resting position when the wafer is placed into the cup and the spring force from the displacement of the contacts centers the wafer. This is in contrast to the prior art wherein off centering of the wafer results in loss of usable wafer area.

Figure 14A:
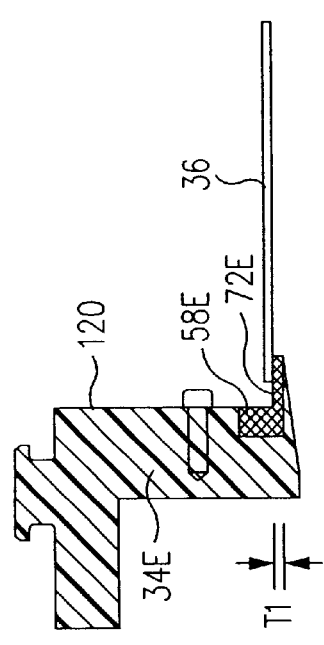
Figure 14B:
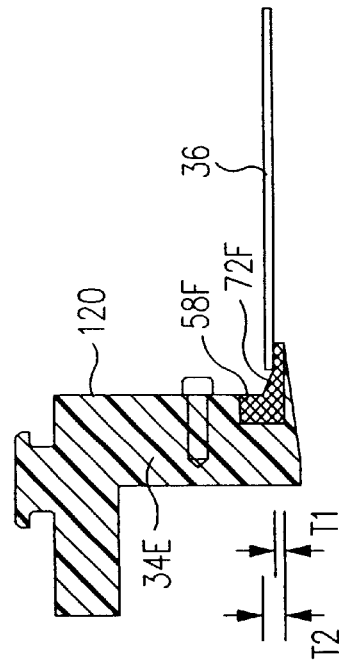

FIGS. 14A, 14B are cross-sectional views of a cup 34E containing a wafer 36 in accordance with alternative embodiments of the present invention. Referring to FIG. 14A, cup 34E is formed of an electrically insulating material such as polyvinylidene flouride (PVDF) or chlorinated polyvinyl chloride (CPVC). (The cone, not shown, can also be formed of the same or a similar insulating material.) The body of compliant seal 58E is mounted in cup 34E and the extending portion of compliant seal 58E which extends from surface 120 of cup 34E has a thickness T1. FIG. 14B is substantially similar to FIG. 14A except that compliant seal 58F (FIG. 14B) tapers from a first thickness T2 at surface 120 of cup 34E to a second thickness T1 and then continues to extend to wafer 36 with thickness T1. Contact 72F has also been modified accordingly.

Figure 15A:
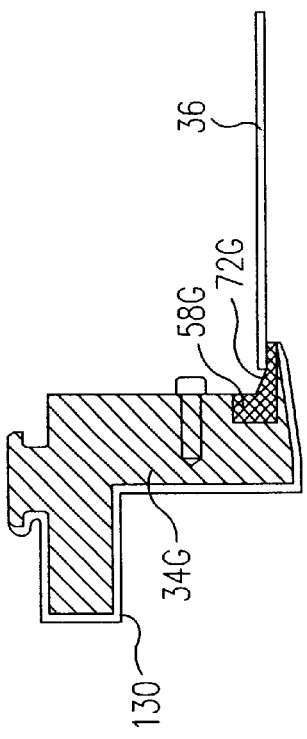
FIGS. 14A, 14B, 15A, 15B are cross-sectional views of a cup containing a wafer in accordance with alternative embodiments of the present invention.
Figure 15B:
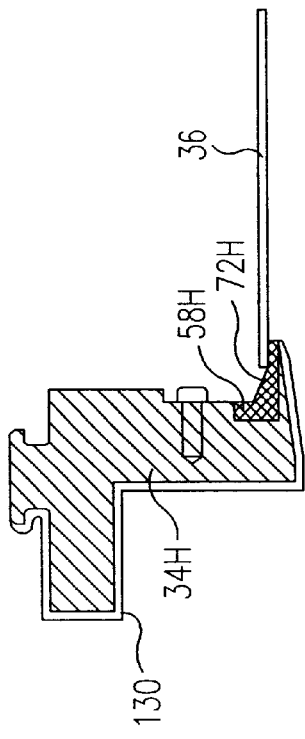

FIGS. 15A, 15B are cross-sectional views of cups 34G, 34H, respectively, in accordance with alternative embodiments of the present invention. Referring to FIG. 15A, cup 34G is formed of an electrically conductive material such as aluminum or stainless steel. Contacts 72G are bolted directly to cup 34G. In this manner, voltage can be provided to contacts 72G by providing voltage to cup 34G. Cup 34G is coated with an electrically insulating layer 130, for example is coated with PVDF, to prevent material from being deposited on cup 34G during the electroplating process. (The cone, not shown, can also be formed of the same or a similar electrically conductive material and can be coated with the same or a similar electrically insulating material). Cup 34H of FIG. 15B is substantially similar to cup 34G of FIG. 15A except that a portion of cup 34H has been bored out (and a portion of compliant seal 58H removed) allowing contacts 72H to be inset into cup 34H.

Referring to FIGS. 15A, 15B, in alternative embodiments (not shown), contacts 72G, 72H are not provided. In these alternatives, the contacts are directly connected to cups 34G, 34H and extend up and pass through compliant seals 72G, 72H, respectively, to make the electrical connection with wafer 36. Illustratively, in these alternatives, the contacts are pogo pins. As still further alternatives, the contacts can be fashioned from contact strips and these contact strips can be passes through compliant seals 58G, 58H to make the electrical connection with wafer 36. By passing the contacts (or contact strips) through the compliant seal, both the electrical connection and the seal with the wafer can be formed at the same region of the wafer plating surface. This advantageously allows the unusable surface area (the area which is not electroplated) of the wafer to be reduced compared to the embodiments wherein the contacts are laterally adjacent the compliant seal.

Figure 16:
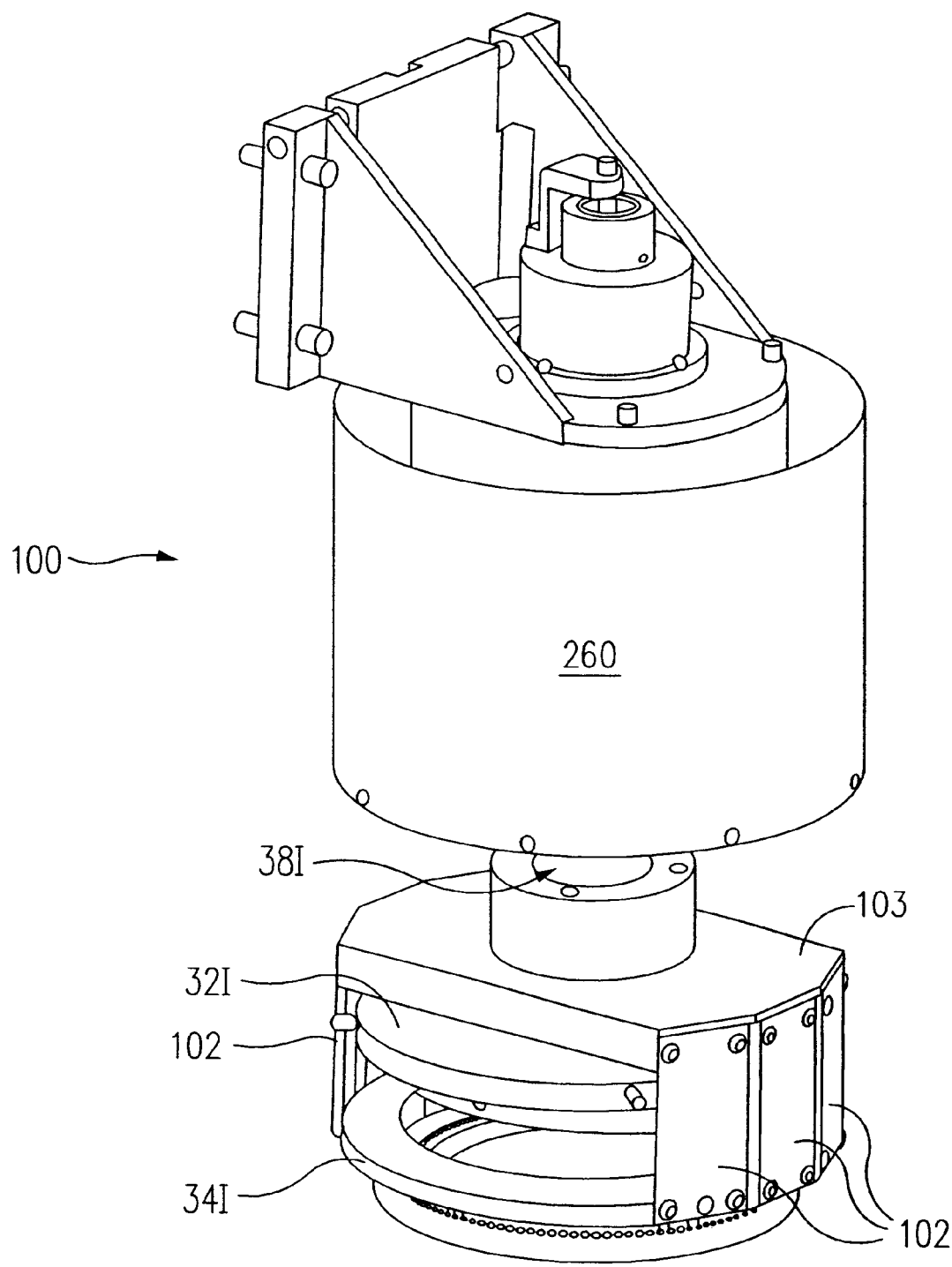
FIGS. 16 and 17 are perspective and cross-sectional view, respectively, of a self-contained clamshell and drive in accordance with an alternative embodiment of the present invention.
Figure 17:
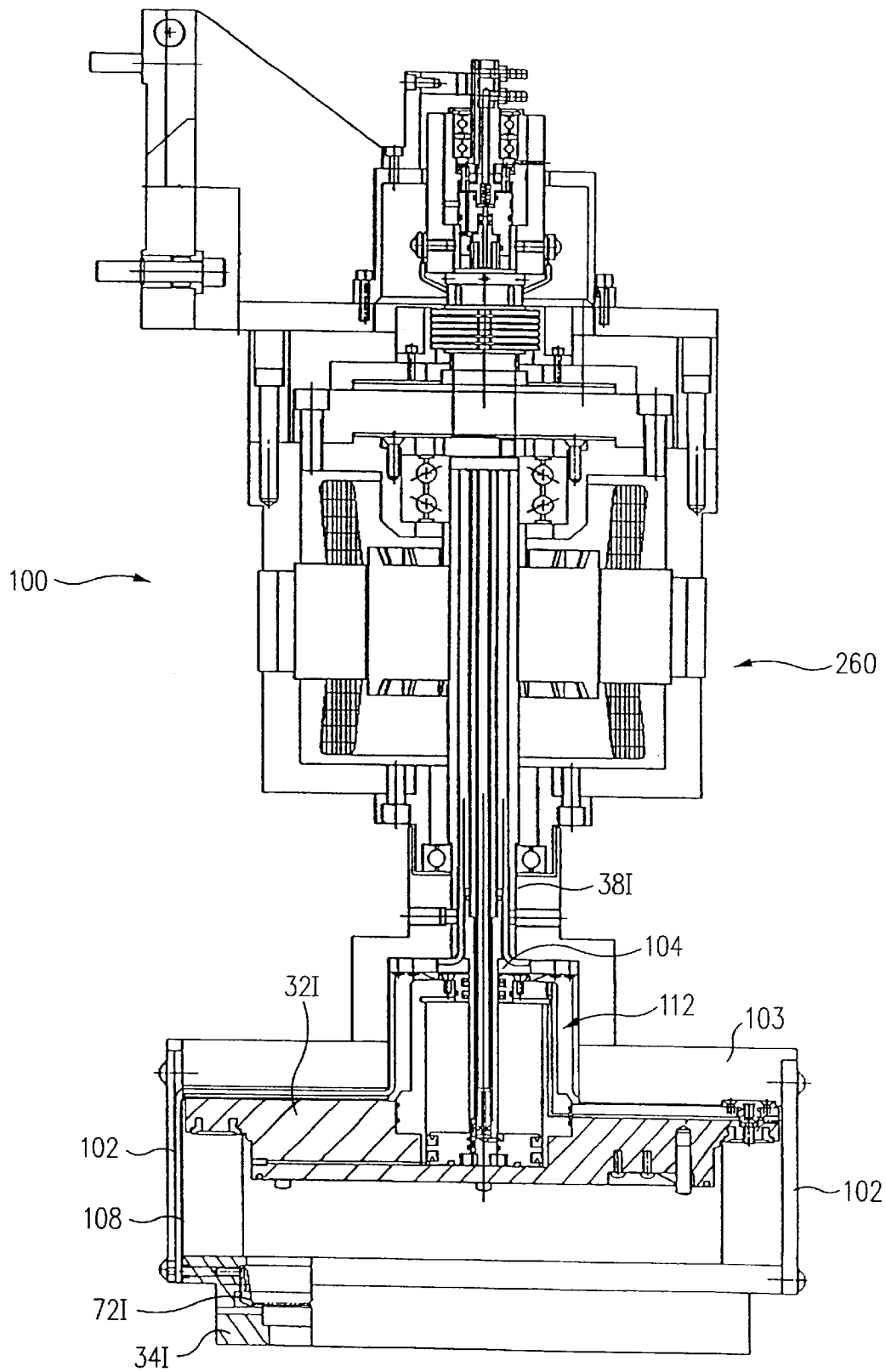

FIGS. 16 and 17 are perspective and cross-sectional view, respectively, of a self-contained clamshell and drive 100 in accordance with an alternative embodiment of the present invention. In this embodiment, cup 34I is fixedly attached to spindle 38I by struts 102 and a top plate 103. As best shown in FIG. 17, cone 32I is attached to a shaft 104 extending into spindle 38I and thereby to spindle 38I. Cone 32I is capable of vertical movement relative to shaft 104 by a conventional air actuated cylinder 112. Clamshell and drive 100 further includes a motor 260 which is in-line with, and rotates, spindle 38I.

Referring now to FIG. 17, running from spindle 38I through top plate 103 and struts 102 are electrical leads (wires) 108 which provided the electrical interconnection with contacts 72I. Although only one lead 108 is illustrated, it is understood that a plurality of leads 108 can be provided depending upon the number of electrical connections required (e.g. depending upon the number of banks of contacts 72I and thief electrodes used). Self-contained clamshell and drive 100 advantageously allows hard wiring of contacts 72I since leads 108 are provided to cup 34I through top plate 103 and struts 102 making breakable contacts (e.g. sliding contact 76 and tab 78 of FIG. 3) unnecessary.

Figure 18:
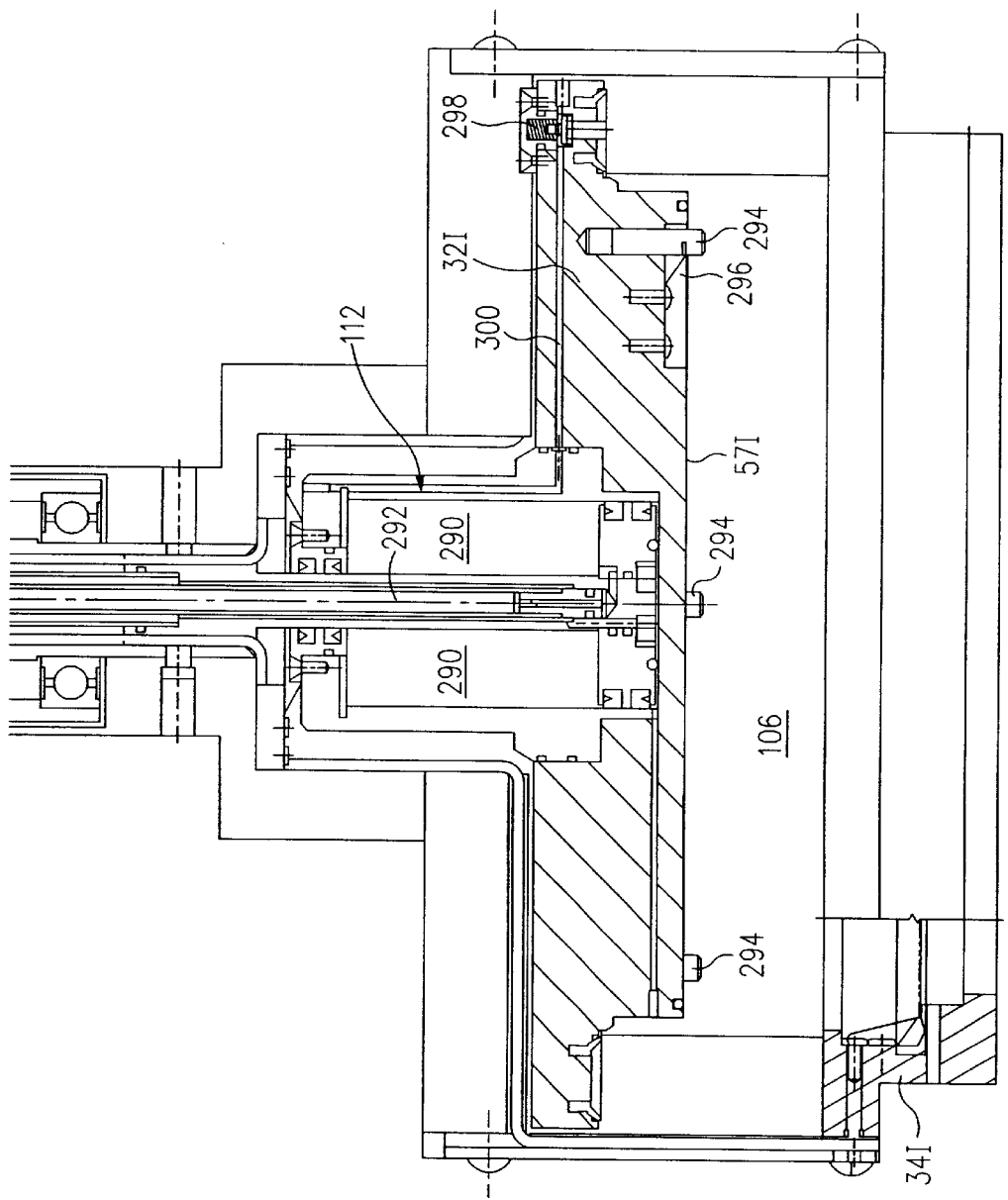
FIG. 18 is a cross-sectional view of the clamshell in the open position in accordance with this embodiment of the present invention.

FIG. 18 is a cross-sectional view of the clamshell in the open position in accordance with this embodiment of the present invention. As shown in FIG. 18, cone 32I is vertically separate from cup 34I, i.e. cone 32I is in the "open position". Cone 32I is kept in the open position by applying pressurized gas to a region 290 of cylinder 112 through pressure/vacuum line 292. The pressurized gas is also applied to poppet valves 298 through pressure/vacuum lines 300. However, since poppet valves 298 remain closed until they contact cup 34I, poppet valves 298 are closed and contain the pressurized gas to pressure/vacuum lines 300. Also shown are wafer push pins 294 which extend from cone 32I beyond pressing surface 57I of cone 32I. Wafer push pins 294 are spring loaded by springs 296.

Figure 19:
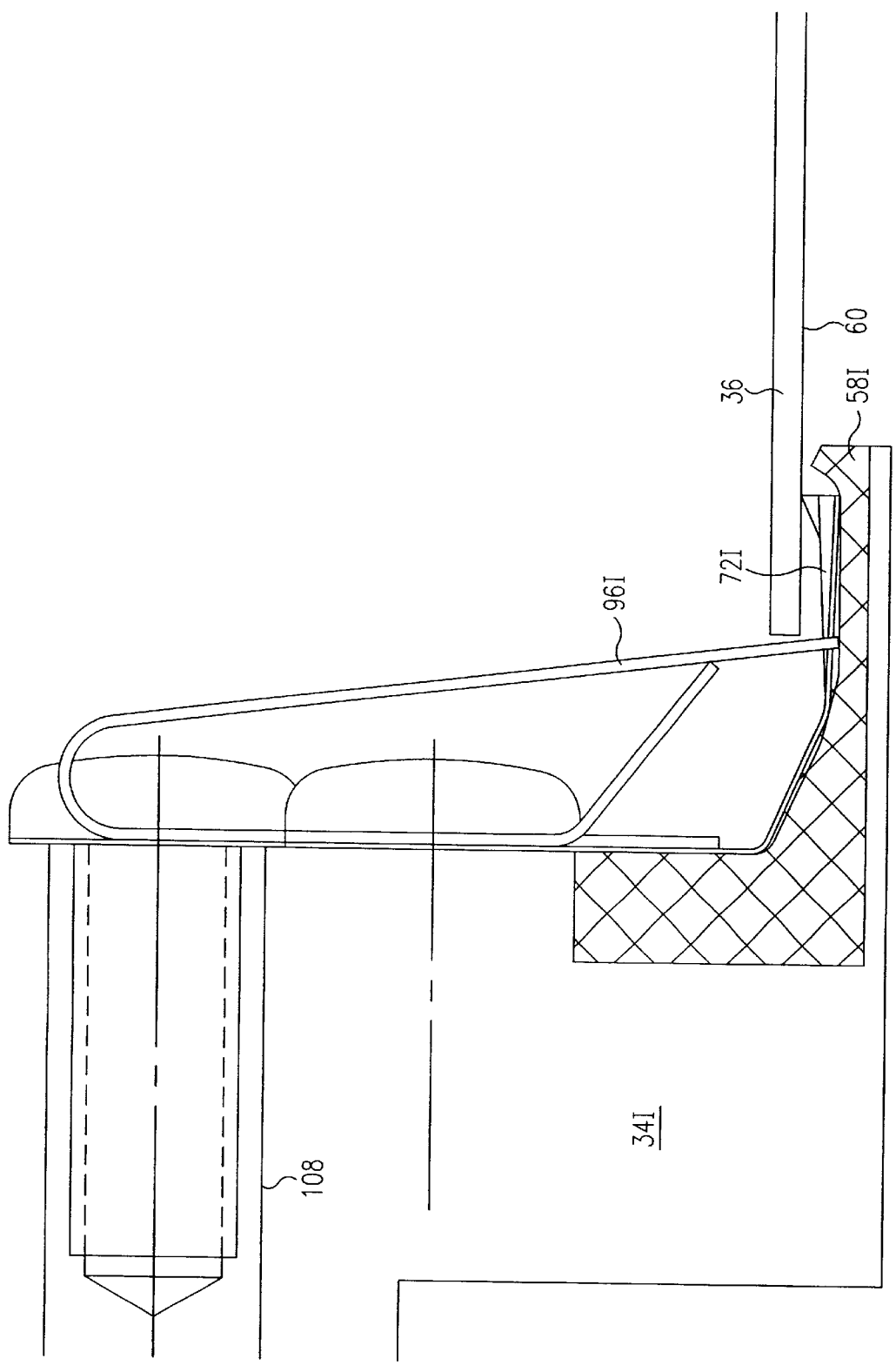
FIG. 19 is an enlarged cross-sectional view of a region of the clamshell of FIG. 18.

A wafer (not shown) is loaded into slot 106 between cone 32I and cup 34I and lowered into cup 34I. Referring now to FIG. 19, wafer 36 is shown sitting in cup 34I. Wafer 36 is centered by snubbers 96I and plating surface 60 of wafer 36 rests on contacts 72I and is vertically separated from compliant seal 58I.

Figure 20:
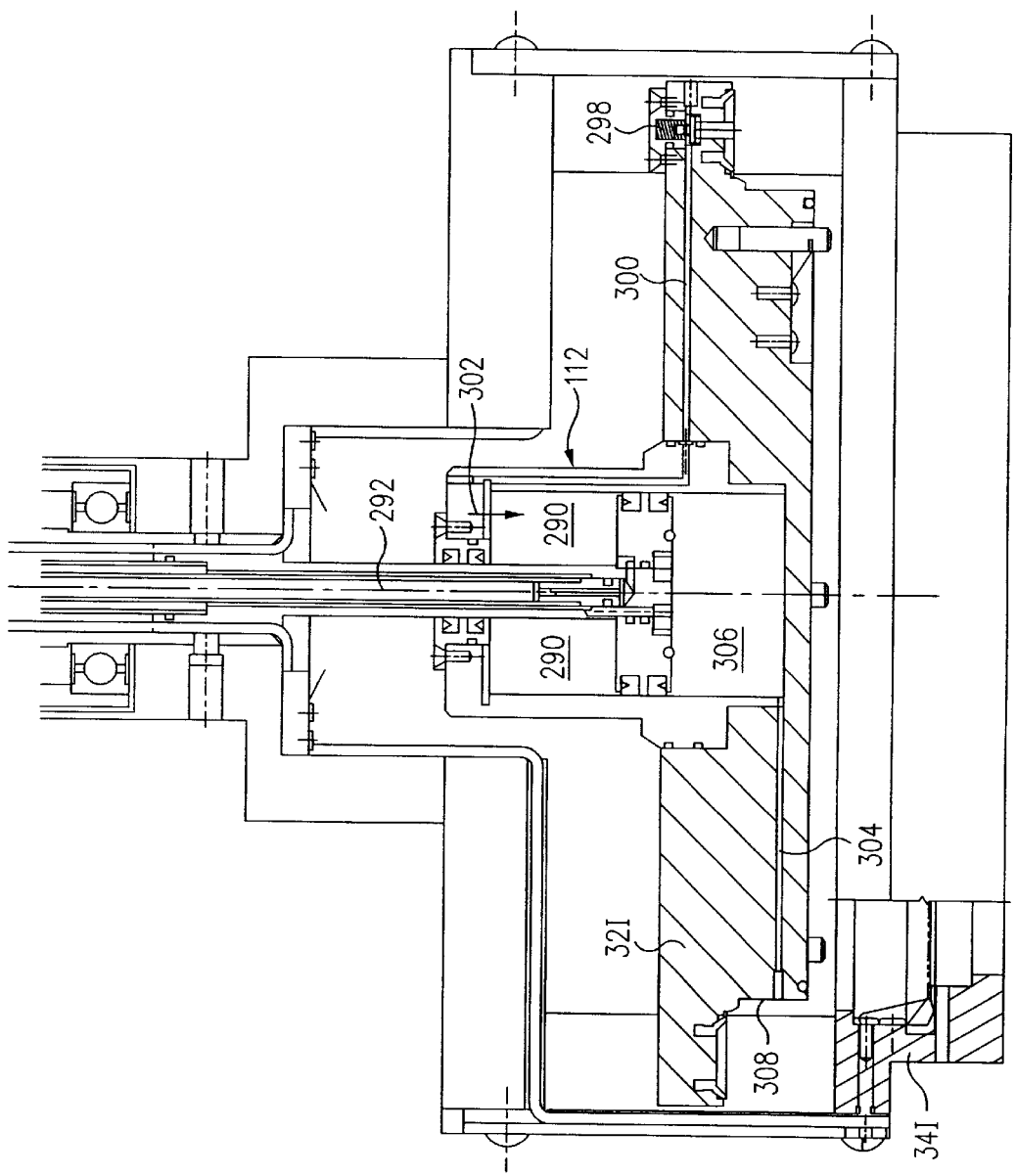
FIG. 20 is a cross-sectional view of the clamshell while closing in accordance with this embodiment of the present invention.

Referring now to FIG. 20, pressurized gas to pressure/vacuum line 292 is replaced with vacuum which draws a vacuum in region 290 of cylinder 112. This causes a top portion of cylinder 112, and hence cone 32I, to move downward as indicated by arrow 302. As cone 32I moves downward, a resulting region 306 of cylinder 112 is vented with atmospheric gasses through a vent/pressure line 304 which extends through cone 32I from a side 308 of cone 32I to cylinder 112. Pressure/vacuum lines 300 are also evacuated however, since poppet valves 298 remain closed, the vacuum is contained to pressure/vacuum lines 300.

Figure 21:
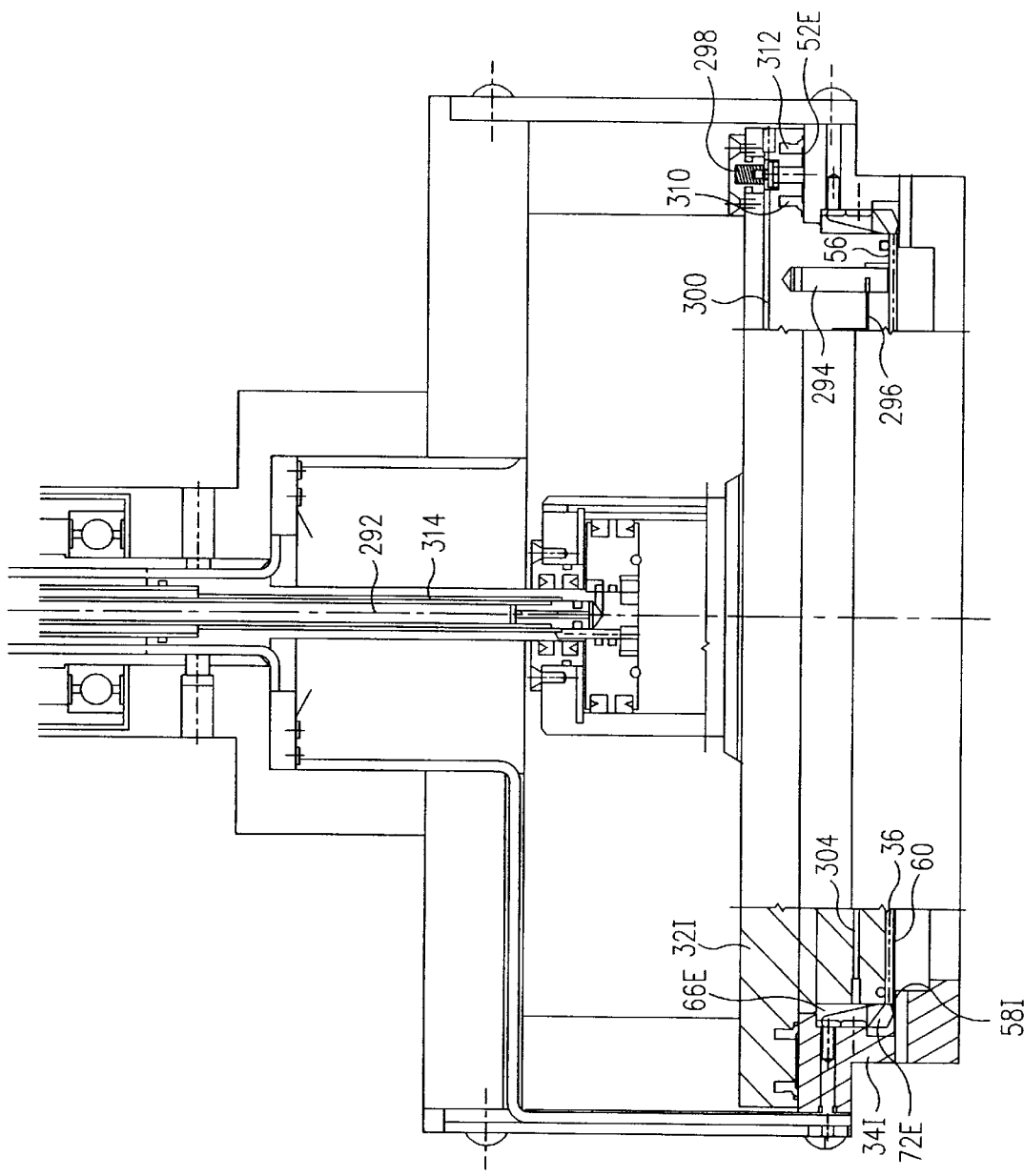
FIG. 21 is a cross-sectional view of the clamshell in the closed position in accordance with this embodiment of the present invention.

FIG. 21 is a cross-sectional view of the clamshell in the closed position in accordance with this embodiment of the present invention. As shown in FIG. 21, cone 32I and poppet valves 298 are in abutting contact with cup 34I and hence poppet valves 298 are open. Since poppet valves 298 are open, vacuum from pressure/vacuum lines 300 (which are connected to pressure/vacuum line 292 which is also evacuated) is applied between cone 32I and cup 34I, clamping cone 32I to cup 34I. More particularly, a clamping region 52E defined by cone 32I and cup 34I and seals 310, 312 is evacuated thereby clamping cone 32I to cup 34I. Illustratively, seals 310, 312 are formed of VITON. Advantageously, by shutting off the vacuum and monitoring for any pressure rise, a check is readily performed to determine if cone 32I is properly clamped to cup 34I.

When the clamshell is in the closed position, pressurized gas is applied to vent/pressure lines 304 by a pressure line 314 coaxial with pressure/vacuum line 292. This pressurized gas thus pressurizes a region 66E in which contacts 72E are located. Advantageously, the integrity of the seal between compliant seal 58I and plating surface 60 of wafer 36 can be readily checked by shutting off the flow of pressurized gas and monitoring for any pressure loss. This is a significant advantage over the prior art, e.g. Brogden (cited above), wherein a poor sealing connection with the wafer will go undetected until plating solution leaks and contaminates the contacts, wafer edge and backside.

As shown in FIG. 21, when the clamshell is in the closed position, wafer push pins 294 are also fully retracted into cone 32I and press on backside 56 of wafer 36. After the clamshell is in the closed position, the entire assembly is then lowered into the plating solution. After processing, the entire assembly is raised from the plating solution and the procedure described above and illustrated in FIGS. 18–21 is reversed to unload wafer 36. Wafer push pins 294 prevent wafer 36 from sticking to cone 32I when the clamshell is opened. (Although wafer push pins 294 are spring loaded with springs 296, in another embodiment, wafer push pins 294 are air actuated and springs 296 are not provided. Of importance, self-contained clamshell and drive 100 is well suited for automation with a robotic arm for inserting and removing wafers.

Figure 22:
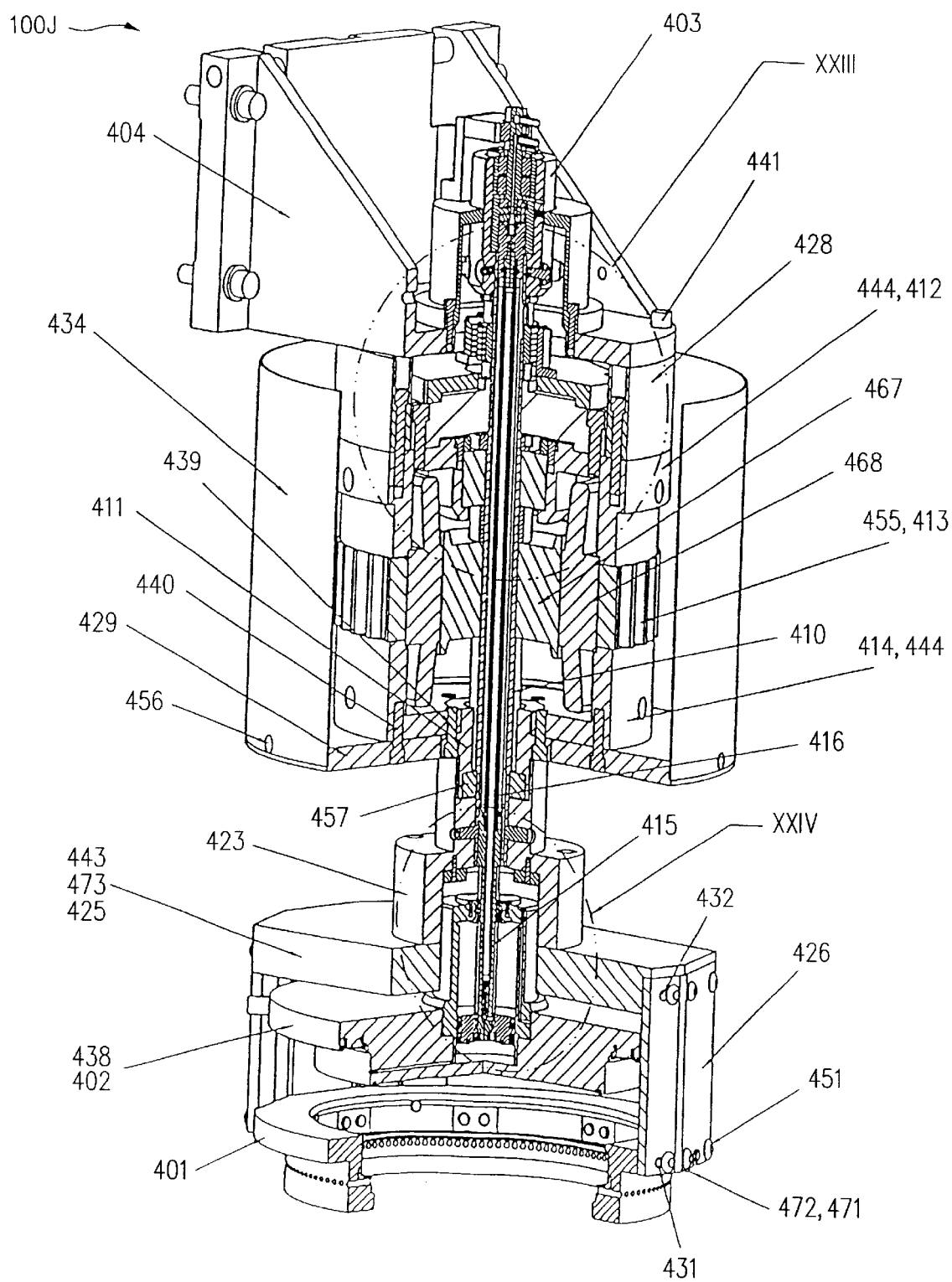
FIG. 22 is a perspective view, partially cutaway, of a clamshell and drive in accordance with another embodiment of the present invention.

FIG. 22 is a perspective view, partially cutaway, of a clamshell and drive 100J in accordance with another embodiment of the present invention. Illustrative specifications for the various characteristics shown in FIG. 22 are provided in Table 6 below.

TABLE 6

| CHARACTERISTIC | SPECIFICATION |
| --- | --- |
| 473 | Pin, Dowel, .250 OD, 1.25 LG |
| 472 | Conductor |
| 471 | Conductor |
| 468 | Stator, Motor |
| 467 | Rotor, Motor |
| 457 | Spindle Lower Bearing |
| 456 | Screw, Under Cut, Phil, #10-32X1/2, SS |
| 455 | Set Scr., Soc. 5/16"- 18 X 1/2 LG. |
| 451 | Screw, But, Hex, 1/4-20X1, T1 |
| 444 | Screw, Skt, Hex, 5/16-18X2-3/4, SS |
| 443 | Screw, Skt, Hex, 5/16-18X2-1/2,SS |
| 441 | Screw, Skt, Hex, 5/16-18X1-1/2, SS |
| 440 | Screw, Skt, Hex, 5/16-18X 1, SS |
| 439 | Screw, Skt, Hex, 5/16-18X3/4, SS |

TABLE 6-continued

| CHARACTERISTIC | SPECIFICATION |
|---|---|
| 438 | Screw, Skt, Hex, #10-32X1-1/4, SS |
| 434 | SC Drive Shield |
| 432 | Strut Upper Pin |
| 431 | Strut Lower Pin |
| 429 | Plate, CS Drive Shield |
| 428 | Motor Mount Ring |
| 426 | Strut |
| 425 | Top Plate, SC Clamshell |
| 423 | Head Mount |
| 416 | Outer Coaxial Tube |
| 415 | Inner Coaxial Tube |
| 414 | Motor Bottom Mount |
| 413 | Motor Stator Ring |
| 412 | Motor Top Mount |
| 411 | Spindle Bearing Mount |
| 410 | Spindle |
| 404 | Assy, Mounting Bracket |
| 403 | Assy, Rotary Union |
| 402 | Assy, Clamshell Cone |
| 401 | Assy, Clamshell Cup |

Figure 23:
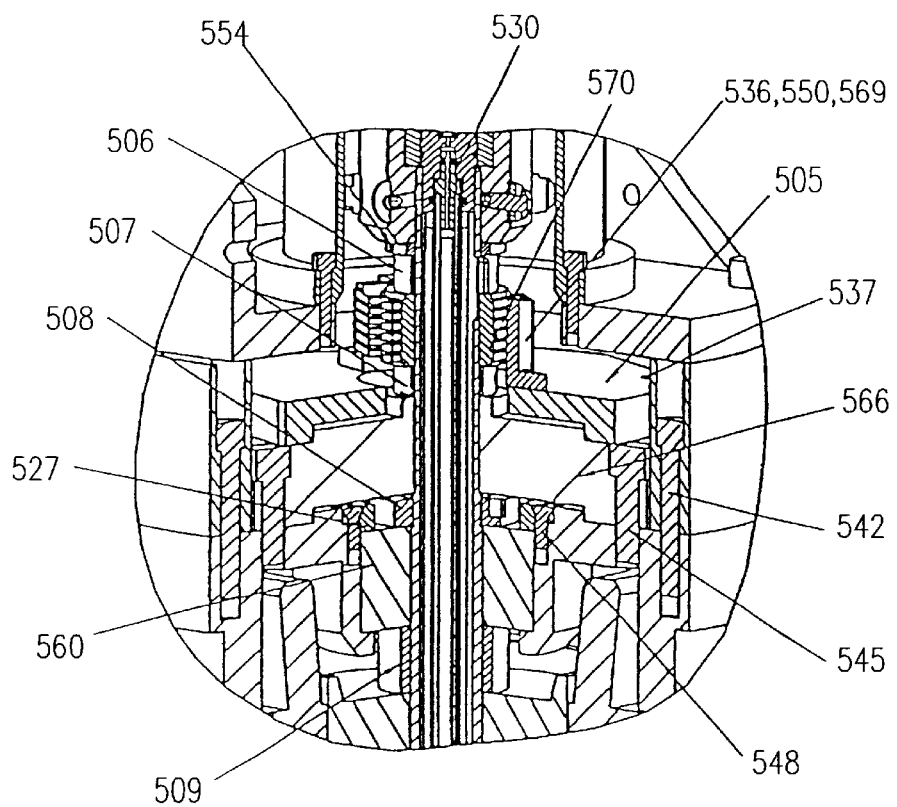
FIG. 23 is a perspective view, partially cutaway, of a region XXIII of FIG. 22.

FIG. 23 is a perspective view, partially cutaway, of a region XXIII of FIG. 22 in accordance with this embodiment of the present invention. Illustrative specifications for the various characteristics shown in FIG. 23 are provided in Table 7 below.

TABLE 7

| CHARACTERISTIC | SPECIFICATION |
|---|---|
| 570 | Slip Ring Core |
| 569 | Slip Ring Brush |
| 566 | Motor Encoder |
| 560 | Spindle Upper Bearing |
| 554 | Set Screw, Soc. #4-40 X 1/8 LG. |
| 550 | Washer, Flat, #4, SST |
| 548 | Screw, Flat, Hex #10-24X1/2, SS |
| 545 | Screw, Skt, Hex, 3/8-16X1, SS |
| 542 | Screw, Skt, Hex, 5/16-18X1-3/4, SS |
| 537 | Screw, Skt, Hex, #10-24X3/4, SS |
| 536 | Screw, Skt, Hex, #4-40X1/2, SS |
| 530 | Inner Coaxial Tube Top Insert |
| 527 | Motor Top Bearing Keeper |
| 509 | Spindle Spacer |
| 508 | Spindle Lock Nut |
| 507 | Slip Ring Spacer |
| 506 | Slip Ring Sleeve |
| 505 | Slip Ring Mount |

Figure 24:
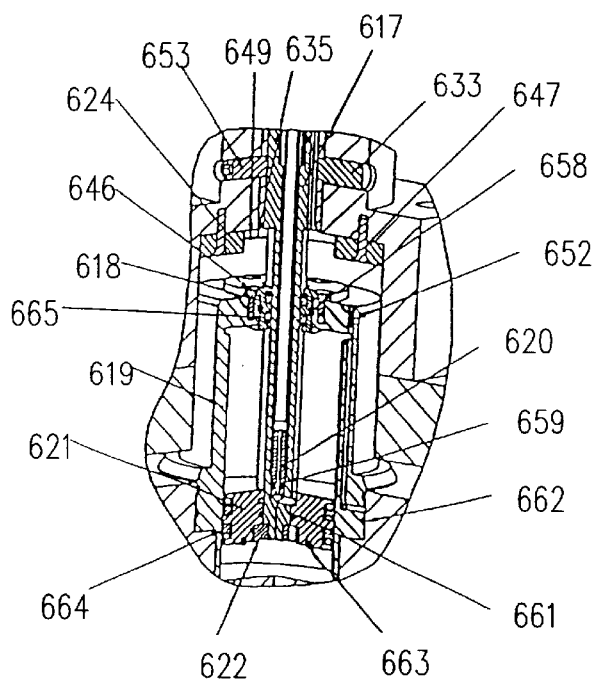
FIG. 24 is a perspective view, partially cutaway, of a region XXIV of FIG. 22.

FIG. 24 is a perspective view, partially cutaway, of a region XXIV of FIG. 22 in accordance with this embodiment of the present invention. Illustrative specifications for the various characteristics shown in FIG. 24 are provided in Table 8 below.

TABLE 8

| CHARACTERISTIC | SPECIFICATION |
|---|---|
| 665 | Cup Seal, Shaft |
| 664 | Cup Seal, Piston |
| 663 | O-Ring, 1.049ID X .103W, VITON |
| 662 | O-Ring, 2.864ID X .07W, VITON |
| 661 | O-Ring, .489ID X .070W, VITON |
| 659 | O-Ring, .113ID X .070W, VITON |
| 658 | O-Ring, .864ID X .070W, VITON |
| 653 | Set Scr, Soc. 1/4"-28 X 3/4 LG. |
| 652 | Set Screw, Soc. #4-40 X 1/4 LG. |
| 649 | Screw, Pan, Phil, #4#40X1/4, SS |
| 647 | Screw, Flat, Hex, #6-32X1/2, SS |

TABLE 8-continued

| CHARACTERISTIC | SPECIFICATION |
|---|---|
| 646 | Screw, Flat, Hex, #4-40X1/4, SS |
| 635 | Cone Up Contact |
| 633 | Hub Lock Screw |
| 624 | Conductor Guard |
| 622 | Piston Mount Nut |
| 621 | PH Piston |
| 620 | Inner Coaxial Tube Lower Insert |
| 619 | Cone Drive Cylinder |
| 618 | Cylinder Shaft Seal Mount |
| 617 | Spindle Low Mount/CYL Shaft |

Figure 25:
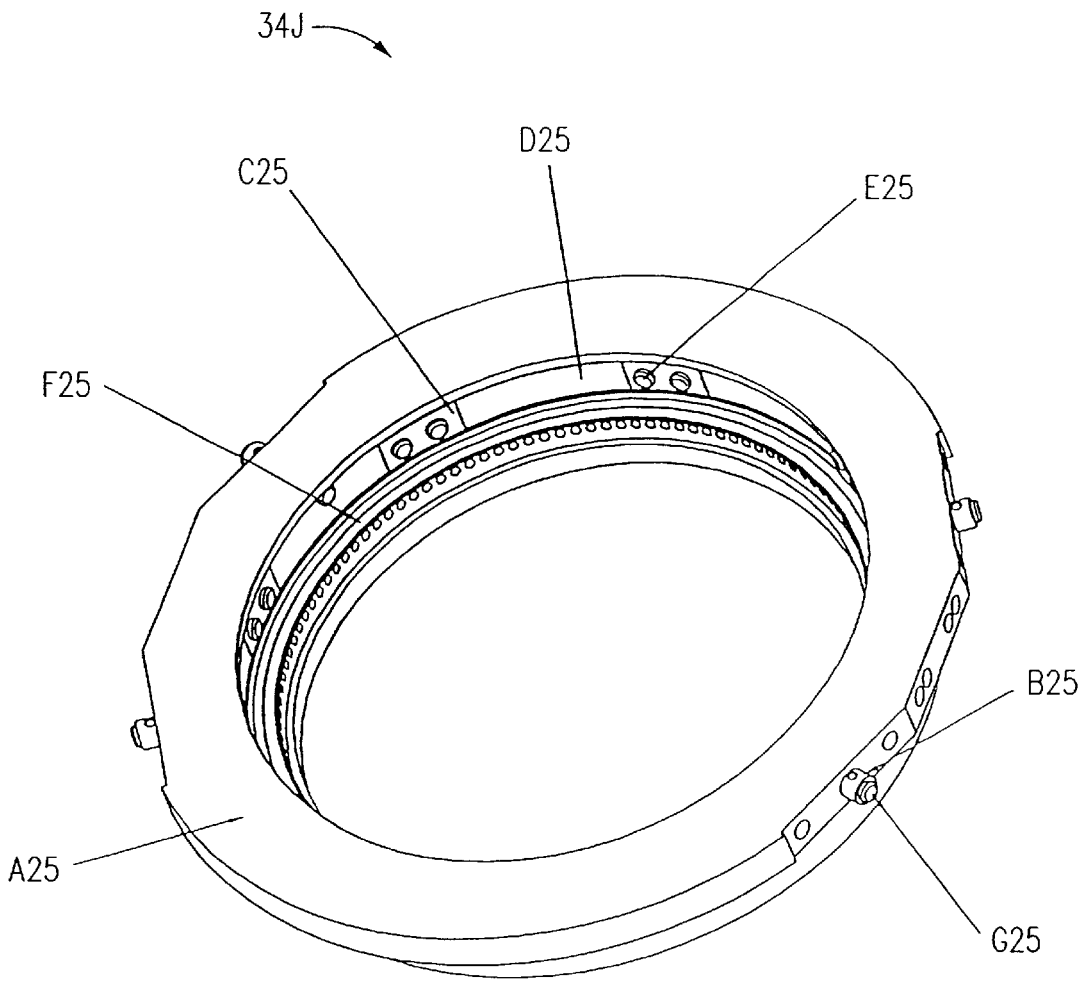
FIG. 25 is a perspective view of a cup in accordance with this embodiment of the present invention.

FIG. 25 is a perspective view of cup 34J in accordance with this embodiment of the present invention. Illustrative specifications for the various characteristics shown in FIG. 25 are provided in Table 9 below.

TABLE 9

| CHARACTERISTIC | SPECIFICATION |
|---|---|
| F25 | Wafer Seal |
| G25 | Screw, Pan, Phil, #6-32X1/4, T1 |
| E25 | Screw, Pan, Phil, #6-32X1/4, SS |
| D25 | Wafer Contact |
| C25 | Wafer Snubber |
| B25 | Elect Feed Thru |
| A25 | Flange Cup, SC Clamshell |

Note that item B25 of FIG. 25, the electrical feedthrough, is typically wrapped in an electrically insulating material such as insulating tape to electrically isolate the feedthrough from the plating solution. Further, the contact and snubber detail is not shown in FIG. 25.

Figure 26:
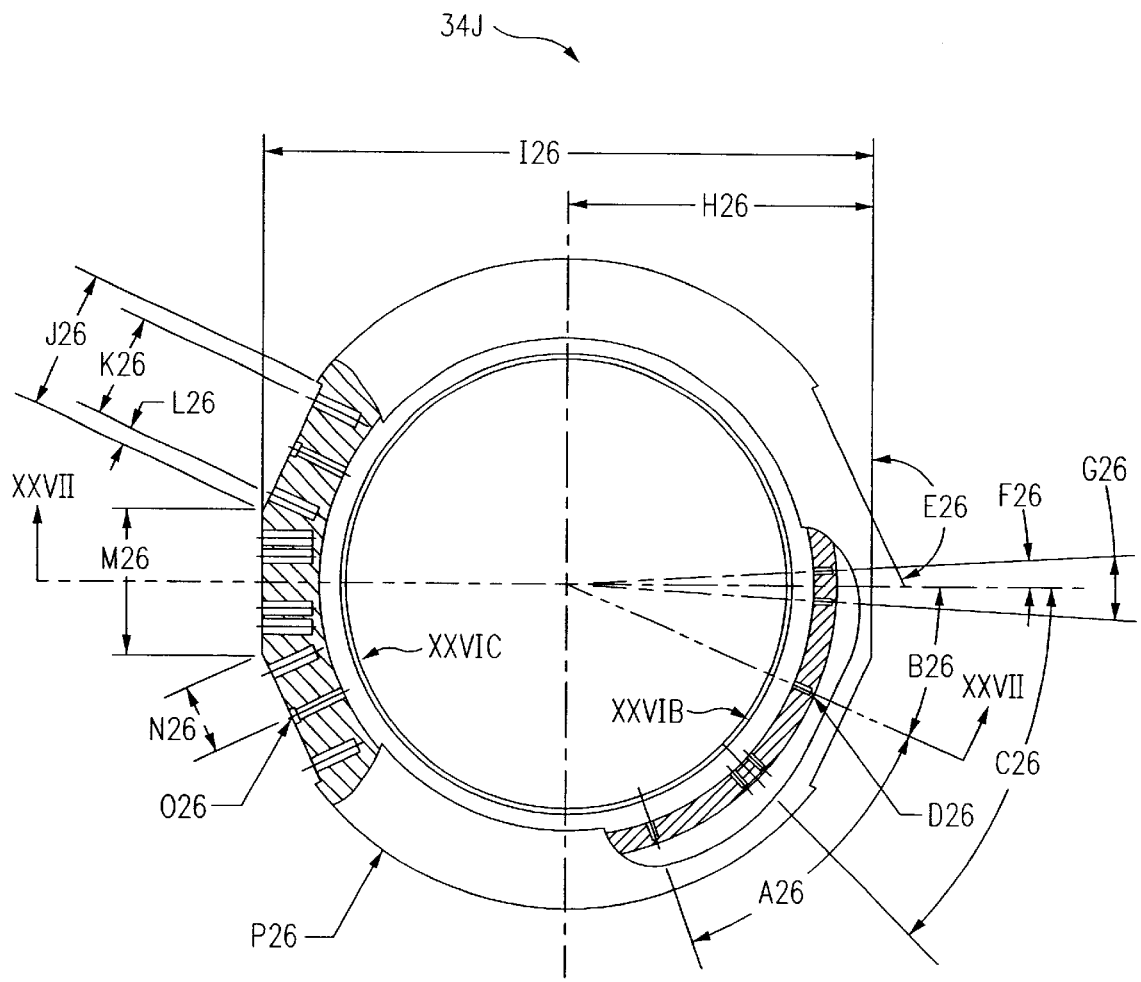
FIG. 26 is a top plan view, partially cutaway, of the cup of FIG. 25.

FIG. 26 is a top plan view, partially cutaway, of cup 34J in accordance with this embodiment of the present invention. Illustrative specifications for the various characteristics shown in FIG. 26 are provided in Table 10 below.

TABLE 10

| CHARACTERISTIC | SPECIFICATION |
|---|---|
| P26 | Ø 10.550 In. |
| O26 | 4X Ø .1875 thru (ream) Ø .235 ± .002 ↓ .080 |
| N26 | 4X 1.116 In. |
| M26 | 2X 2.249 In. |
| L26 | 4X .380 In. |
| K26 | 4X 1.625 In. |
| J26 | 2.306 ± .003 In. |
| I26 | 10.140 ± .002 In. |
| H26 | 5.070 ± .002 In. |
| G26 | 8X 7.0° |
| F26 | 3.5° |
| E26 | 4X 155.0° |
| D26 | 24X Drill Ø .104 ↓ .30 (.340 MAX DP. AT DP BOTTOM TAP 6-32UNC) |
| C26 | 8X 45.0° |
| B26 | 22.5° |
| A26 | 8X 45.0° |

Figure 27:
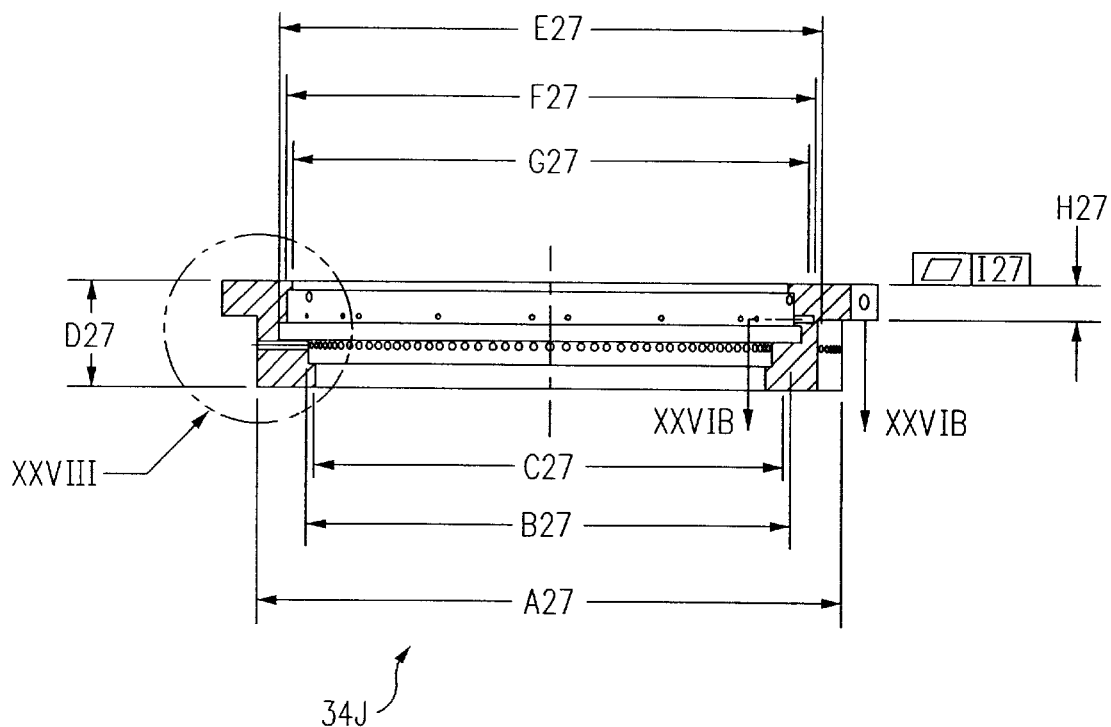
FIG. 27 is a cross-sectional view of the cup along the line XXVII—XXVII of FIG. 26.

FIG. 27 is a cross-sectional view of cup 34J along the line XXVII—XXVII of FIG. 26 in accordance with this embodiment of the present invention. Illustrative specifications for the various characteristics shown in FIG. 27 are provided in Table 11 below. Note the cutaway section XXVIB—XXVIB of FIG. 27 is illustrated in FIG. 26

TABLE 11

| CHARACTERISTIC | SPECIFICATION |
|---|---|
| I27 | .003 In. |
| H27 | 24 X .521 In. |
| G27 | Ø 8.069 ± .001 In. |
| F27 | Ø 8.280 In. |
| E27 | Ø 8.480 In. |
| D27 | 1.611 In. |
| C27 | Ø 7.330 In. |
| B27 | Ø 7.530 In. |
| A27 | Ø 9.080 In. |

Figure 28:
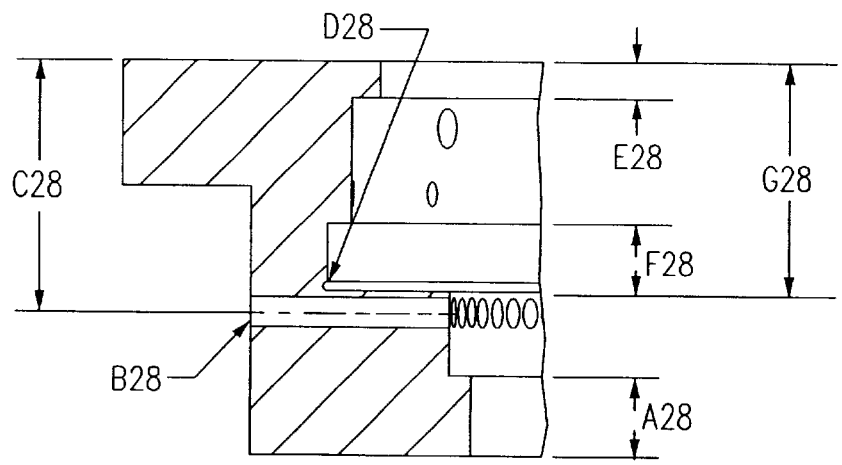
FIG. 28 is an enlarged cross-sectional view of a region XXVIII of FIG. 27.

FIG. 28 is an enlarged cross-sectional view of a region XXVIII of FIG. 27 in accordance with this embodiment of the present invention. Illustrative specifications for the various characteristics shown in FIG. 28 are provided in Table 12 below.

TABLE 12

| CHARACTERISTIC | SPECIFICATION |
|---|---|
| G28 | .921 ± .002 In. |
| F28 | .275 In. |
| E28 | .150 In. |
| D28 | R .020, .020 DP. |
| C28 | 1.005 In. |
| B28 | 120X Ø .125 3.0° Apart, Thru |
| A28 | .353 In. |

Figure 29:
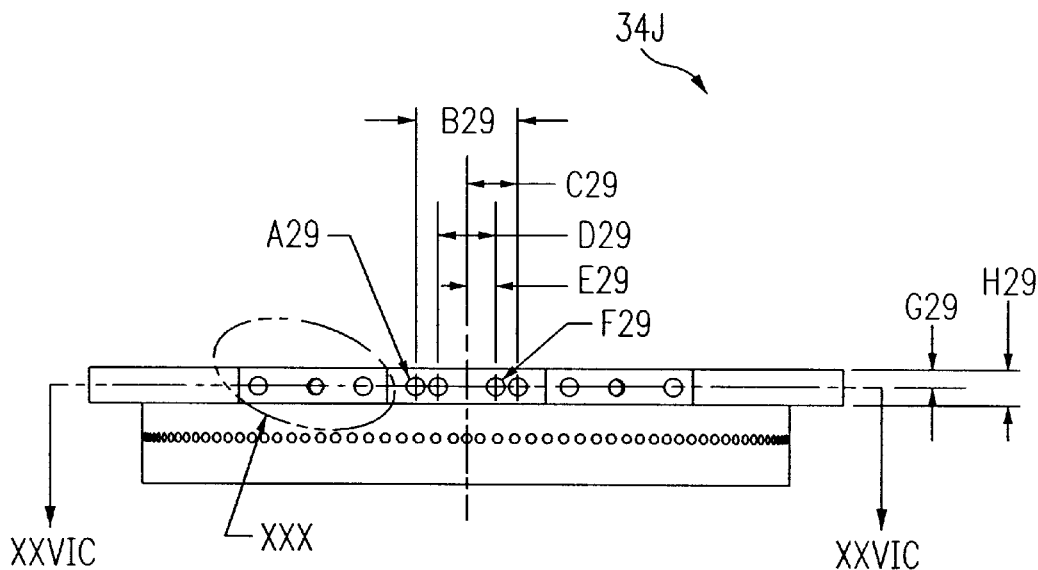
FIG. 29 is a side-plan view of the cup of FIG. 25.

FIG. 29 is a side-plan view of cup 34J in accordance with this embodiment of the present invention. Illustrative specifications for the various characteristics shown in FIG. 29 are provided in Table 13 below. Note the cutaway section XXVIC—XXVIC of FIG. 29 is illustrated in FIG. 26

TABLE 13

| CHARACTERISTIC | SPECIFICATION |
|---|---|
| H29 | .500 In. |
| G29 | .250 In. |
| F29 | 4X Ø .2510 (REAM) ↓ .75 |
| E29 | .450 ± .001 In. |
| D29 | .900 ± .001 In. |
| C29 | .750 In. |
| B29 | 1.500 In. |
| A29 | 12X 1/4-2ounc thrd ↓ .780 (bottom tap) |

Figure 30:
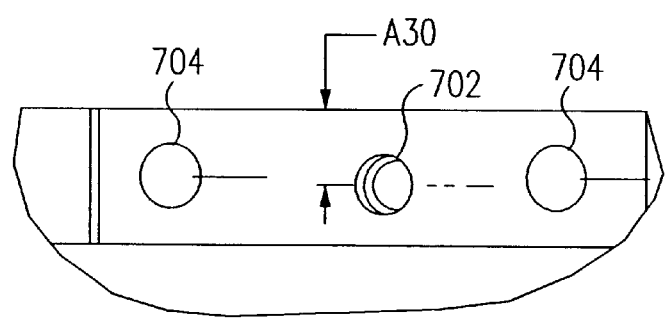
FIG. 30 is an enlarged side-plan view of a region XXX of FIG. 29.

FIG. 30 is an enlarged side-plan view of a region XXX of FIG. 29 in accordance with this embodiment of the present invention. Illustrative specifications for the various characteristics shown in FIG. 30 are provided in Table 14 below.

TABLE 14

| CHARACTERISTIC | SPECIFICATION |
|---|---|
| A30 | 4X .280 In. |
| 702 | Electrical feed through to contacts |
| 704 | Strut mounting holes |

Figure 31:
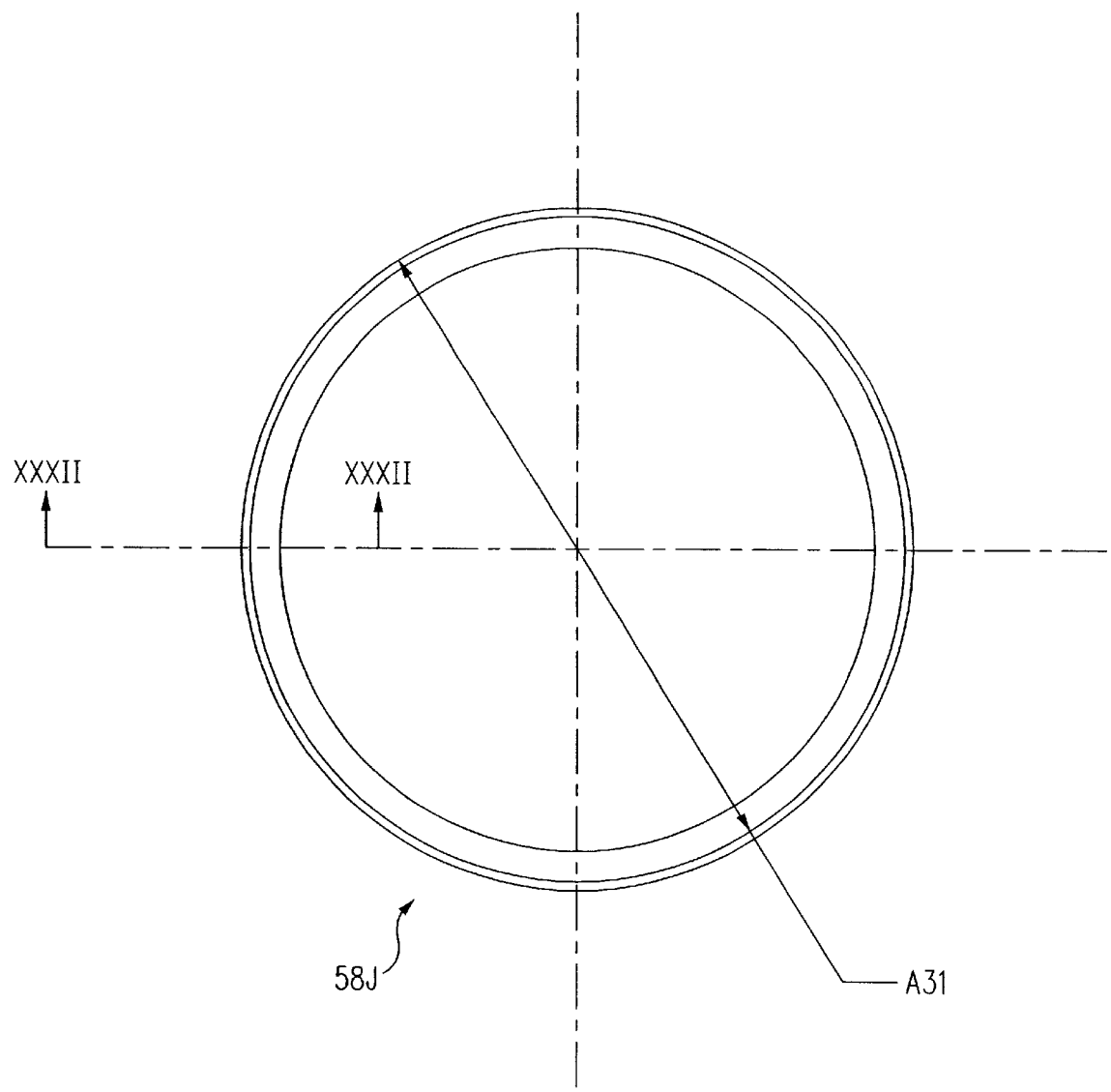
FIG. 31 is a top plan view of a compliant seal in accordance with this embodiment of the present invention.

FIG. 31 is a top plan view of a compliant seal 58J in accordance with this embodiment of the present invention. Illustrative specifications for the various characteristics shown in FIG. 31 are provided in Table 15 below.

TABLE 15

| CHARACTERISTIC | SPECIFICATION |
|---|---|
| A31 | Ø 8.48 Ref. |

Figure 32:
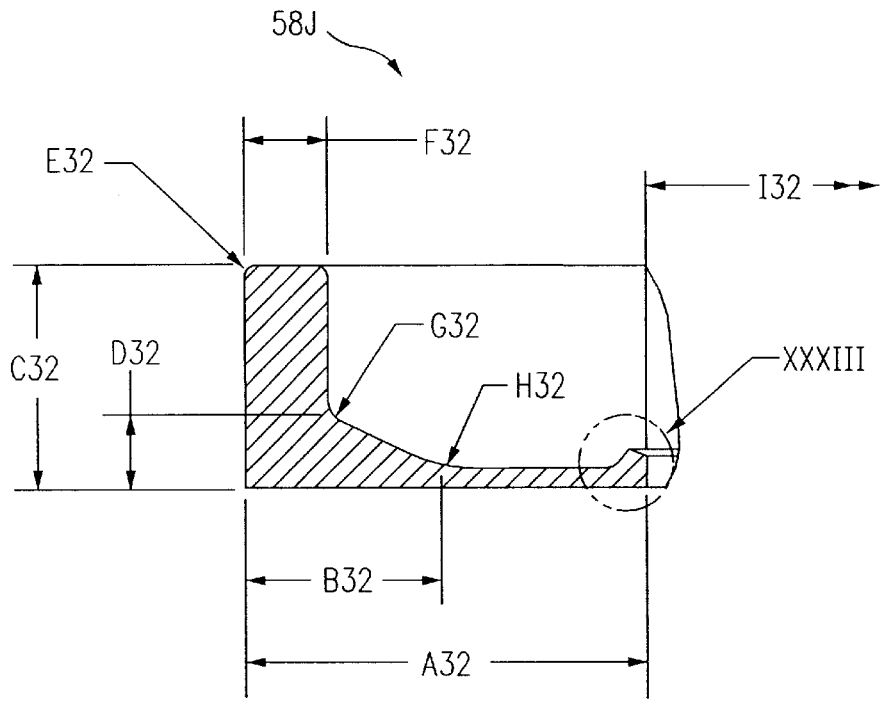
FIG. 32 is a cross-sectional view of the compliant seal along the line XXXII—XXXII of FIG. 31.

FIG. 32 is a cross-sectional view of compliant seal 58J along the line XXXII—XXXII of FIG. 31 in accordance with this embodiment of the present invention. Illustrative specifications for the various characteristics shown in FIG. 32 are provided in Table 16 below.

TABLE 16

| CHARACTERISTIC | SPECIFICATION |
|---|---|
| I32 | Ø7.53 In. |
| H32 | R.250 In. |
| G32 | R.031 In. |
| F32 | .100 In. |
| E32 | 2X R.015 In. |
| D32 | .091 In. |
| C32 | .275 In. |
| B32 | .230 In. |
| A32 | .475 In. |

Figure 33:
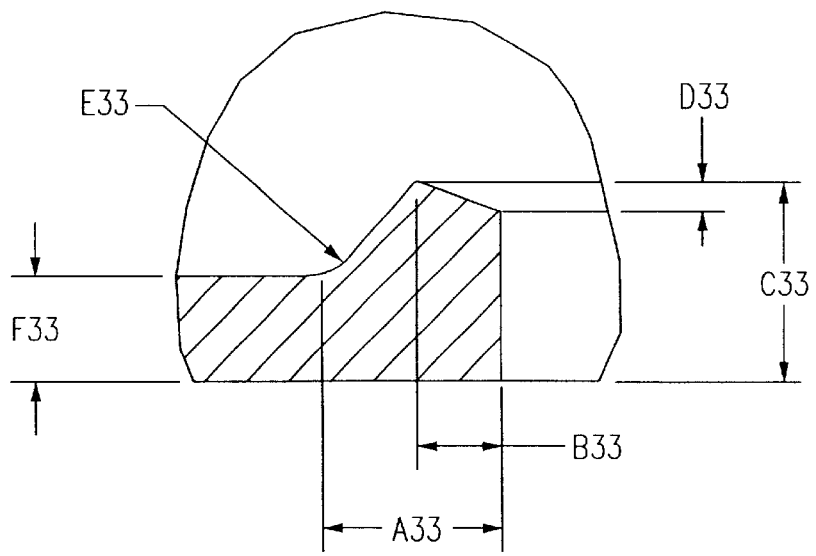
FIG. 33 is an enlarged cross-sectional view of a region XXXIII of FIG. 32.

FIG. 33 is an enlarged cross-sectional view of a region XXXIII of FIG. 32 in accordance with this embodiment of the present invention. Illustrative specifications for the various characteristics shown in FIG. 33 are provided in Table 17 below.

TABLE 17

| CHARACTERISTIC | SPECIFICATION |
|---|---|
| F33 | .025 In. |
| E33 | R.010 In. |
| D33 | .007 In. |
| C33 | .047 In. |
| B33 | .020 In. |
| A33 | .040 In. |

Figure 34:
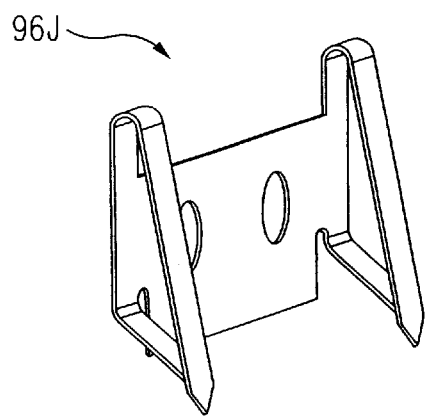
FIGS. 34 and 35 are perspective and front plan views, respectively, of a snubber in accordance with this embodiment of the present invention.
Figure 35:
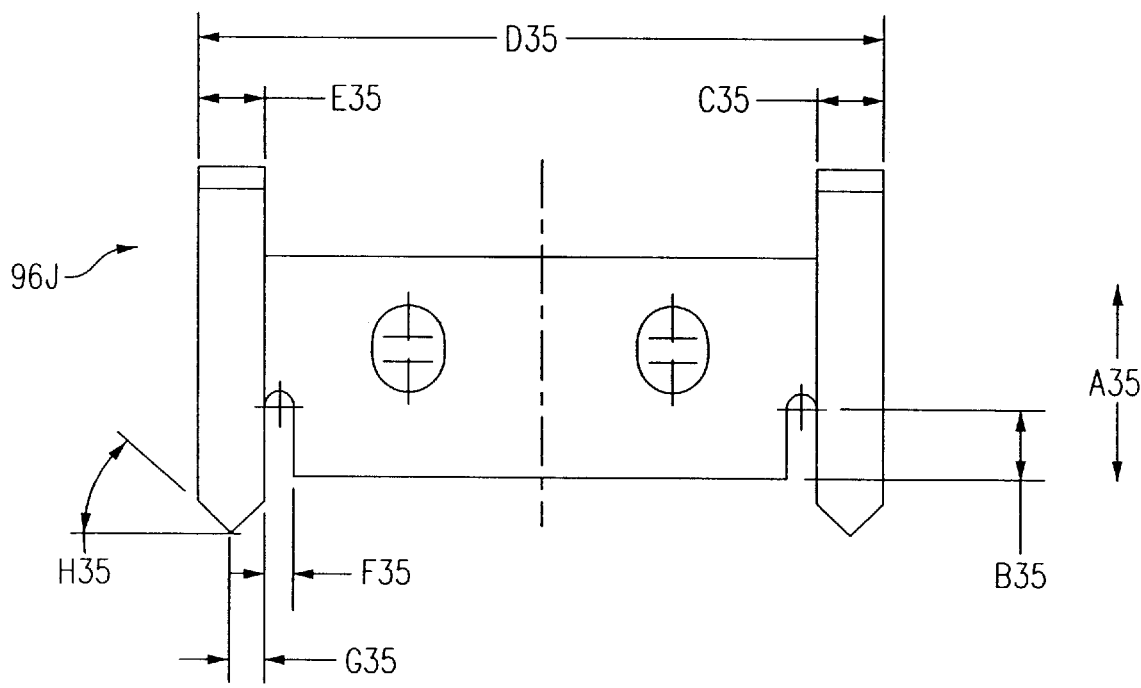

FIGS. 34 and 35 are perspective and front plan views, respectively, of a snubber 96J in accordance with this embodiment of the present invention. Illustrative specifications for the various characteristics shown in FIG. 35 are provided in Table 18 below.

TABLE 18

| CHARACTERISTIC | SPECIFICATION |
|---|---|
| H35 | 4X 45°.0° |
| G35 | 2X .063 In. |
| F35 | 2X .060 In. |
| E35 | .125 In. |
| D35 | 1.325 In. |
| C35 | .125 In. |
| B35 | 2X .140 In. |
| A35 | Grain |

Figure 36:
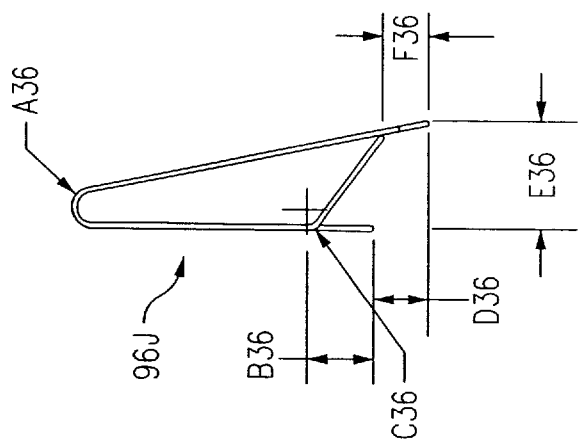
FIG. 36 is a side plan view of the snubber of FIG. 34.

FIG. 36 is a side plan view of snubber 96J in accordance with this embodiment of the present invention. Illustrative specifications for the various characteristics shown in FIG. 36 are provided in Table 19 below.

TABLE 19

| CHARACTERISTIC | SPECIFICATION |
| --- | --- |
| F36 | .10 In. |
| E36 | 2X .215 In. |
| D36 | 2X .109 In. |
| C36 | 2X R.035 In. |
| B36 | 2X .140 In. |
| A36 | R.040 In. |

Figure 37:
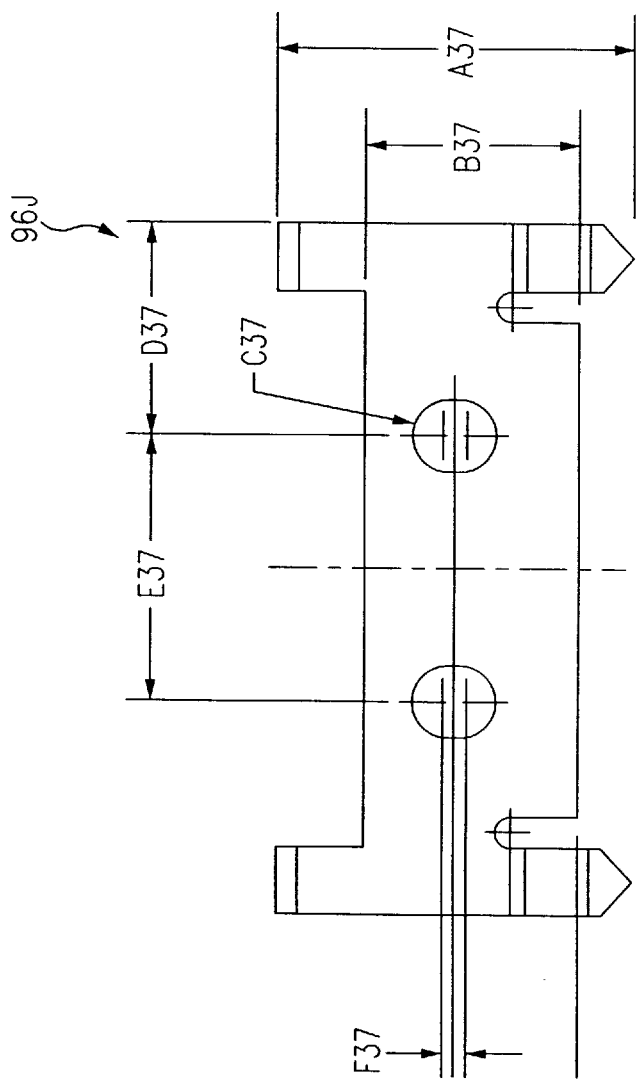
FIG. 37 is a rear plan view of the snubber of FIG. 34.

FIG. 37 is a rear plan view of snubber 96J in accordance with this embodiment of the present invention. Illustrative specifications for the various characteristics shown in FIG. 37 are provided in Table 20 below.

TABLE 20

| CHARACTERISTIC | SPECIFICATION |
| --- | --- |
| F37 | .035 In. |
| E37 | .506 In. |
| D37 | .410 In. |
| C37 | 4X R.070 In. |
| B37 | .440 In. |
| A37 | .730 In. |

Figure 38:
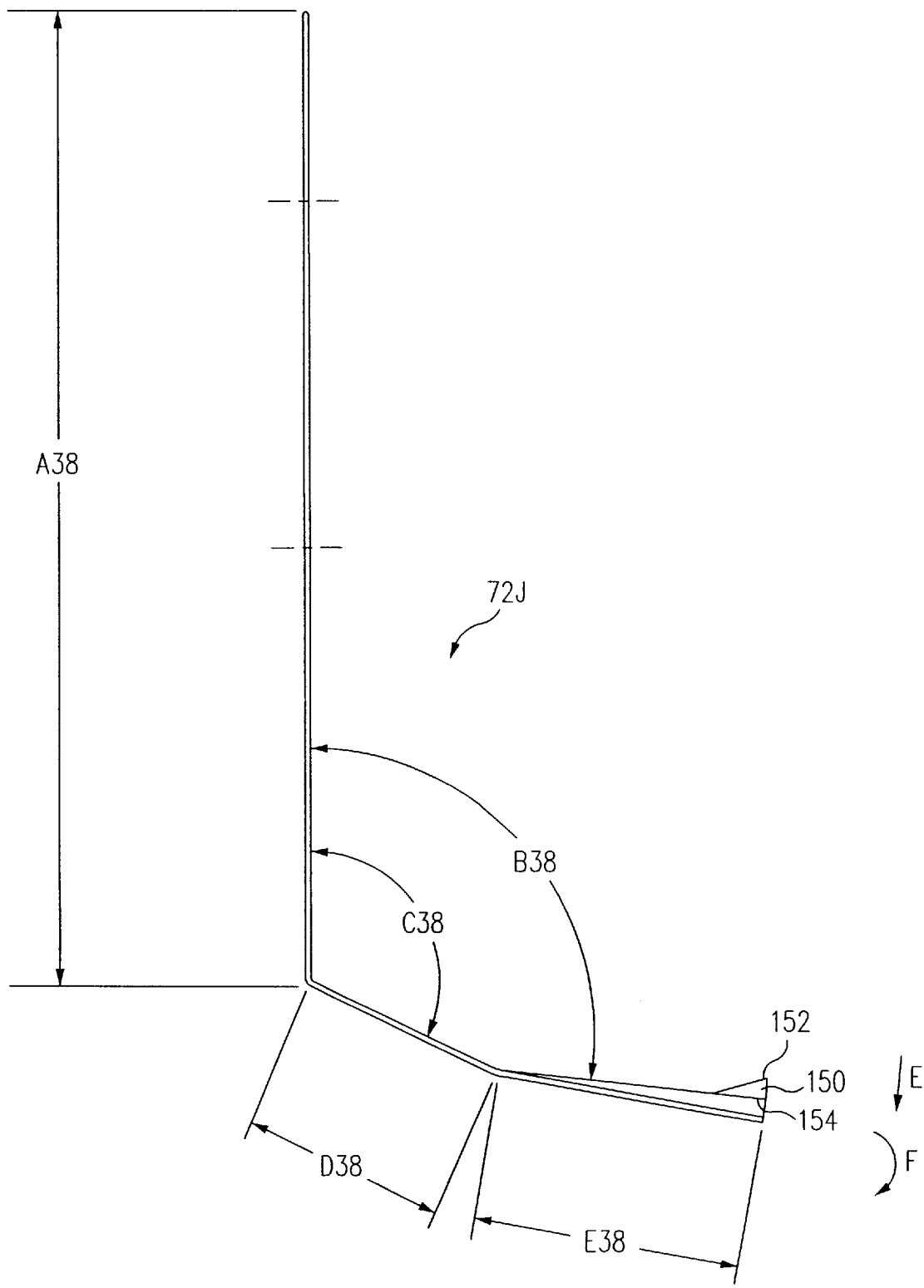
FIG. 38 is a side plan view of a torsionally bent contact in accordance with this embodiment of the present invention.

FIG. 38 is a side plan view of a torsionally bent contact 72J in accordance with this embodiment of the present invention. Contact 72J is torsionally bent and includes a tip 150. Tip 150 has an apex 152 which projects upward and a base 154 which projects downward (relative to the plane of the inner perimeter of the central aperture of the cup which is not shown in FIG. 38). Thus, when a wafer is pressed down on contact 72J and more particularly on tip 150, tip 150 is bent downward (arrow E) and the end of tip 150 is simultaneously rotated (arrow F). This causes apex 152 to be scraped along the plating surface of the wafer thus enhancing and improving the reliability of the electrical connection between contact 72J and the plating surface of the wafer. Illustrative specifications for the various characteristics shown in FIG. 38 are provided in Table 21 below.

TABLE 21

| CHARACTERISTIC | SPECIFICATION |
| --- | --- |
| E38 | .190 In. |
| D38 | .150 In. |
| C38 | 115° |
| B38 | 100° |
| A38 | .675 In. |

Figure 39:
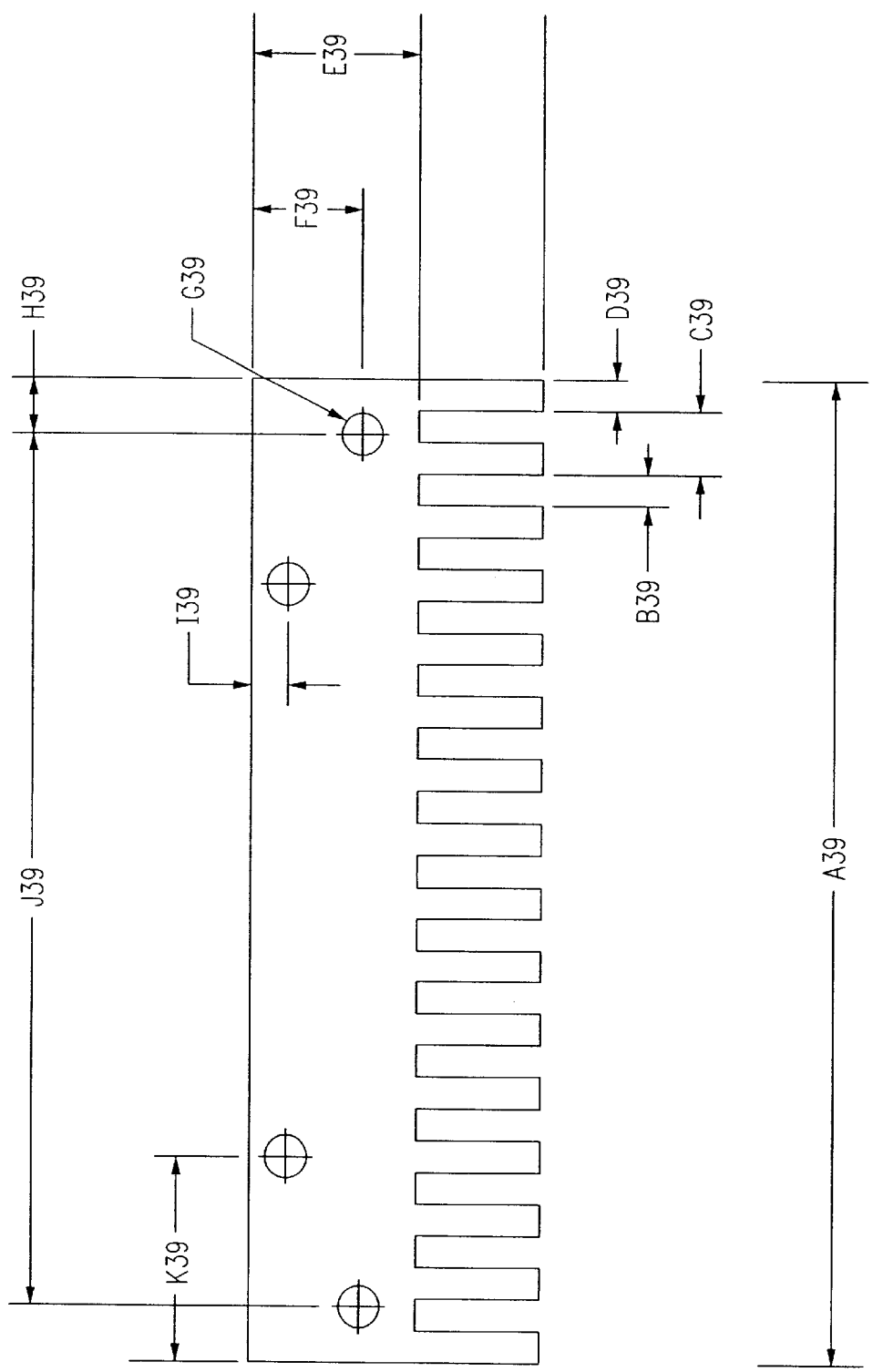
FIG. 39 is a top plan view of a contact strip in accordance with this embodiment of the present invention.

FIG. 39 is a top plan view of contact strip in accordance with this embodiment of the present invention. Illustrative specifications for the various characteristics shown in FIG. 39 are provided in Table 22 below.

TABLE 22

| CHARACTERISTIC | SPECIFICATION |
| --- | --- |
| K39 | 2X .657 In. |
| J39 | 2.746 In. |
| I39 | 2X .130 In. |
| H39 | .177 In. |
| G39 | 4X Ø .144 In. |
| F39 | 2X .370 In. |
| E39 | .570 In. |
| D39 | .100 In. |

TABLE 22-continued

| CHARACTERISTIC | SPECIFICATION |
| --- | --- |
| C39 | 14X .200 In. |
| B39 | 15X .100 In. |
| A39 | 3.10 In. |

FIGS. 40A and 40B are front perspective views of a contact 72J at various stages during fabrication from the contact strip of FIG. 39 in accordance with this embodiment of the present invention. As shown in FIG. 40A, initially tip 150 is bent. After tip 150 is bent, then the entire contact is torsionally bent as illustrated in FIG. 40B. Illustrative specifications for the various characteristics shown in FIGS. 40A, 40B are provided in Table 23 below.

TABLE 23

| CHARACTERISTIC | SPECIFICATION |
| --- | --- |
| D40 | Twist 10° |
| C40 | 0.040 In. |
| B40 | 45° |
| A40 | .020 In. |

FIG. 41 is a top perspective view of a cone 32J in accordance with this embodiment of the present invention. Illustrative specifications for the various characteristics shown in FIG. 41 are provided in Table 24 below.

TABLE 24

| CHARACTERISTIC | SPECIFICATION |
| --- | --- |
| D41 | Screw, Flat, Hex, #4-40X1/4, SS |
| C41 | Screw, Skt, Hex, #6-32X3/4, SS |
| B41 | Anti-Rotate Dog |
| A41 | Cone, SC Clamshell |

Figure 42:
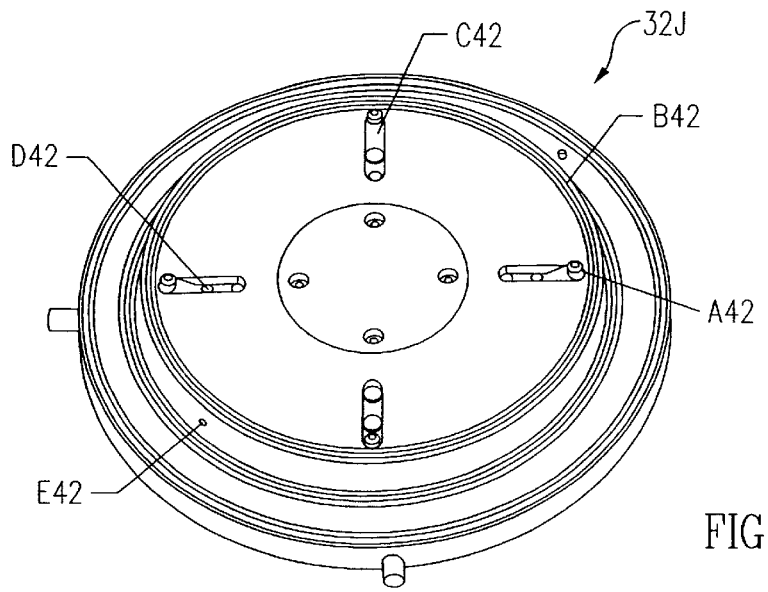
FIG. 42 is a bottom perspective view of the cone of FIG. 41.

FIG. 42 is a bottom perspective view of cone 32J in accordance with this embodiment of the present invention. Illustrative specifications for the various characteristics shown in FIG. 42 are provided in Table 25 below.

TABLE 25

| CHARACTERISTIC | SPECIFICATION |
| --- | --- |
| E42 | Set Screw, Soc. #4–40 X 1/4 LG. |
| D42 | Screw, Pan, Phil, #6-32X1/4, SS |
| C42 | Wafer Push Leaf Spring |
| B42 | Wafer Backing O-ring |
| A42 | Wafer Push Pin |

Figure 43:
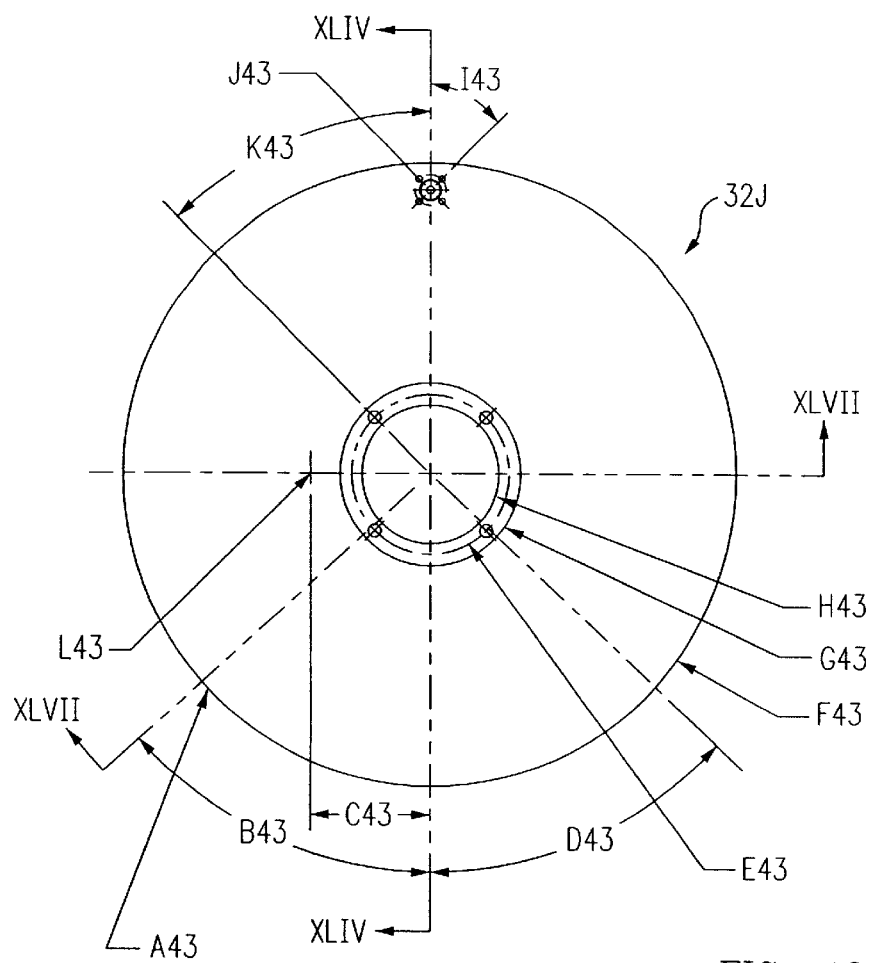
FIG. 43 is a top plan view of the cone of FIG. 41.

FIG. 43 is a top plan view of cone 32J in accordance with this embodiment of the present invention. Illustrative specifications for the various characteristics shown in FIG. 43 are provided in Table 26 below.

TABLE 26

| CHARACTERISTIC | SPECIFICATION |
| --- | --- |
| L43 | Ø .031 Thru |
| K43 | 4X 45.0° |
| J43 | 4X 4–40 THRD ↓ .250 on a Ø .600 B.C. 90° Apart |
| I43 | 45.0° |

TABLE 26-continued

| CHARACTERISTIC | SPECIFICATION |
|---|---|
| H43 | Ø2.188 + .002 − .000 |
| G43 | Ø3.001 + .001 −.000 |
| F43 | Ø10.040 In. |
| E43 | Ø2.500 ± .002 In. |
| D43 | 48.0° |
| C43 | 2.00 In. |
| B43 | 48.0° |
| A43 | 2X 6–32 THRD ↓ .60Ø.375↓ .015 |

Figure 44:
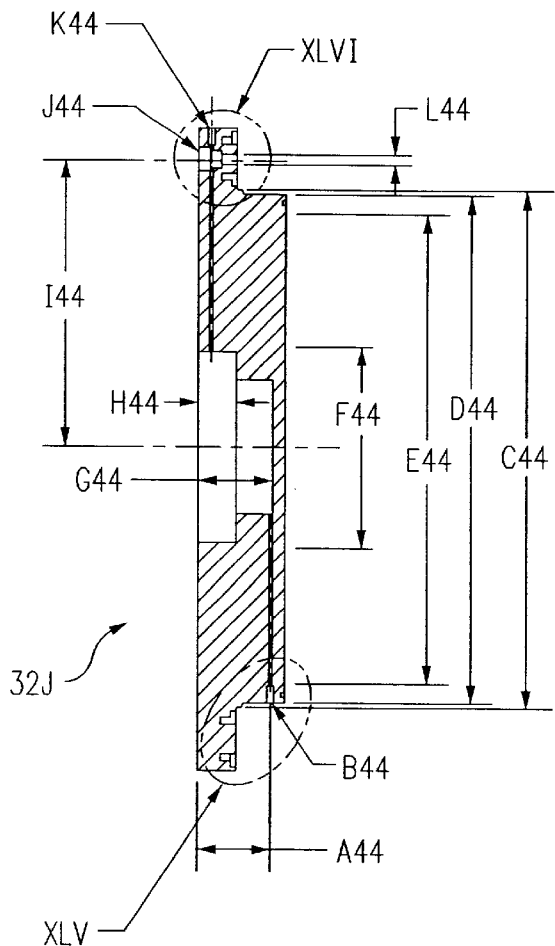
FIG. 44 is a cross-sectional view of the cone along the line XLIV—XLIV of FIG. 43.

FIG. 44 is a cross-sectional view of cone 32J along the line XLIV—XLIV of FIG. 43 in accordance with this embodiment of the present invention. Illustrative specifications for the various characteristics shown in FIG. 44 are provided in Table 27 below.

TABLE 27

| CHARACTERISTIC | SPECIFICATION |
|---|---|
| L44 | Ø .157 + 001 − .000 |
| K44 | Ø.062 thru C'drill Ø.070 ↓ .320 2–56Unc thrd ↓ .250(bottom tap) |
| J44 | Ø .312↓ .345 Ø.376↓ .170(Ream) |
| I44 | 4.525 In. |
| H44 | .580 + .000 − .005 |
| G44 | 1.180 + .005 − .000 |
| F44 | Ø 3.200 In. |
| E44 | Ø7.300 In. |
| D44 | Ø7.875 In. |
| C44 | Ø8.060 ± .001 |
| B44 | Ø .062 thru drill and tap for 4–40↓ .25 |
| A44 | 1.144 In. |

Figure 45:
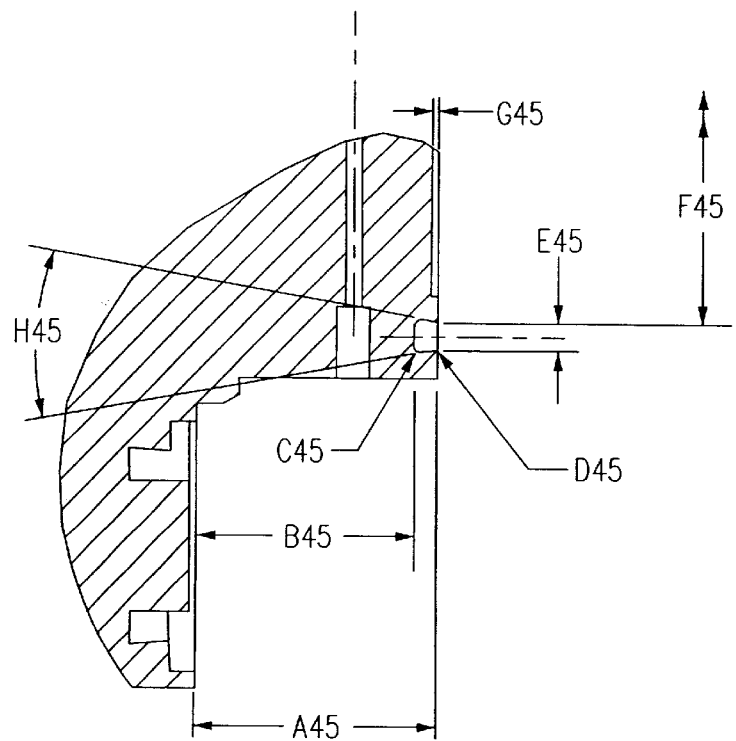
FIG. 45 is an enlarged cross-sectional view of a region XLV of FIG. 44.

FIG. 45 is an enlarged cross-sectional view of a region XLV of FIG. 44 in accordance with this embodiment of the present invention. Illustrative specifications for the various characteristics shown in FIG. 45 are provided in Table 28 below.

TABLE 28

| CHARACTERISTIC | SPECIFICATION |
|---|---|
| H45 | 20.0° |
| G45 | .020 In. |
| F45 | Ø7.475 In. |
| E45 | .097 ± .001 In. |
| D45 | 2X R.005 ± .002 In. |
| C45 | 2X R.020 In. |
| B45 | .767 ± .003 In. |
| A45 | .845 Ref |

Figure 46:
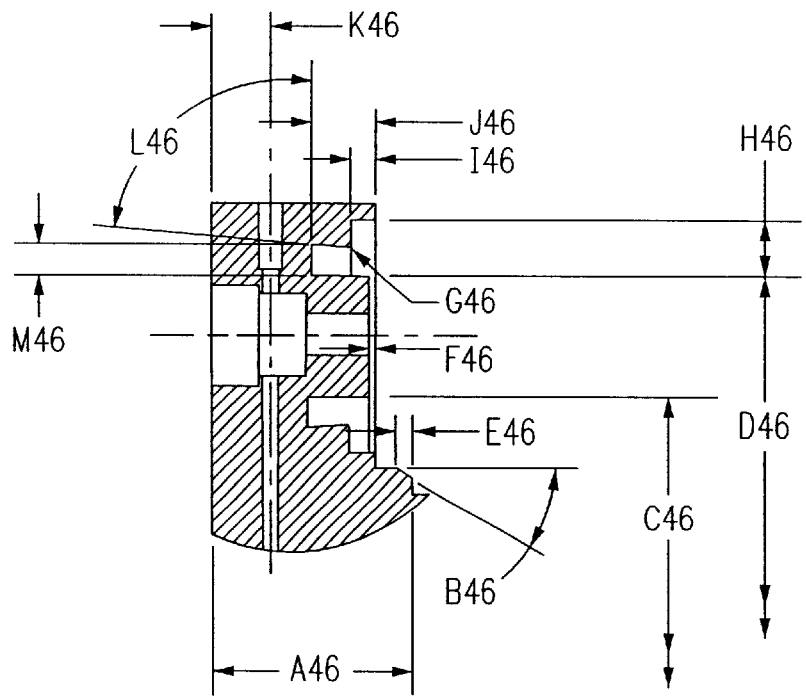
FIG. 46 is an enlarged cross-sectional view of a region XLVI of FIG. 44.

FIG. 46 is an enlarged cross-sectional view of a region XLVI of FIG. 44 in accordance with this embodiment of the present invention. Illustrative specifications for the various characteristics shown in FIG. 46 are provided in Table 29 below.

TABLE 29

| CHARACTERISTIC | SPECIFICATION |
|---|---|
| M46 | 2X .116 In. |
| L46 | 2X 85.0° |

TABLE 29-continued

| CHARACTERISTIC | SPECIFICATION |
|---|---|
| K46 | .212 In. |
| J46 | 2X .240 In. |
| I46 | 2X .090 In. |
| H46 | 2X .210 In. |
| G46 | 2X R.015 In. |
| F46 | .020 In. |
| E46 | .060 In. |
| D46 | Ø 9.500 In. |
| C46 | Ø 8.600 In. |
| B46 | 30.0° |
| A46 | .745 In. |

Figure 47:
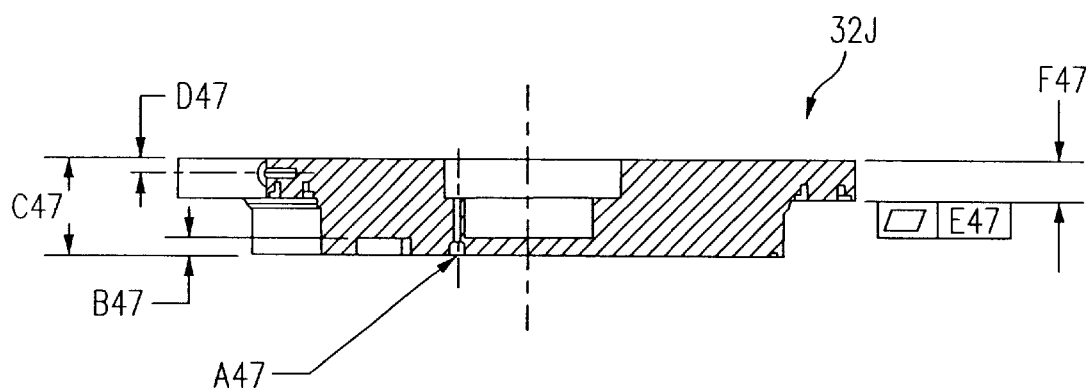
FIG. 47 is a cross-sectional view of the cone along the line XLVII—XLVII of FIG. 43.

FIG. 47 is a cross-sectional view of cone 32J along the line XLVII—XLVII of FIG. 43 in accordance with this embodiment of the present invention. Illustrative specifications for the various characteristics shown in FIG. 47 are provided in Table 30 below.

TABLE 30

| CHARACTERISTIC | SPECIFICATION |
|---|---|
| F47 | .595 In. |
| E47 | .003 In. |
| D47 | 2X .230 In. |
| C47 | 1.440 In. |
| B47 | 4X .225 In. |
| A47 | 4X Ø .190 thru Ø .332 ↓ .200 |

Figure 48:
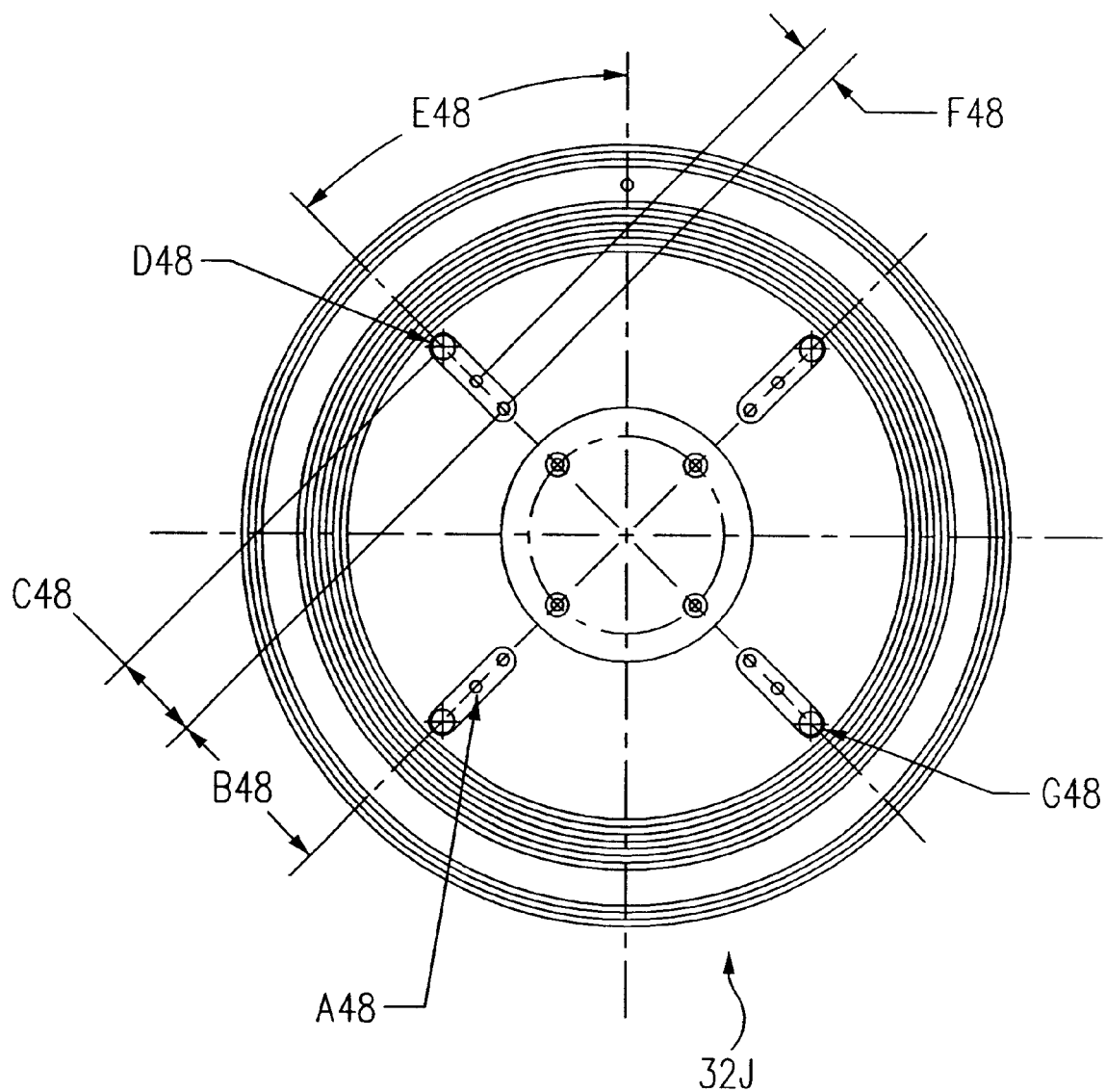
FIG. 48 is a bottom plan view of the cone of FIG. 41.

FIG. 48 is a bottom plan view of cone 32J in accordance with this embodiment of the present invention. Illustrative specifications for the various characteristics shown in FIG. 48 are provided in Table 31 below.

TABLE 31

| CHARACTERISTIC | SPECIFICATION |
|---|---|
| G48 | 4X Ø .2510 ↓ .750 (ream) |
| F48 | 4X .500 In. |
| E48 | 4X 45.0° |
| D48 | 8X R.170 In. |
| C48 | 4X 1.125 In. |
| B48 | 4X 2.300 In. |
| A48 | 8X 6–32 Unc Thrd ↓ .40 In. |

Figure 49A:
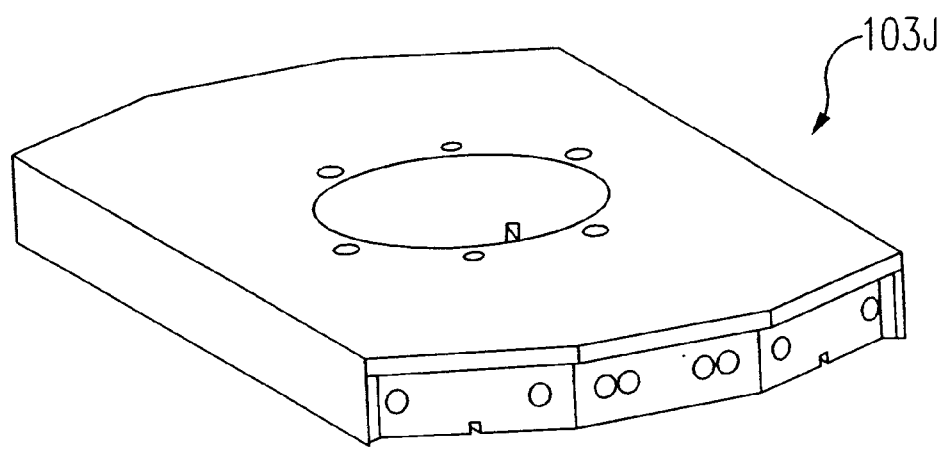
FIGS. 49A, 49B, and 50 are top perspective, bottom perspective and top plan views, respectively, of a top plate in accordance with this embodiment of the present invention.
Figure 49B:
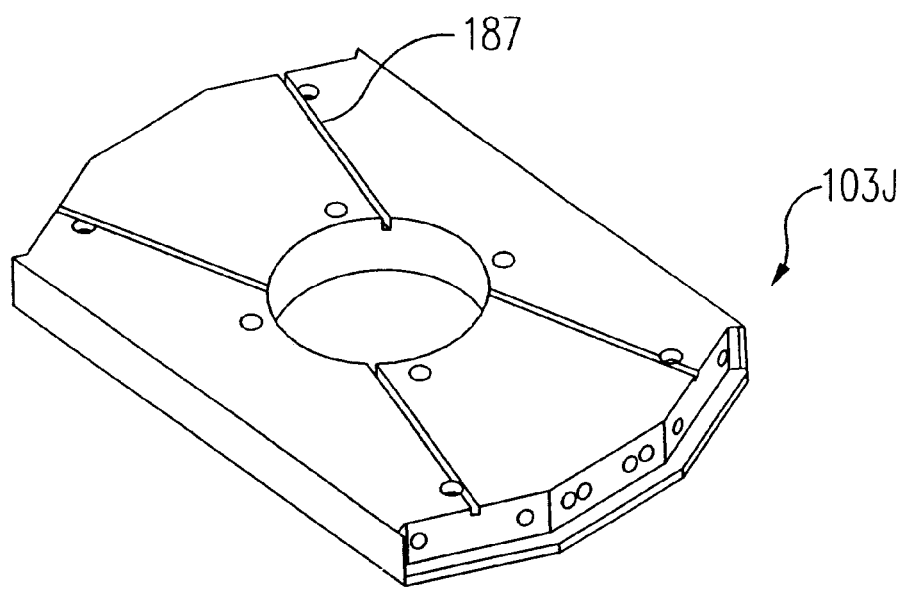
Figure 50:
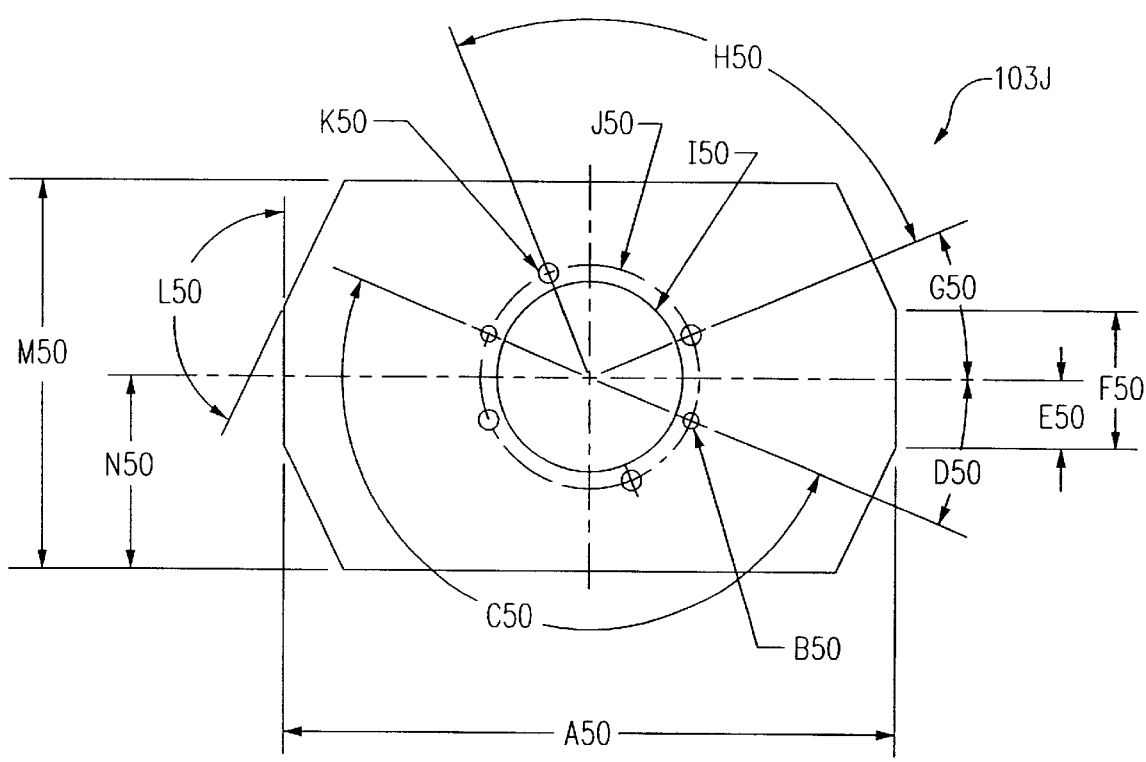

FIGS. 49A, 49B, and 50 are top perspective, bottom perspective and top plan views, respectively, of a top plate 103J in accordance with this embodiment of the present invention. Referring to FIG. 49B, channels 187 are provided for the electrical leads (not shown in FIG. 49B, see lead 108 in FIG. 17 for example). Illustrative specifications for the various characteristics shown in FIG. 50 are provided in Table 32 below.

TABLE 32

| CHARACTERISTIC | SPECIFICATION |
|---|---|
| N50 | 3.320 In. |
| M50 | 6.640 In. |
| L50 | 4X 155.0° |
| K50 | 4X 5/16-18Unc Thrd Thru |
| J50 | Ø 3.875 ± .001 In. |
| I50 | Ø 3.250 In. |
| H50 | 4X 90.0° |
| G50 | 22.5° |
| F50 | 2X 2.360 In. |

TABLE 32-continued

| CHARACTERISTIC | SPECIFICATION |
| --- | --- |
| E50 | 2X 1.180 In. |
| D50 | 22.5° |
| C50 | 180.0° |
| B50 | 2x Ø .2510 (ream) ↓ .75 |
| A50 | 10.640 Ref |

Figure 51:
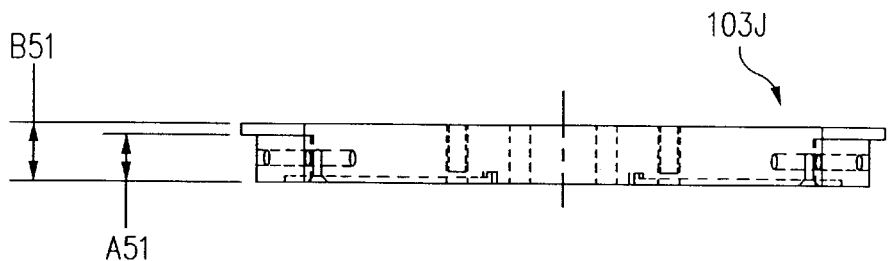
FIG. 51 is a side plan view of the top plate of FIGS. 49A, 49B.

FIG. 51 is a side plan view of top plate 103J in accordance with this embodiment of the present invention. Illustrative specifications for the various characteristics shown in FIG. 51 are provided in Table 33 below.

TABLE 33

| CHARACTERISTIC | SPECIFICATION |
| --- | --- |
| B51 | 1.000 In. |
| A51 | 2X .800 In. |

Figure 52:
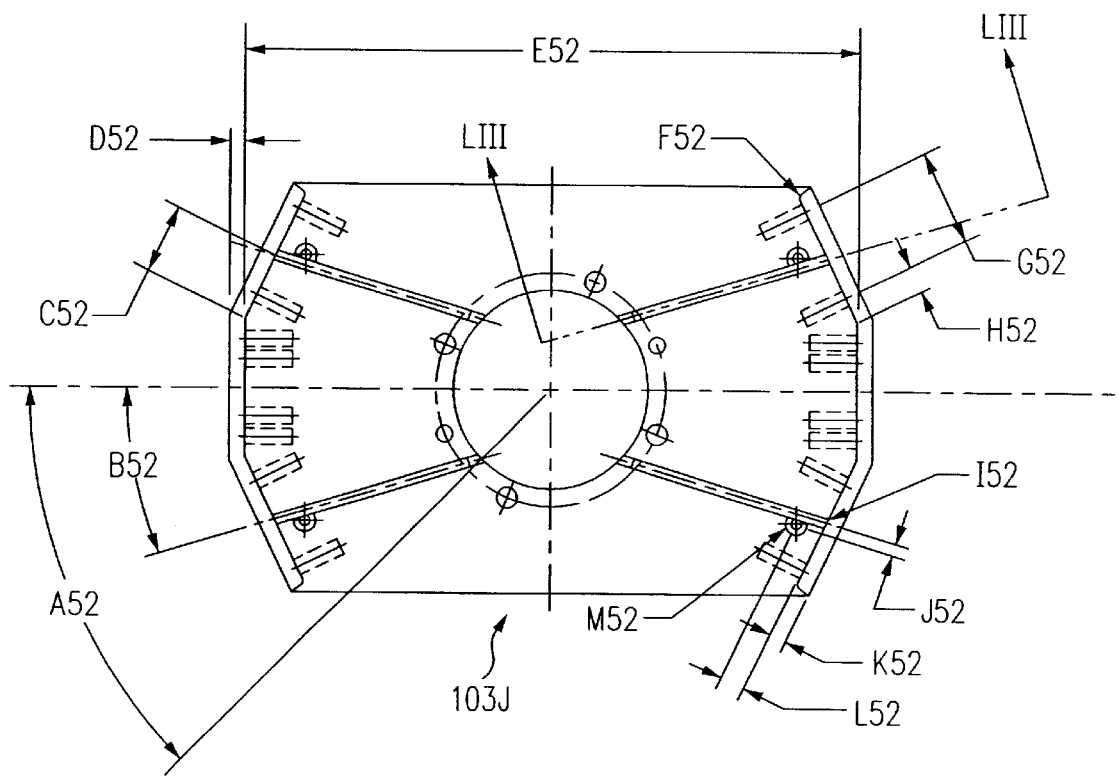
FIG. 52 is a bottom plan view of the top plate of FIGS. 49A, 49B.

FIG. 52 is a bottom plan view of top plate 103J in accordance with this embodiment of the present invention. Illustrative specifications for the various characteristics shown in FIG. 52 are provided in Table 34 below.

TABLE 34

| CHARACTERISTIC | SPECIFICATION |
| --- | --- |
| M52 | 4X 6–32 Thrd ↓ .50 C'Sink for #6 FHCS |
| L52 | 4X .500 In. |
| K52 | 4X .250 In. |
| J52 | 4X .140 In. |
| I52 | 4X .125 wide X .130 Deep Slot |
| H52 | 4X .380 In. |
| G52 | 4X 1.625 In. |
| F52 | 4X R.125 In. |
| E52 | 10.140 ± .002 In. |
| D52 | 2X .250 In. |
| C52 | 4X 1.118 Ref |
| B52 | 4X 16.0° |
| A52 | 4X 45.0° |

Figure 53:
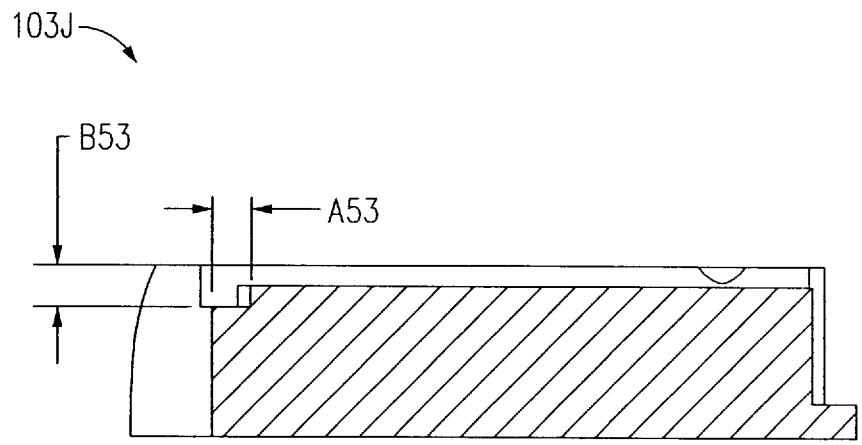
FIG. 53 is a cross-sectional view of the top plate along the line LIII—LIII of FIG. 52.

FIG. 53 is a cross-sectional view of top plate 103J along the line LIII—LIII of FIG. 52 in accordance with this embodiment of the present invention. Illustrative specifications for the various characteristics shown in FIG. 53 are provided in Table 35 below.

TABLE 35

| CHARACTERISTIC | SPECIFICATION |
| --- | --- |
| B53 | 4X .250 In. |
| A53 | 4X .250 In. |

Figure 54:
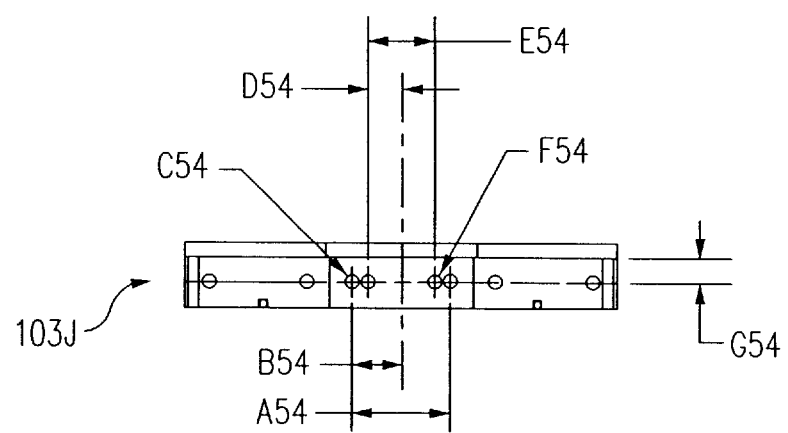
FIG. 54 is a side plan view of the top plate of FIGS. 49A, 49B.

FIG. 54 is a side plan view of top plate 103J in accordance with this embodiment of the present invention. Illustrative specifications for the various characteristics shown in FIG. 54 are provided in Table 36 below.

TABLE 36

| CHARACTERISTIC | SPECIFICATION |
| --- | --- |
| G54 | 16X .400 + .002 − .000 |

TABLE 36-continued

| CHARACTERISTIC | SPECIFICATION |
| --- | --- |
| F54 | 4X Ø .2510 (ream) ↓ .75 In. |
| E54 | 2X .900 ± .001 In. |
| D54 | 2X .450 ± .001 In. |
| C54 | 12 1/4-20unc thrd ↓ .75 In. |
| B54 | 2X .750 In. |
| A54 | 2X 1.500 In. |

Figure 55:
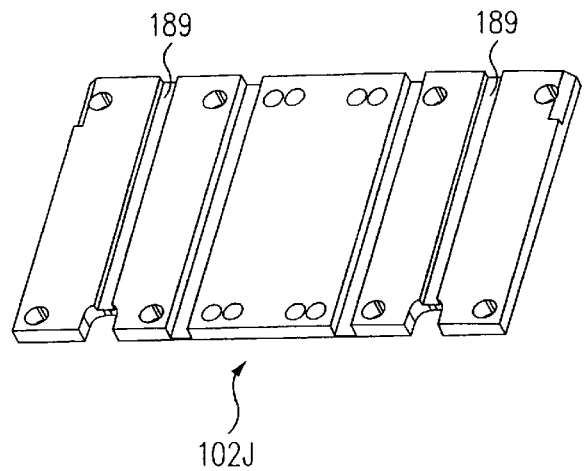
FIGS. 55 and 56 are perspective and top plan views of a strut in accordance with this embodiment of the present invention.
Figure 56:
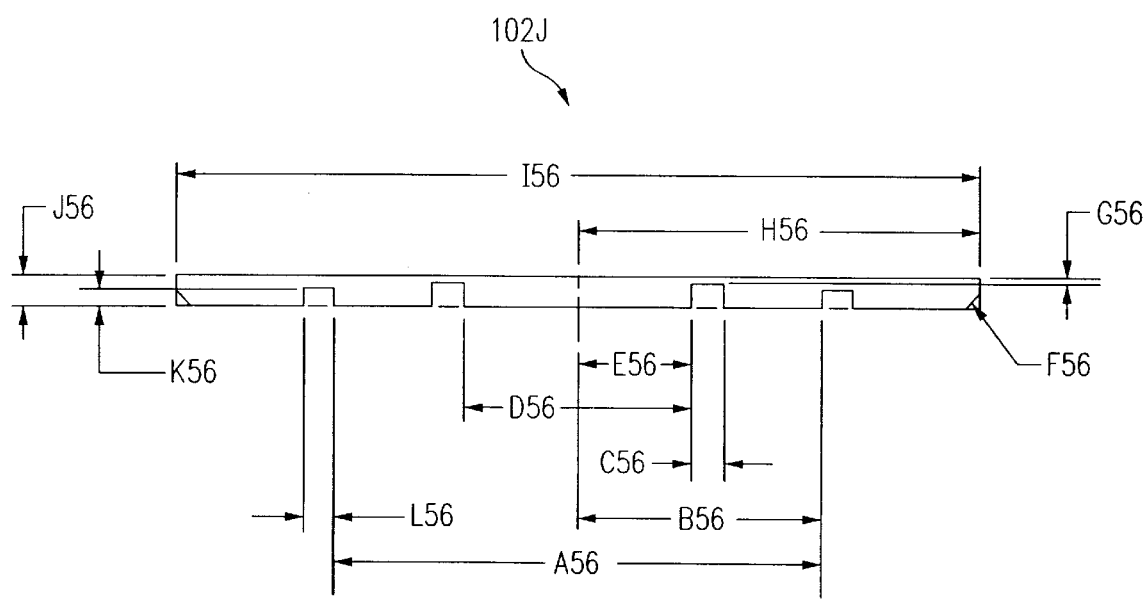

FIGS. 55 and 56 are perspective and top plan views of a strut 102J in accordance with this embodiment of the present invention. Referring to FIG. 55, channels 189 of strut 102J are provided for the electrical leads (not shown in FIG. 55, see lead 108 in FIG. 17 for example). Illustrative specifications for the various characteristics shown in FIG. 56 are provided in Table 37 below.

TABLE 37

| CHARACTERISTIC | SPECIFICATION |
| --- | --- |
| L56 | 2X .250 In. |
| K56 | 2X .130 In. |
| J56 | .250 In. |
| I56 | 6.980 In. |
| H56 | 3.490 In. |
| G56 | 2X .045 + .005 − .000 |
| F56 | 2X 45.0° × .130 In. |
| E56 | 1.020 In. |
| D56 | 2.040 In. |
| C56 | 2X .300 In. |
| B56 | 2.205 In. |
| A56 | 4.410 In. |

Figure 57:
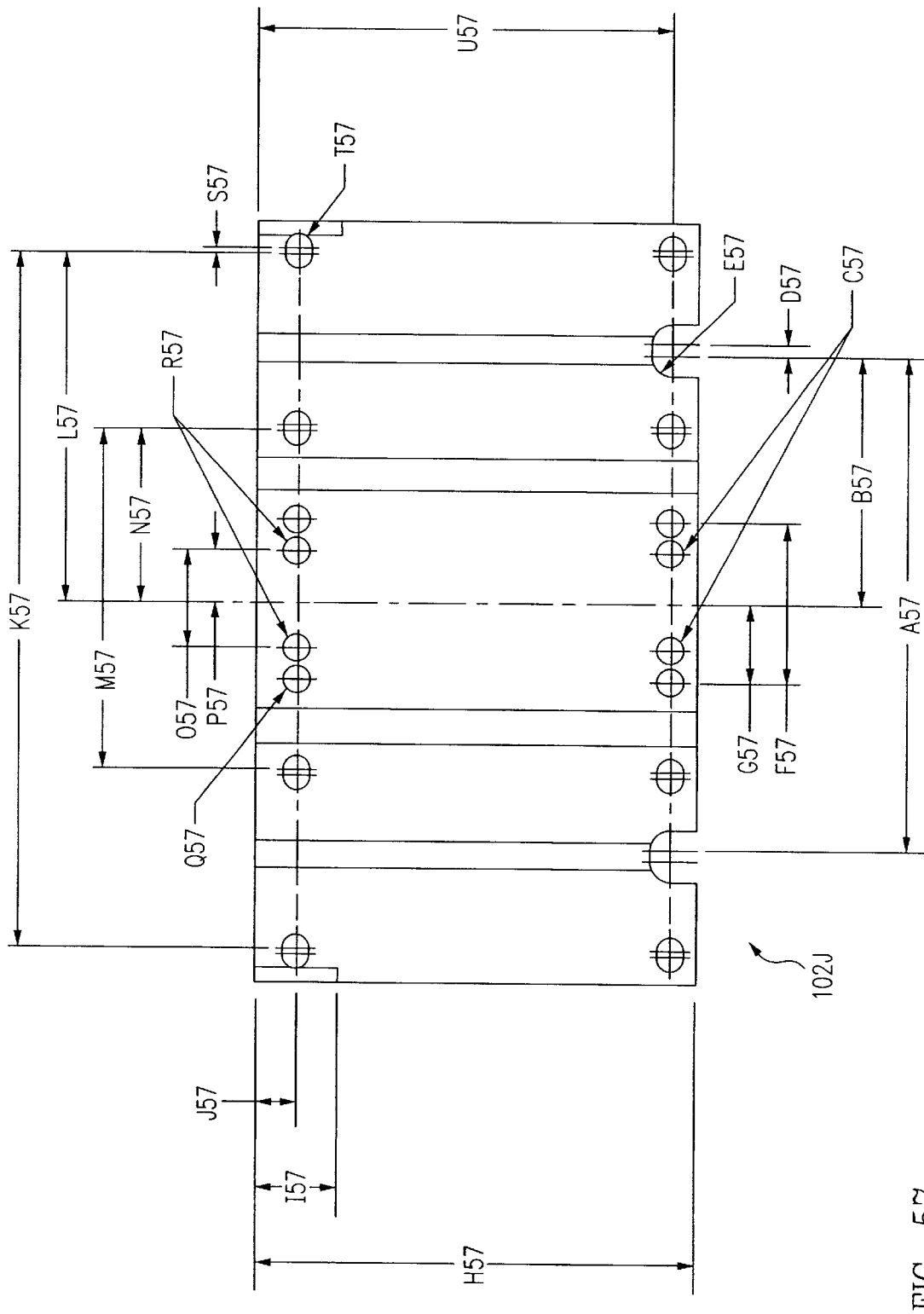
FIG. 57 is a side plan view of the strut of FIG. 55.

FIG. 57 is a side plan view of strut 102J in accordance with this embodiment of the present invention. Illustrative specifications for the various characteristics shown in FIG. 57 are provided in Table 38 below.

TABLE 38

| CHARACTERISTIC | SPECIFICATION |
| --- | --- |
| T57 | 16X R.130 In. |
| S57 | 8X .050 In. |
| R57 | Ø .2500 (ream) |
| Q57 | 4X Ø .258 In. |
| P57 | 2X .450 In. |
| O57 | 2X .900 In. |
| N57 | 2X 1.565 In. |
| M57 | 2X 3.130 In. |
| L57 | 2X 3.190 In. |
| K57 | 2X 6.380 In. |
| J57 | 8X .400 In. |
| I57 | 2X .810 In. |
| H57 | 4.200 In. |
| G57 | 2X .570 In. |
| F57 | 2X 1.500 In. |
| E57 | 4X R.187 In. |
| D57 | 2X .100 In. |
| C57 | Ø .2500 (ream) |
| B57 | 2.280 In. |
| A57 | 4.560 In. |

Figure 58:
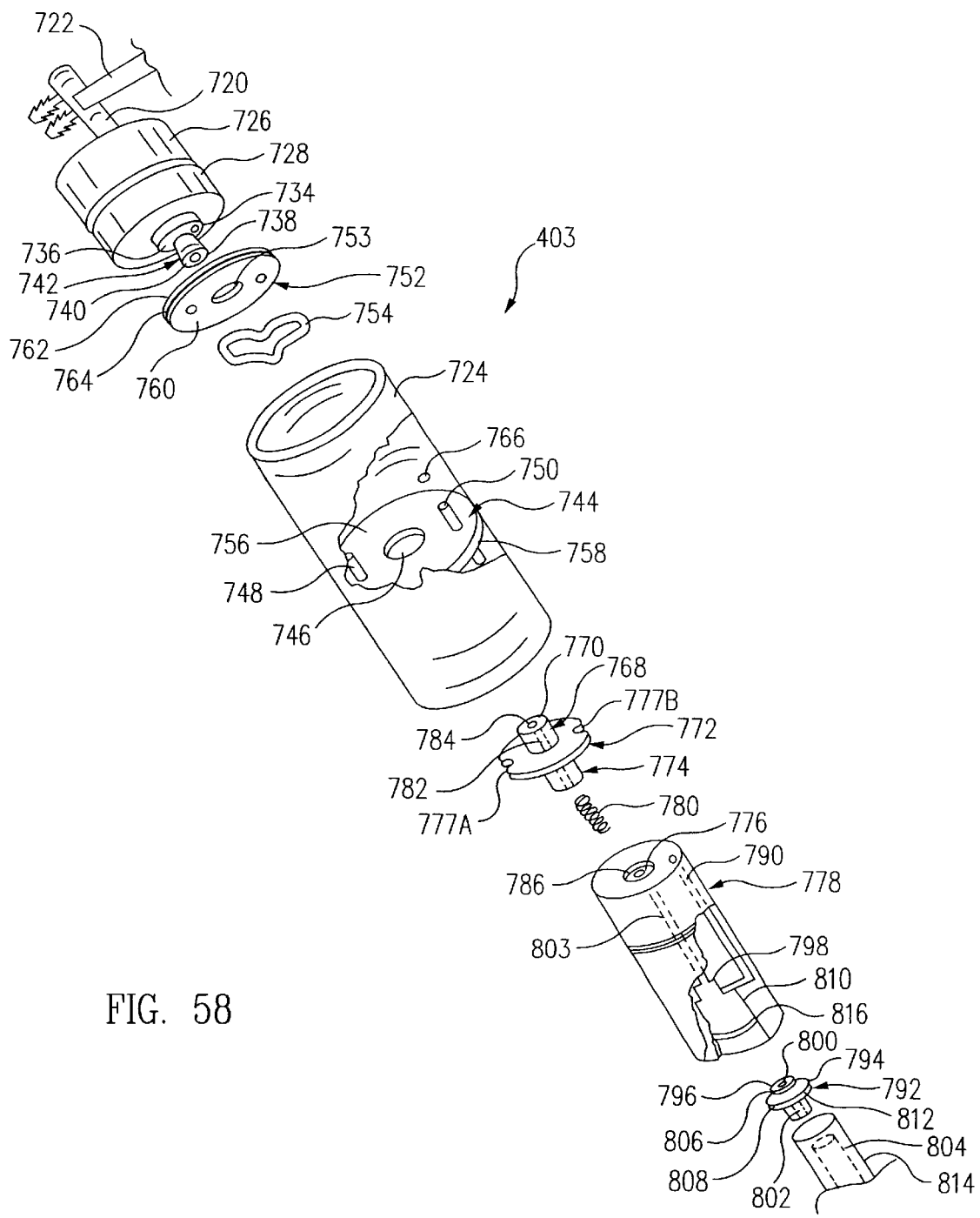
FIGS. 58 and 59 are an exploded perspective view, partially cutaway, and a cross-sectional view of the rotary union of FIG. 22.
Figure 59:
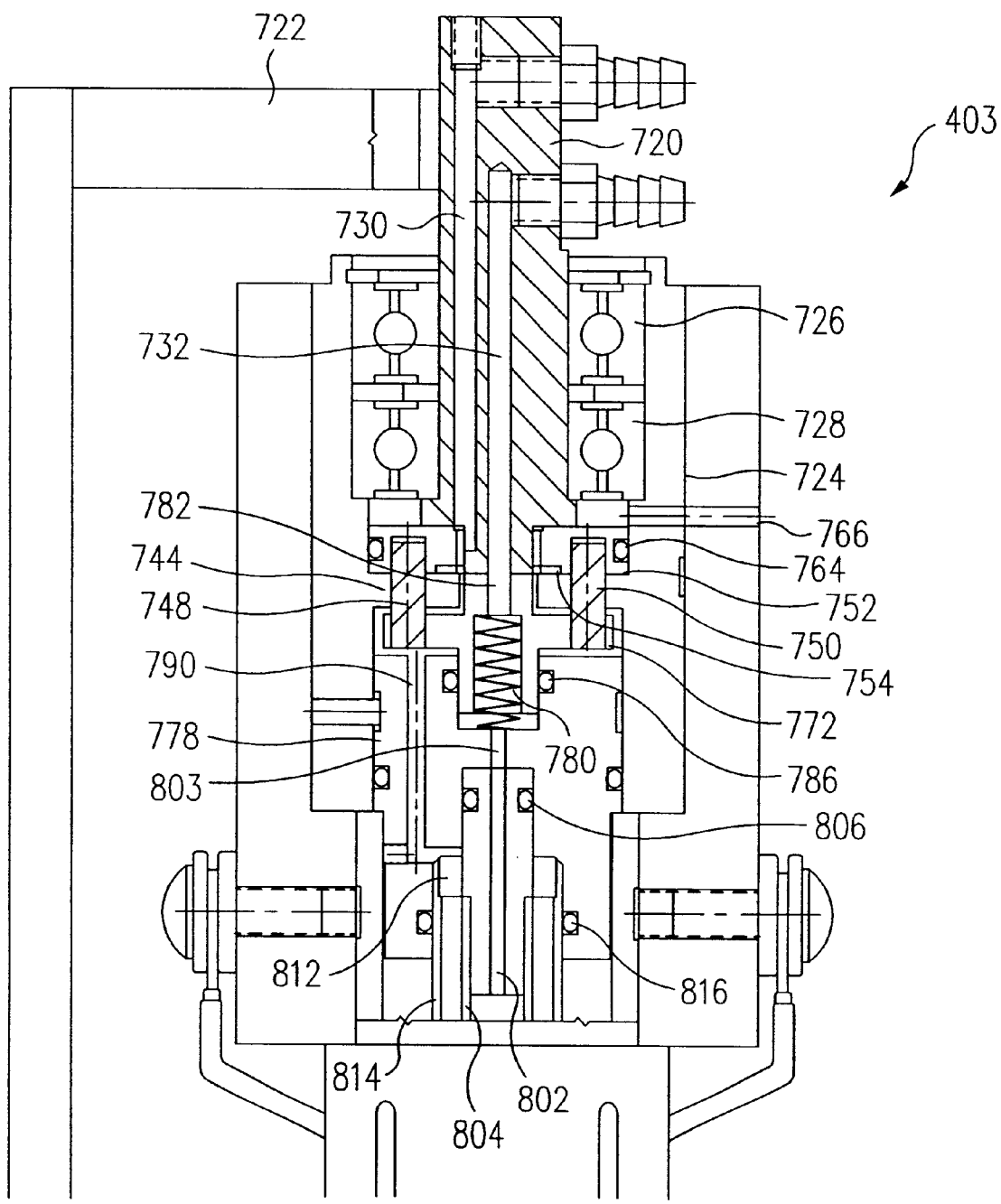

FIGS. 58 and 59 are an exploded perspective view, partially cutaway, and a cross-sectional view of rotary union 403 of FIG. 22. Referring to FIGS. 58 and 59, rotary union 403 includes a shaft 720 attached to a bracket 722. Shaft 720 is mounted inside of outer housing 724 by bearings 726, 728. During use, bearings 726, 728 allow shaft 720 to be held stationary by bracket 722 while allowing outer housing 724 and the remainder of rotary union 403 to rotate.

As best seen in FIG. 59, extending through the axial center of shaft 720 is a pressure/vacuum passage 732 and offset radially from the axial center of shaft 720 is a pressure passage 730. Referring to FIG. 58, pressure passage 730 terminates at an aperture 734 of a surface area 736 of shaft 720, surface area 736 being perpendicular to the longitudinal axis of shaft 720. Pressure/vacuum passage 732 terminates at an aperture 738 located in the center of an extended surface area 740 of shaft 720, extended surface area 740 also being perpendicular to the longitudinal axis of shaft 720. Extended surface area 740 defines an extension 742 of shaft 720.

Outer housing 724 includes an integral disk 744. (A portion of outer housing 724 has been cutaway for clarity.) Disk 744 has a disk central aperture 746. Located between disk 744 and surface area 736 is an outer face seal 752 and a wave compression spring 754. Outer face seal 752 has a seal central aperture 753 through which extension 742 of shaft 720 passes. Wave compression spring 754 is in pressing contact with an upper surface 756 of disk 744 and a lower surface 760 of outer face seal 752 and, further, an upper surface 762 of outer face seal 752 is in pressing contact with surface area 736. Extending through disk 744 are anti-rotation pins 748, 750. During use, wave compression spring 754 presses outer face seal 752 against surface area 736 forming a seal between upper surface 762 of outer face seal 752 and surface area 736. Pressurized gas through pressure passage 730 exits aperture 734 and passes through seal central aperture 753 and through disk central aperture 746. To prevent the pressurized gas from passing back around between outer face seal 752 and outer housing 724, the periphery of outer face seal 752 is fitted with an O-ring 764. However, to the extent that any pressurized gas leaks past O-ring 764, the pressurized gas escapes through a seal vent 766 (a channel) of outer housing 724, seal vent 766 being located between outer housing 724 and bearings 726, 728. This prevents pressurized gas from passing through bearings 726, 728.

Extending through disk 744 are anti-rotation pins 748, 750. Outer face seal 752 has corresponding apertures (which extend only partially, not through, outer face seal 752) into which anti-rotation pins 748, 750 extend. During use, anti-rotation pins 748, 750 prevent outer face seal 752 from rotating relative to outer housing 724.

Extending through disk central aperture 746 is an upper extended portion 768 including a raised surface area 770 of an inner face seal 772. A pressure/vacuum passage 782 extends longitudinally through inner face seal 772 from an aperture 784 of raised surface area 770. A lower extended portion 774 of inner face seal 772 extends into an upper aperture 776 of lower connector 778. Located between inner face seal 772 and lower connector 778 is a compression spring 780. Compression spring 780 presses inner face seal 772 against shaft 720 forming a seal between raised surface area 770 of inner face seal 772 and extended surface area 740 of shaft 720.

During use, vacuum through pressure/vacuum passage 732 exits aperture 738 and enters aperture 784 and thereby enters and passes through pressure/vacuum passage 782 of inner face seal 772. (It is understood that pressurized gas may be substituted for the vacuum.) To prevent the vacuum from passing back around between inner face seal 772 and lower connector 778, upper aperture 776 of lower connector 778 is fitted with an O-ring 786. Inner face seal 772 has two notches, 777A, 777B through which anti-rotation pins 748, 750 pass to prevent inner face seal 772 from rotating relative to outer housing 724.

While the vacuum passes through pressure/vacuum passage 782 of inner face seal 772, the pressurized gas (which exits aperture 734 of shaft 720) passes around the outside of inner face seal 772 and into a pressure passage 790 of lower connector 778 which is offset radially from the axial center of lower connector 778.

A coaxial tube connector 792 has an extended portion 794 including a raised surface area 796 which fits into an inner upper aperture 798 of lower connector 778. (A portion of lower connector 778 has been cutaway for clarity.) Extending from an aperture 800 of raised surface area 796 is a pressure/vacuum passage 802. The vacuum passes into aperture 800 and pressure/vacuum passage 802 from pressure/vacuum passage 803 and thus passes through the axial center of tube connector 792 to an inner coaxial tube 804. An O-ring 806 is fitted on extended portion 794 to form a seal between tube connector 792 and lower connector 778 preventing the escape of vacuum.

A disk middle portion 808 of tube connector 792 which fits into a inner lower aperture 810 of lower connector 778. A pressure passage 812 passes through disk middle portion 808 and is radially offset from the axial center of tube connector 792. Pressurized gas from pressure passage 790 of lower connector 778 passes through pressure passage 812 and into the space between inner coaxial tube 804 and an outer coaxial tube 814. An O-ring 816 is provided between outer coaxial tube 814 and the inner lower aperture 810 to prevent the escape of pressurized gas.

Of importance, rotary union 403 allows both vacuum and pressure to be provided to the clamshell during rotation through coaxial tubing and more particularly through inner coaxial 804 and outer coaxial tube 814, respectively. This allows the space required for the tubing to be reduced to that of outer coaxial tube 814 compared to having both tubes in a side by side arrangement. This is particularly advantageous for use in a clamshell apparatus in accordance with the present invention wherein size constraints of the pressure and vacuum lines, as well as concentric geometry, requires coaxial tubing of the pressure and vacuum lines.

Although in the above description of rotary union 403, pressurized gas and vacuum are described, it is understood that any combination of vacuum, pressurized gas or liquid can be provided through rotary union 403, for example, pressurized gas can be provided inside of inner coaxial tube 804 and outer coaxial tube 814 at the same time.

Figure 60:
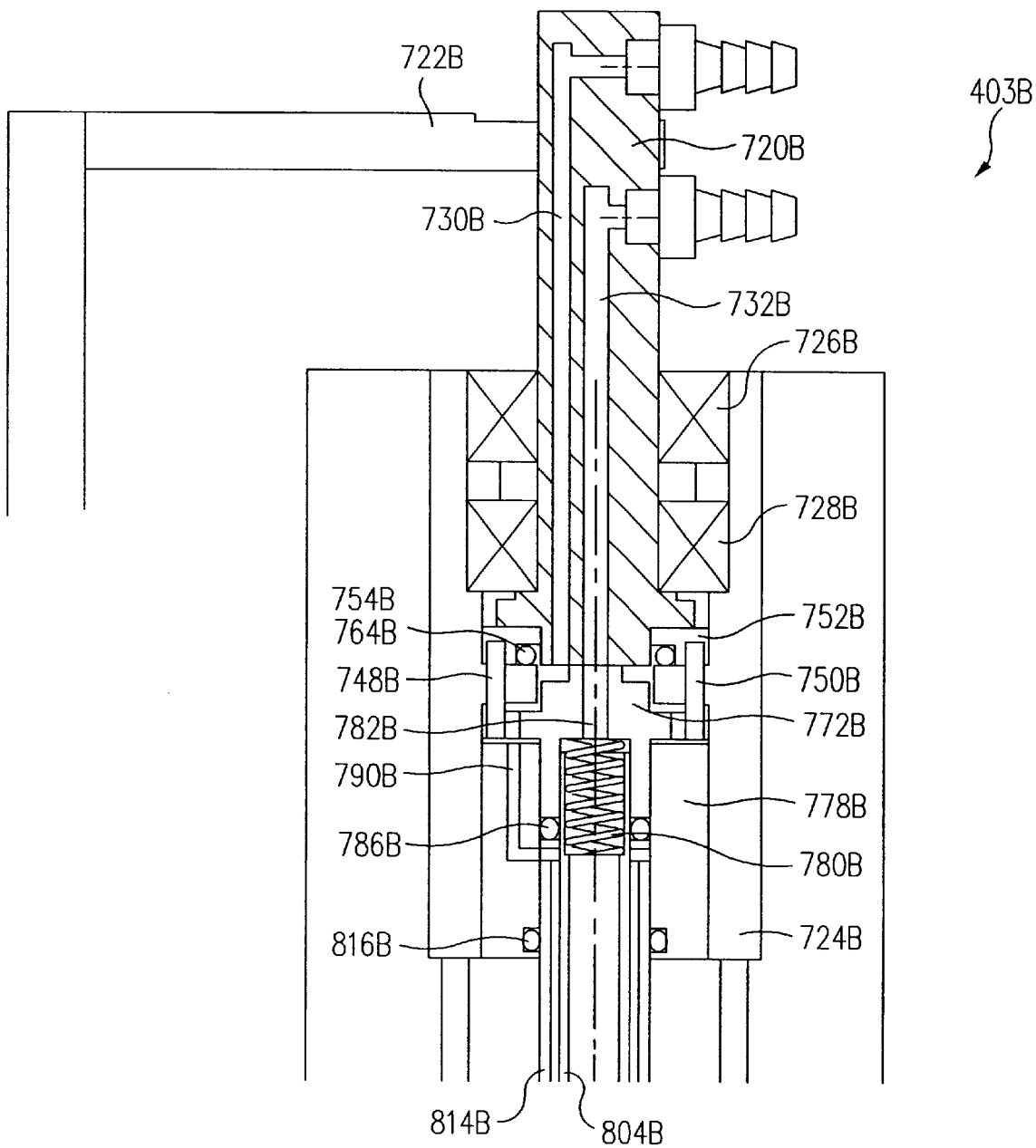
FIGS. 60, 61 and 62 are cross-sectional views of rotary unions in accordance with alternative embodiments of the present invention.
Figure 61:
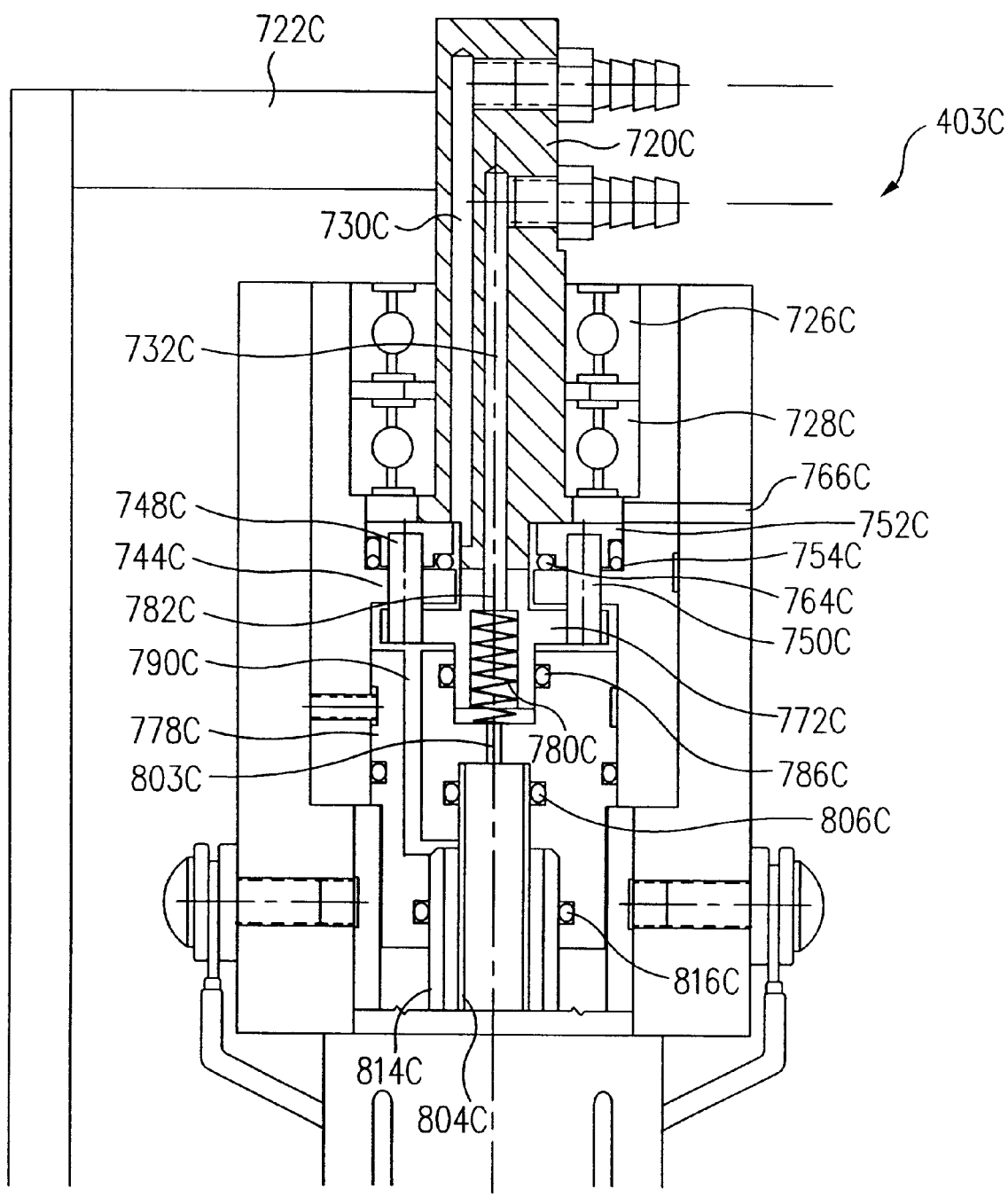
Figure 62:
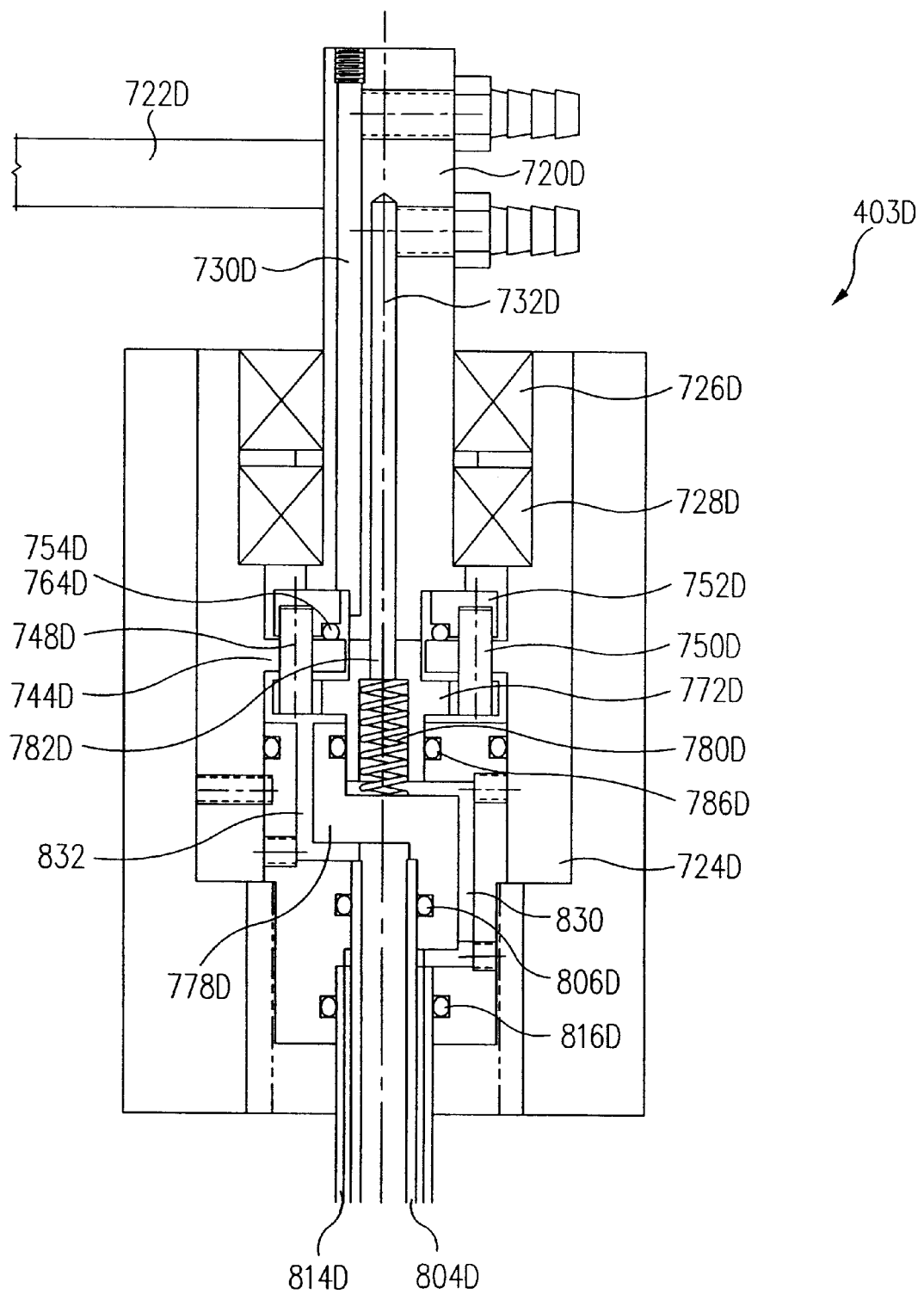

FIGS. 60, 61 and 62 are cross-sectional views of rotary unions 403B, 403C and 403D in accordance with alternative embodiments of the present invention. Rotary unions 403B, 403C and 403D allow pressure and vacuum to be provided coaxially to a clamshell as discussed above in relation to rotary union 403 of FIGS. 58 and 59. Accordingly, similar elements as those illustrated in FIGS. 58 and 59 are identified by similar reference numbers in FIGS. 60, 61 and 62.

Referring to FIG. 60, in this embodiment, compression spring 780B fits inside a bored-out portion of inner coaxial tube 804B and vacuum which passes through pressure/vacuum passage 782B of inner face seal 772B enters inner coaxial tube 804B directly. Vacuum is prevented from escaping by an O-ring 786B. Further, in this embodiment,, tube connector 792 of FIGS. 58, 59 is not provided and pressurized gas is provided to the region between inner coaxial tube 804B and outer coaxial tube 814B directly through a pressure passage 790B of lower connector 778B.

Referring to FIG. 61, this embodiment is substantially similar to the FIGS. 58, 59 embodiment, with one significant notable difference being that tube connector 792 of FIGS. 58, 59 is not provided. Thus, vacuum through pressure/vacuum passage 803C of lower connector 778C passes directly into inner coaxial tube 804C. Further, pressure from pressure passage 790C of lower connector 778C is provided directly to the space between inner coaxial tube 804C and outer coaxial tube 814C.

Referring now to FIG. 62, this embodiment is substantially similar to the FIG. 61 embodiment except that pressure is routed to inner coaxial tube 804D through a pressure passage 832 of lower connector 778D and vacuum is routed to the space between inner coaxial tube 804D and outer coaxial tube 814D through a pressure/vacuum passage 830 of lower connector 778D.

Figure 63:
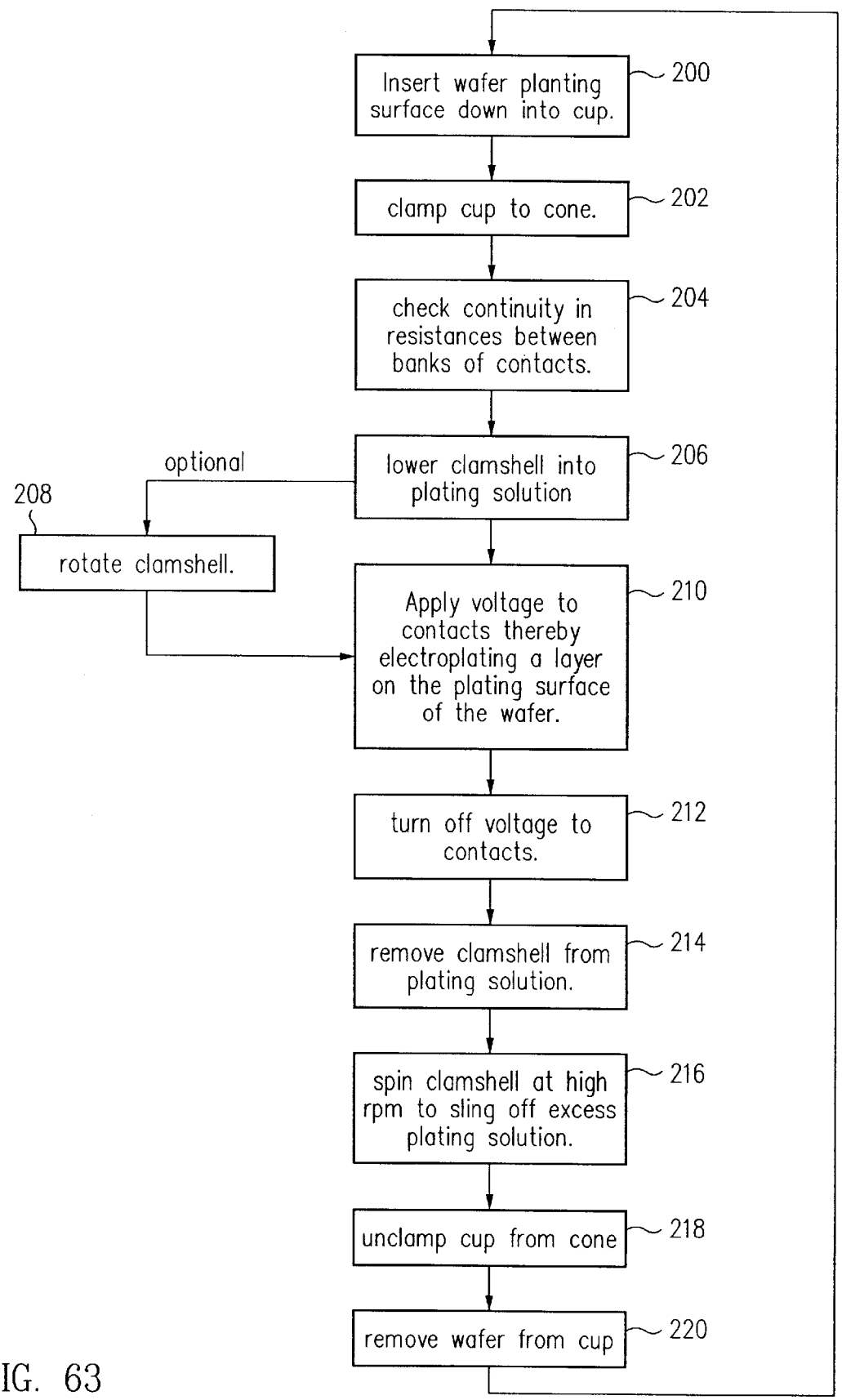
FIG. 63 is a flowchart of a process of electroplating a layer on a plating surface of a wafer in accordance with the present invention.

FIG. 63 is a flowchart of a process of electroplating a layer on a plating surface of a wafer in accordance with the present invention. Referring to both FIG. 63 and FIG. 3, at step 200, a wafer 36 is inserted into cup 34, plating surface 60 down. At step 202, cup 34 is clamped to cone 32 thereby establishing electrical connection between contacts 72 and plating surface 60 of wafer 36 and at the same time forming the seal between compliant seal 58 and plating surface 60. At step 204, continuity in resistances between contacts 72 (or banks of contacts, see banks 84, 86, 88, and 90 in FIG. 10 for example) is checked to establish that on acceptable electrical connection has been made between contacts 72 and wafer plating surface 60.

At step 206, clamshell 33 including wafer 36 is lowered into the plating solution and optionally, at step 208, clamshell 33 is rotated. At step 210, voltage is applied to contacts 72 thereby causing a layer, e.g. copper, to be electroplated on plating surface 60 of wafer 36. At step 212, the voltage to contacts 72 is turned off thereby preventing further electroplating and, at step 214, clamshell 33 is removed from the plating solution.

At step 216, clamshell 33 is spun at high rpm to sling off excess plating solution from clamshell 33 and wafer 36. At step 218, cup 34 is unclamped from cone 32 and, at step 220, wafer 36 is removed from cup 34. At this point, returning to step 200, another wafer 36 to be treated is loaded into cup 34 and the process is repeated.

Having thus described the preferred embodiments, persons skilled in the art will recognize that changes may be made in form and detail without departing from the spirit and scope of the invention. For example, referring to FIG. 3, cup 34 can be clamped to cone 32 using mechanical means instead of by using a vacuum. In addition, although the substrate is described and illustrated as a circular wafer having an electrically conductive seed layer on the plating surface, any substrate having an electrically conductive layer on a substantially planar surface or any electrically conductive substrate having a substantially planar surface can be treated. For example, a wafer with a flat can be treated. Further, instead of electroplating a layer on a substrate, the system can be used to electrochemically etch or polish a layer on a substrate. Thus the invention is limited only by the following claims.

We claim:

1. A rotary union comprising:
   a shaft having a first surface area and an extended surface area, said first surface having a first aperture therein, said extended surface area having a second aperture therein;
   an outer face seal, said outer face seal forming a seal with said first surface area; and
   an inner face seal, said inner face seal forming a seal with said extended surface area, wherein a first passage coupled to said first aperture passes through said outer face seal and around the outside of said inner face seal and wherein a second passage coupled to said second aperture passes through said inner face seal.

2. The rotary union of claim 1 further comprising:
   a first spring for pressing said outer face seal against said first surface area; and
   a second spring for pressing said inner face seal against said extended surface area.

3. The rotary union of claim 2 wherein said first spring is a wave compression spring.

4. The rotary union of claim 3 further comprising an outer housing, said wave compression spring being located between a disk of said outer housing and said outer face seal.

5. The rotary union of claim 4 further comprising:
   at least one anti-rotation pin passing through said disk of said outer housing and into said outer face seal.

6. The rotary union of claim 5 wherein said at least one anti-rotation pin passes into said inner face seal.

7. The rotary union of claim 6 wherein said at least one anti-rotation pin prevents said inner face seal and said outer face seal from rotating relative to said outer housing.

8. The rotary union of claim 1 further comprising a tube coupler, said second passage passing through the axial center of said tube coupler, said first passage passing through said tube connector and being radially offset from the axial center of said tube coupler.

9. The rotary union of claim 8 wherein said second passage is coupled to an inner tube and wherein said first passage is coupled to the space between said inner tube and an outer tube, said inner tube and said outer tube being coaxial.

10. The rotary union of claim 1 further comprising:
    at least one bearing: and
    an outer housing, said at least one bearing allowing rotation of said shaft relative to said outer housing.

11. The rotary union of claim 10 further comprising a seal vent extending through said outer housing, said seal vent being located between said at least one bearing and said outer face seal.

12. The rotary union of claim 1 wherein said first passage is a pressure passage and wherein said second passage is a pressure/vacuum passage.

* * * * *